US011187944B2

(12) United States Patent
Miyake et al.

(10) Patent No.: US 11,187,944 B2
(45) Date of Patent: Nov. 30, 2021

(54) DISPLAY DEVICE

(71) Applicant: Semiconductor Energy Laboratory Co., Ltd., Atsugi (JP)

(72) Inventors: Hiroyuki Miyake, Toyota (JP); Makoto Kaneyasu, Fukuoka (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/061,876

(22) Filed: Oct. 2, 2020

(65) Prior Publication Data

US 2021/0026174 A1    Jan. 28, 2021

Related U.S. Application Data

(63) Continuation of application No. 16/698,426, filed on Nov. 27, 2019, now Pat. No. 10,824,028, which is a (Continued)

(30) Foreign Application Priority Data

Feb. 12, 2015    (JP) .................................. 2015-024963

(51) Int. Cl.
*H01L 29/10*    (2006.01)
*H01L 29/12*    (2006.01)
(Continued)

(52) U.S. Cl.
CPC ...... *G02F 1/1343* (2013.01); *G02F 1/136286* (2013.01); *G09F 9/30* (2013.01);
(Continued)

(58) Field of Classification Search
CPC ............. G02F 1/1343; G02F 1/136286; G02F 1/133602; G09G 2300/0439
See application file for complete search history.

(56) References Cited

U.S. PATENT DOCUMENTS 4,409,134 A    10/1983  Yamazaki
5,002,367 A     3/1991  Nicholas
(Continued)

FOREIGN PATENT DOCUMENTS

CN    002806376 Y    3/2004
CN    101030588 A    9/2007
(Continued)

OTHER PUBLICATIONS

International Search Report (Application No. PCT/IB2016/050534) dated Apr. 26, 2016.
(Continued)

*Primary Examiner* — Calvin Y Choi
(74) *Attorney, Agent, or Firm* — Robinson Intellectual Property Law Office; Eric J. Robinson

(57) ABSTRACT

A display device in which parasitic capacitance between wirings can be reduced is provided. Furthermore, a display device in which display quality is improved is provided. Furthermore, a display device in which power consumption can be reduced is provided.
The display device includes a signal line, a scan line, a first electrode, a second electrode, a third electrode, a first pixel electrode, a second pixel electrode, and a semiconductor film. The signal line intersects with the scan line, the first electrode is electrically connected to the signal line, the first electrode has a region overlapping with the scan line, the second electrode faces the first electrode, the third electrode faces the first electrode, the first pixel electrode is electrically connected to the second electrode, the second pixel electrode is electrically connected to the third electrode, the semiconductor film is in contact with the first electrode, the second electrode, and the third electrode, and the semiconductor film is provided between the scan line and the first electrode to the third electrode.

4 Claims, 28 Drawing Sheets

Related U.S. Application Data continuation of application No. 15/545,411, filed as application No. PCT/IB2016/050534 on Feb. 3, 2016, now Pat. No. 10,539,839.

(51) Int. Cl.

| | | |
|---|---|---|
| *G02F 1/1343* | (2006.01) | |
| *G02F 1/1362* | (2006.01) | |
| *G09F 9/30* | (2006.01) | |
| *G09G 3/36* | (2006.01) | |
| *H01L 27/12* | (2006.01) | |
| *H01L 29/786* | (2006.01) | |
| *G02F 1/136* | (2006.01) | |
| *G02F 1/13357* | (2006.01) | |

(52) U.S. Cl.
CPC ....... *G09G 3/3648* (2013.01); *H01L 27/1225* (2013.01); *H01L 29/7869* (2013.01); *H01L 29/78648* (2013.01); *H01L 29/78696* (2013.01); *G02F 1/13606* (2021.01); *G02F 1/133602* (2013.01); *G09G 2300/0439* (2013.01)

(56) References Cited

U.S. PATENT DOCUMENTS

| | | |
|---|---|---|
| 6,507,383 B1 | 1/2003 | Abe et al. |
| 6,714,266 B1 | 3/2004 | Ueda et al. |
| 6,750,087 B2 | 6/2004 | Morita et al. |
| 6,900,853 B2 | 5/2005 | Watanabe et al. |
| 7,173,676 B2 | 2/2007 | Jeon et al. |
| 7,417,694 B2 | 8/2008 | Kim et al. |
| 7,542,102 B2 | 6/2009 | Lu |
| 7,615,782 B2 | 11/2009 | Hoshino |
| 7,786,482 B2 | 8/2010 | Yamazaki et al. |
| 7,825,412 B2 | 11/2010 | Watanabe et al. |
| 7,872,699 B2 | 1/2011 | Kim et al. |
| 7,903,218 B2 | 3/2011 | Ohara et al. |
| 8,031,283 B2 | 10/2011 | Araki et al. |
| 8,059,077 B2 | 11/2011 | Uehara |
| 8,168,980 B2 | 5/2012 | Tsubata et al. |
| 8,274,619 B2 | 9/2012 | Ohara et al. |
| 8,304,769 B2 | 11/2012 | Tsubata et al. |
| 8,319,906 B2 | 11/2012 | Enda et al. |
| 8,344,380 B2 | 1/2013 | Godo et al. |
| 8,363,175 B2 | 1/2013 | Itsumi et al. |
| 8,742,423 B2 | 6/2014 | Matsubara et al. |
| 8,791,969 B2 | 7/2014 | Kim et al. |
| 9,196,633 B2 | 11/2015 | Yamazaki et al. |
| 9,425,220 B2 | 8/2016 | Miyake et al. |
| 9,507,230 B2 | 11/2016 | Song et al. |
| 9,568,794 B2 | 2/2017 | Hirose |
| 9,645,463 B2 | 5/2017 | Hirose |
| 10,559,598 B2 | 2/2020 | Yamazaki et al. |
| 2004/0001167 A1 | 1/2004 | Takeuchi et al. |
| 2005/0122441 A1 | 6/2005 | Shimoshikiryoh |
| 2006/0243979 A1 | 11/2006 | Park et al. |
| 2006/0255403 A1 | 11/2006 | Asano et al. |
| 2006/0263576 A1 | 11/2006 | Hirose |
| 2007/0085778 A1 | 4/2007 | Yoshida |
| 2007/0132902 A1 | 6/2007 | Yao |
| 2007/0170431 A1 | 7/2007 | Choi et al. |
| 2008/0252802 A1 | 10/2008 | Wang et al. |
| 2008/0284931 A1 | 11/2008 | Kimura |
| 2008/0297676 A1 | 12/2008 | Kimura |
| 2009/0002586 A1 | 1/2009 | Kimura |
| 2009/0027578 A1 | 1/2009 | You et al. |
| 2009/0159885 A1 | 6/2009 | Yamazaki et al. |
| 2009/0262274 A1 | 10/2009 | Noda et al. |
| 2009/0295696 A1 | 12/2009 | Uehara |
| 2010/0141849 A1 | 6/2010 | Enda et al. |
| 2010/0148178 A1 | 6/2010 | Godo et al. |
| 2011/0147754 A1 | 6/2011 | Isa et al. |
| 2012/0033149 A1 | 2/2012 | Song et al. |
| 2012/0140159 A1 | 6/2012 | Liou et al. |
| 2012/0154346 A1 | 6/2012 | Hirose |
| 2012/0281172 A1 | 11/2012 | Park et al. |
| 2012/0300150 A1 | 11/2012 | Yamazaki et al. |
| 2014/0061636 A1 | 3/2014 | Miyake et al. |
| 2015/0153599 A1 | 6/2015 | Yamazaki et al. |
| 2017/0235201 A1 | 8/2017 | Hirose |
| 2020/0091202 A1 | 3/2020 | Yamazaki et al. |

FOREIGN PATENT DOCUMENTS

| | | |
|---|---|---|
| CN | 101101913 A | 1/2008 |
| CN | 201069506 Y | 6/2008 |
| CN | 101281311 A | 10/2008 |
| CN | 101384949 A | 3/2009 |
| CN | 101401030 A | 4/2009 |
| CN | 201876642 U | 6/2011 |
| CN | 102156367 A | 8/2011 |
| CN | 102867823 A | 1/2013 |
| CN | 103400838 A | 11/2013 |
| DE | 102013216824 | 3/2014 |
| EP | 0317011 A | 5/1989 |
| EP | 1998220 A | 12/2008 |
| EP | 2037319 A | 3/2009 |
| EP | 2120089 A | 11/2009 |
| EP | 2159632 A | 3/2010 |
| JP | 01-166020 A | 6/1989 |
| JP | 05-341322 A | 12/1993 |
| JP | 2001-042361 A | 2/2001 |
| JP | 2003-297850 A | 10/2003 |
| JP | 2005-222067 A | 8/2005 |
| JP | 2006-317867 A | 11/2006 |
| JP | 2007-164172 A | 6/2007 |
| JP | 2008-089646 A | 4/2008 |
| JP | 2008-159643 A | 7/2008 |
| JP | 2008-175882 A | 7/2008 |
| JP | 2009-180981 A | 8/2009 |
| JP | 2009-265348 A | 11/2009 |
| JP | 2010-003723 A | 1/2010 |
| JP | 2010-161358 A | 7/2010 |
| JP | 2012-037890 A | 2/2012 |
| JP | 2012-123351 A | 6/2012 |
| JP | 2012-145927 A | 8/2012 |
| JP | 2012-145927 A | 8/2012 |
| JP | 2014-029543 A | 2/2014 |
| JP | 2014-199403 A | 10/2014 |
| JP | 2014-199403 A | 10/2014 |
| KR | 2012-0013552 A | 2/2012 |
| KR | 2012-0069566 A | 6/2012 |
| KR | 2014-0029248 A | 3/2014 |
| TW | 200723538 | 6/2007 |
| TW | 200821639 | 5/2008 |
| TW | 201030985 | 8/2010 |
| TW | 201232138 | 8/2012 |
| WO | WO-2007/097074 | 8/2007 |
| WO | WO 2007/097074 A | 8/2007 |
| WO | WO-2008/096483 | 8/2008 |
| WO | WO-2009/001578 | 12/2008 |
| WO | WO-2010/032619 | 3/2010 |
| WO | WO-2010/107027 | 9/2010 |

OTHER PUBLICATIONS

Written Opinion (Application No. PCT/IB2016/050534) dated Apr. 26, 2016.

Chinese Office Action (Application No. 201680009371.3) dated Mar. 30, 2020.

Chinese Office Action (Application No. 201680009371.3) dated Dec. 22, 2020.

Chinese Office Action (Application No. 201680009371.3) dated May 6, 2021.

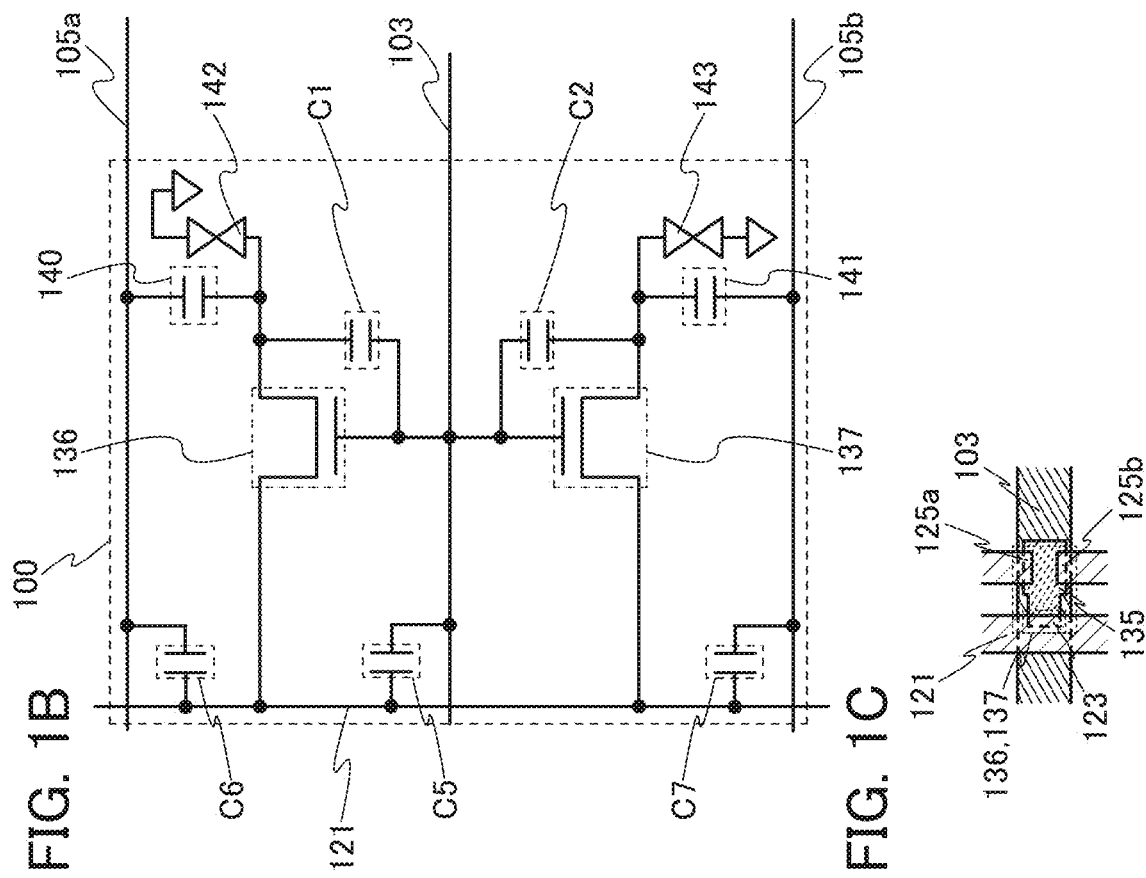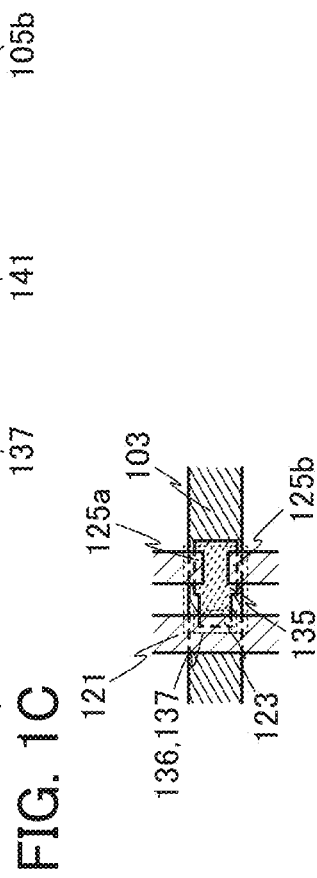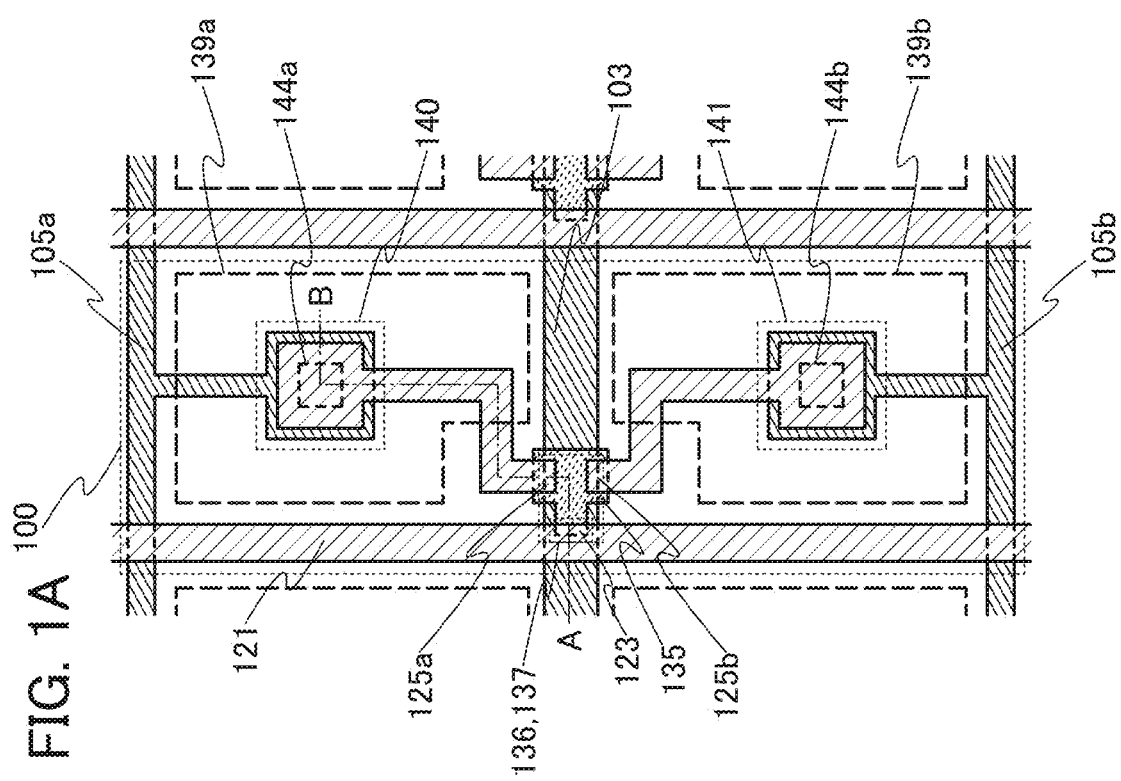

DISPLAY DEVICE

TECHNICAL FIELD

One embodiment of the present invention relates to a display device. Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter (composition of matter). Thus, more specifically, examples of the technical field of one embodiment of the present invention disclosed in this specification can include a semiconductor device, a display device, a liquid crystal display device, a light-emitting device, a power storage device, an imaging device, a method for driving any of them, and a method for manufacturing any of them.

BACKGROUND ART

In recent years, as liquid crystal display devices in which viewing angle characteristics and display quality are improved, vertically aligned (VA: Vertically Aligned) liquid crystal display devices are provided. As a VA liquid crystal display device, a liquid crystal display device with a multi-domain structure which includes a plurality of pixel electrodes and transistors connected to the respective pixel electrodes and controlling the potentials of the pixel electrodes in one pixel is provided. When one pixel is provided with a plurality of pixel electrodes, liquid crystal alignment can be made different between the pixel electrodes; therefore, a viewing angle can be large as compared with that of a conventional VA liquid crystal display device (see Patent Document 1).

Moreover, there is a trend in a liquid crystal display device toward a larger size, e.g., a screen size with a diagonal of 60 inches or more, and further, the development is aimed even at a screen size with a diagonal of 120 inches or more. In addition, a trend in resolution of a screen is toward higher definition, e.g., full high-definition image quality (FHD, 1920×1080) and 4K image quality (3840× 2160), and development of a liquid crystal display device with 7680×4320 pixels, i.e., resolution as high as what is called 8K, is imperative.

In order to reduce image sticking and improve the display quality, high-speed driving whose driving rate is doubled (also referred to as a double-frame rate driving) is performed, and further, high-speed driving at a quadruple-frame rate or higher is considered. Furthermore, in order to provide a liquid crystal display device with three-dimensional (3D) display, an image for the right eye and an image for the left eye need to be displayed alternately; thus, the liquid crystal display device is required to be operated by high-speed operation by driving at a double-frame rate or higher.

REFERENCE

Patent Document

[Patent Document 1] Japanese Published Patent Application No. 2006-317867

SUMMARY OF THE INVENTION

Problems to be Solved by the Invention

However, as a liquid crystal display device has a larger size and a higher definition, the number of pixels needed is significantly increased and writing time for one pixel is shortened. Therefore, a transistor which controls the potential of a pixel electrode is required to have high-speed operation, high on-state current, and the like.

Furthermore, increase in parasitic capacitance between wirings causes delay of signal transmission to an end of a signal line. As a result, deterioration of display quality, such as display unevenness or a defect in grayscale, or increase in power consumption is caused.

Thus, an object of one embodiment of the present invention is to provide a display device in which parasitic capacitance between wirings can be reduced. An object of one embodiment of the present invention is to provide a display device with improved display quality. An object of one embodiment of the present invention is to provide a display device in which power consumption can be reduced. An object of one embodiment of the present invention is to provide a novel semiconductor device, a novel display device, or the like.

Note that the descriptions of these objects do not preclude the existence of other objects. In one embodiment of the present invention, there is no need to achieve all the objects. Objects other than these objects will be apparent from the description of the specification, the drawings, the claims, and the like, and objects other than these objects can be derived from the description of the specification, the drawings, the claims, and the like.

Means for Solving the Problems

One embodiment of the present invention is a display device characterized by including a signal line, a scan line intersecting with the signal line, a first electrode electrically connected to the signal line, a second electrode facing the first electrode, a third electrode facing the first electrode, a first pixel electrode electrically connected to the second electrode, a second pixel electrode electrically connected to the third electrode, and a semiconductor film being in contact with the first electrode to the third electrode and provided between the scan line and the first electrode to the third electrode and in that the first electrode includes a region overlapping with the scan line.

Another embodiment of the present invention is the above-described display device characterized by including a gate insulating film between the scan line and the semiconductor film and in that the first transistor is composed of the scan line, the gate insulating film, the semiconductor film, the first electrode, and the second electrode, and the second transistor is composed of the scan line, the gate insulating film, the semiconductor film, the first electrode, and the third electrode.

Another embodiment of the present invention is the above-described display device characterized by including a first capacitor wiring electrically connected to the first pixel electrode and a second capacitor wiring electrically connected to the second pixel electrode and in that the signal line includes a region overlapping with a region between the first pixel electrode and the second pixel electrode and the signal line does not include a region overlapping with the first capacitor wiring and the second capacitor wiring.

Another embodiment of the present invention is the above-described display device characterized in that the first electrode is provided between the second electrode and the third electrode in the top surface shape.

Another embodiment of the present invention is the above-described display device characterized in that the semiconductor film contains an oxide containing In, M (M is aluminum, gallium, yttrium, or tin), and Zn.

Another embodiment of the present invention is the above-described display device characterized in that the semiconductor film includes a first semiconductor film and a second semiconductor film including a region overlapping with the first semiconductor film, and the first semiconductor film contains an oxide with a composition in which the atomic proportion of In is higher than that of M by a larger difference than in the composition of an oxide contained in the second semiconductor film.

Effect of the Invention

When one embodiment of the present invention is used, parasitic capacitance between wirings of a display device can be reduced. When one embodiment of the present invention is used, display quality of a display device can be improved. When one embodiment of the present invention is used, power consumption of a display device can be reduced. Alternatively, when one embodiment of the present invention is used, a novel semiconductor device, a novel display device, or the like can be provided. Note that the description of these effects does not preclude the existence of other effects.

One embodiment of the present invention does not necessarily all of these effects. Effects other than these effects will be apparent from the description of the specification, the drawings, the claims, and the like, and effects other than these effects can be derived from the description of the specification, the drawings, the claims, and the like.

BRIEF DESCRIPTION OF DRAWINGS

FIGS. 1A-1C Top views and a circuit diagram of one embodiment of a pixel.

MODES FOR CARRYING OUT THE INVENTION

Figure 2B:
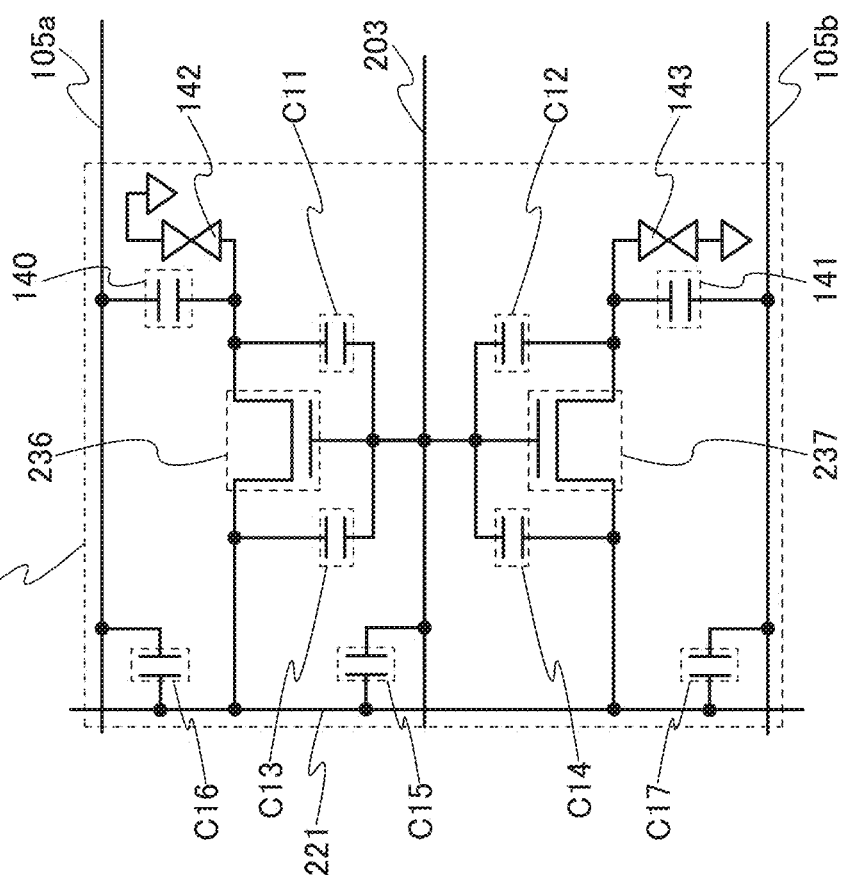
FIGS. 2A-2B A top view and a circuit diagram of a pixel illustrating one embodiment of the present invention.

Embodiments of the present invention will be described with reference to the drawings. However, the present invention is not limited to the following description. This is because it is easily understood by those skilled in the art that the mode and detail can be variously modified without departing from the scope and spirit of the present invention. Therefore, the present invention should not be interpreted as being limited to the description of the embodiments to be given below. Note that reference numerals denoting the same portions are commonly used in different drawings in describing the structure of the present invention with reference to the drawings.

Note that, in this specification, the terms "first", "second", "third", to "n-th (n is a natural number)" are used to prevent confusion between components, and thus do not limit numbers.

Note that the term "film" and the term "layer" can be interchanged with each other depending on circumstances or depending on conditions. For example, the term "conductive layer" can be changed into the term "conductive film" in some cases. Alternatively, for example, the term "insulating film" can be changed into the term "insulating layer" in some cases.

Embodiment 1

In this embodiment, structures of one pixel of a liquid crystal display device will be described with reference to FIG. 1 to FIG. 9.

Figure 2A:
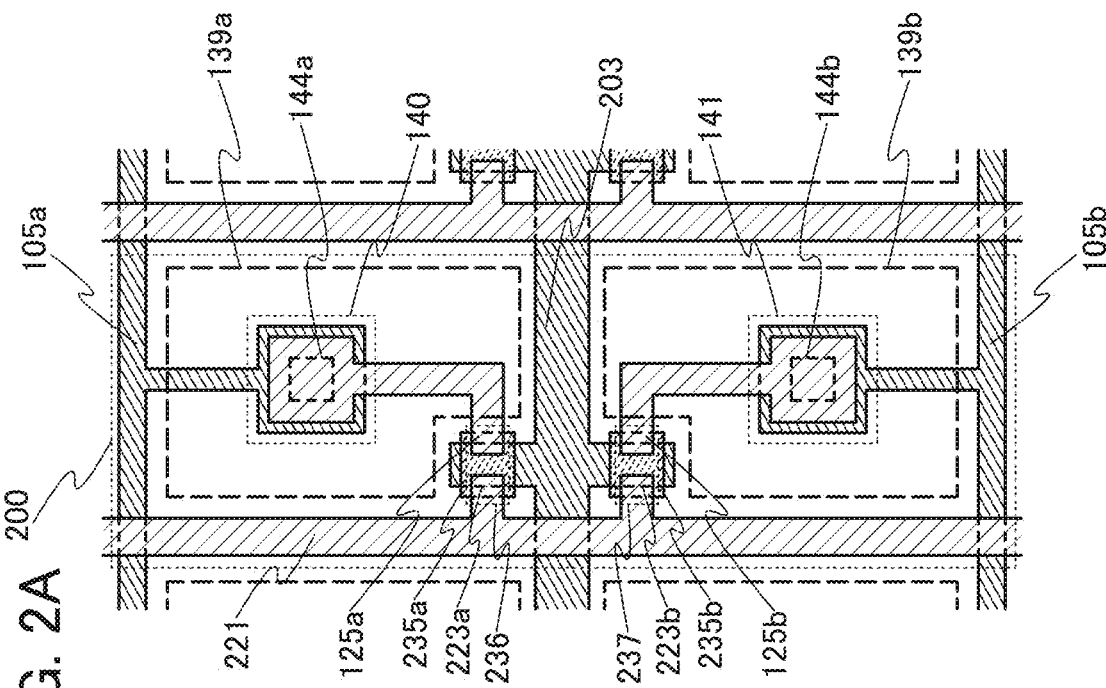

FIG. 1(A) is a top view of one pixel 100 of a liquid crystal display device having a multi-domain structure, which is described in this embodiment, and FIG. 1(B) is a circuit diagram of the pixel 100 in FIG. 1(A). Furthermore, FIG. 2(A) is a top view of one pixel 200 of a liquid crystal display device having a conventional multi-domain structure, and FIG. 2(B) shows a circuit diagram of the pixel in FIG. 2(A).

As illustrated in FIG. 1(A) and FIG. 1(B), the pixel 100 includes a scan line 103 and a signal line 121 intersecting with the scan line 103. In addition, a capacitor wiring 105a and a capacitor wiring 105b which extend in the same direction as the scan line 103 are included. Note that the scan line 103 is provided between the capacitor wiring 105a and the capacitor wiring 105b.

In addition, a transistor 136 and a transistor 137 are provided in the vicinity of the intersection portion of the scan line 103 and the signal line 121. The transistor 136 includes a semiconductor film 135 overlapping with the scan line 103, and a first electrode 123 and a second electrode 125a which overlap with the semiconductor film 135. The first electrode 123 is electrically connected to the signal line 121. The first electrode 123 serves as one of a source electrode and a drain electrode in the transistor 136. The second electrode 125a serves as the other of the source electrode and the drain electrode in the transistor 136.

The transistor 137 includes the semiconductor film 135 overlapping with the scan line 103, and the first electrode 123 and a third electrode 125b which overlap with the semiconductor film 135. The first electrode 123 serves as one of a source electrode and a drain electrode in the transistor 137. The third electrode 125b serves as the other of the source electrode and the drain electrode in the transistor 137.

In the top surface shape in FIG. 1(A), the transistor 136 and the transistor 137 in each of which part of end portions of the semiconductor film 135 is located outward from the scan line 103 serving as a gate electrode are illustrated; however, the present invention is not limited thereto. As illustrated in FIG. 1(C), in the transistor 136 and the transistor 137 included in the pixel 100, the end portions of the semiconductor film 135 may be located inward from end portions of the scan line 103.

The second electrode 125a included in the transistor 136 is electrically connected to a pixel electrode 139a through an opening 144a. In other words, the transistor 136 is connected to a liquid crystal element 142 including the pixel electrode 139a through the second electrode 125a. Furthermore, one electrode of a capacitor 140 is electrically connected to the pixel electrode 139a and the second electrode 125a of the transistor 136, and the other electrode is electrically connected to the capacitor wiring 105a (see FIG. 1(B)).

The third electrode 125b included in the transistor 137 is electrically connected to a pixel electrode 139b through an opening 144b. In other words, the transistor 137 is connected to a liquid crystal element 143 including the pixel electrode 139b through the third electrode 125b. One electrode of a capacitor 141 is electrically connected to the pixel electrode 139b and the third electrode 125b of the transistor 137, and the other electrode is electrically connected to the capacitor wiring 105b (see FIG. 1(B)).

Note that the opening 144a and the opening 144b are provided in an insulating film 116 described later. In addition, to avoid complexity of the drawings, in FIG. 1(A) and FIG. 2(A), only outlines of top surface shapes of the pixel electrode 139a and the pixel electrode 139b are denoted by dashed lines without hatching.

The transistor 136 and the transistor 137 are located almost at the center of the pixel 100 in the top surface shape and formed between the pixel electrode 139a and the pixel electrode 139b each of which is a subpixel of the pixel 100.

One embodiment of the present invention is a display device including the signal line 121, the scan line 103, the first electrode 123, the second electrode 125a, the third electrode 125b, the first pixel electrode 139a, the second pixel electrode 139b, and the semiconductor film 135. The signal line 121 intersects with the scan line 103, the first electrode 123 is electrically connected to the signal line 121, the first electrode 125a has a region overlapping with the scan line 103, the second electrode 125a faces the first electrode 123, the third electrode 125b faces the first electrode 123, the first pixel electrode 139a is electrically connected to the second electrode 125a, the second pixel electrode 139b is electrically connected to the third electrode 125b, the semiconductor film 135 is in contact with the first electrode 123, the second electrode 125a, and the third electrode 125b, and the semiconductor film 135 is provided between the scan line 103 and the first electrode 123 to the third electrode 125b.

Furthermore, the display device which includes a gate insulating film 107, the transistor 136, and the transistor 137 and in which the gate insulating film 107 is provided between the scan line 103 and the semiconductor film 135, the transistor 136 includes the scan line 103, the gate insulating film 107, the semiconductor film 135, the first electrode 123, and the second electrode 125a, and the transistor 137 includes the scan line 103, the gate insulating film 107, the semiconductor film 135, the first electrode 123, and the third electrode 125b is also one embodiment of the present invention.

The transistor 136 and the transistor 137 include the common first electrode 123, which is one of the source electrode and the drain electrode, and the first electrode 123 overlaps with the scan line 103. With such a structure, in one pixel 100 included in the display device, parasitic capacitance generated between one electrode of each of the transistor 136 and the transistor 137 and the scan line 103 can be reduced.

Note that as illustrated in FIG. 1(B), in the transistor 136, parasitic capacitance C1 is generated in a portion where the scan line 103 and the second electrode 125a overlap with each other. Furthermore, in the transistor 137, parasitic capacitance C2 is generated in a portion where the scan line 103 and the third electrode 125b overlap with each other. In addition, parasitic capacitance C5, parasitic capacitance C6, and parasitic capacitance C7 are respectively generated in portions where the signal line 121 overlaps with the scan line 103, the capacitor wiring 105a, and the capacitor wiring 105b.

Here, FIG. 2(A) shows, as a comparative example, a top view of a pixel 200, in which two transistors included in one pixel are electrically connected to signal lines through the respective electrodes and the electrodes do not overlap with the scan line. In addition, FIG. 2(B) is a circuit diagram of the pixel 200. In the description of the pixel 200, the structure similar to that of the pixel 100 is denoted by the same reference numeral, and description thereof is omitted.

As illustrated in FIG. 2(B), the pixel 200 includes a scan line 203 and a signal line 221 intersecting with the scan line 203. In addition, the capacitor wiring 105a and the capacitor wiring 105b which extend in the same direction as the scan line 203 are included. The scan line 203 is provided between the capacitor wiring 105a and the capacitor wiring 105b.

In addition, a transistor 236 and a transistor 237 are provided in the vicinity of the intersection portion of the scan line 203 and the signal line 221. The transistor 236 includes a gate electrode projected from the scan line 203, a fourth electrode 223a projected from the signal line 221, and the second electrode 125a connected to the liquid crystal element 142. One electrode of the capacitor 140 is electrically connected to the pixel electrode 139a included in the liquid crystal element 142 and the second electrode 125a of the transistor 236, and the other electrode of the capacitor 140 is electrically connected to the capacitor wiring 105a (see FIG. 2(B)).

The transistor 237 includes a gate electrode projected from the scan line 203, a fifth electrode 223b projected from the signal line 121, and the third electrode 125b connected to the liquid crystal element 143. One electrode of the capacitor 141 is electrically connected to the pixel electrode 139b included in the liquid crystal element 143 and the third electrode 125b of the transistor 237, and the other electrode of the capacitor 141 is electrically connected to the capacitor wiring 105b (see FIG. 2(B)).

The transistor 236 and the transistor 237 are different from the transistor 136 and the transistor 137 in the pixel 100 in respectively including the fourth electrode 223a and the fifth electrode 223b each of which is one of the source electrode and the drain electrode. In addition, the fourth electrode 223a and the fifth electrode 223b projected from the signal line 221 do not overlap with the scan line 203.

Note that in the transistor 236, parasitic capacitance C11 is generated in a portion where the scan line 203 and the second electrode 125a overlap with each other. Furthermore, parasitic capacitance C13 is generated in a portion where the scan line 203 and the fourth electrode 223a overlap with each other. In the transistor 237, parasitic capacitance C12 is generated in a portion where the scan line 203 and the third electrode 125b overlap with each other. Furthermore, parasitic capacitance C14 is generated in a portion where the scan line 203 and the fifth electrode 223b overlap with each other. In addition, parasitic capacitance C15, parasitic capacitance C16, and parasitic capacitance C17 are respectively generated in portions where the signal line 221 overlaps with the scan line 203, the capacitor wiring 105a, and the capacitor wiring 105b.

In the transistor 136 and the transistor 236, when the area of the portion where the scan line 103 and the second electrode 125a overlap with each other and the area of the portion where the scan line 203 and the second electrode 125a overlap with each other are substantially the same, the parasitic capacitance C1 and the parasitic capacitance C11 are substantially the same. In addition, in the transistor 137 and the transistor 237, when the area of the portion where the scan line 103 and the third electrode 125b overlap with each other and the area of the portion where the scan line 203 and the third electrode 125b overlap with each other are substantially the same, the parasitic capacitance C2 and the parasitic capacitance C12 are substantially the same. Furthermore, when the area of a portion where the signal line 121 and the scan line 103 overlap with each other and the area of a portion where the signal line 221 and the scan line 203 overlap with each other are substantially the same, the parasitic capacitance C5 and the parasitic capacitance C15 are substantially the same. Furthermore, when the area of a portion where the signal line 121 and the capacitor wiring 105a overlap with each other and the area of a portion where the signal line 221 and the capacitor wiring 105a overlap with each other are substantially the same, the parasitic capacitance C6 and the parasitic capacitance C16 are substantially the same. Furthermore, when the area of a portion where the signal line 121 and the capacitor wiring 105b overlap with each other and the area of a portion where the signal line 221 and the capacitor wiring 105b overlap with each other are substantially the same, the parasitic capacitance C7 and the parasitic capacitance C17 are substantially the same.

In the pixel 200, which is a comparative example, since electrodes each of which serves as one of the source electrode and the drain electrode are different electrodes in the transistor 236 and the transistor 237 (the fourth electrode 223a in the transistor 236 and the fifth electrode 223b in the transistor 237), parasitic capacitance C13 is generated between the scan line 203 and the fourth electrode 223a and parasitic capacitance C14 is generated between the scan line 203 and the fifth electrode 223b.

However, in the pixel 100 in this embodiment, the transistor 136 and the transistor 137 include the common electrode (the first electrode 123) serving as one of the source electrode and the drain electrode, and the electrode overlaps with the scan line 103 in the portion where the signal line 121 and the scan line 103 overlap with each other. Thus, in the transistor 136 and the transistor 137, parasitic capacitance generated in a portion where the electrode and the scan line 103 overlap with each other is contained in the above-described parasitic capacitance C5. Since the parasitic capacitance C5 and the parasitic capacitance C15 are substantially the same, in the pixel 100, the amount of parasitic capacitance is smaller than in the pixel 200 by the amount of the parasitic capacitance C13 and the parasitic capacitance C14. In view of the above, the display device of one embodiment of the present invention can reduce the parasitic capacitance generated between the wirings in one pixel 100.

Note that in the pixel 100 in this embodiment, the transistor 136 and the transistor 137 include the common semiconductor film; thus, a region where the first electrode 123 and the semiconductor film 135 are in contact with each other can be shared by the transistor 136 and the transistor 137. As a result, the area occupied by the transistor 136 and the transistor 137 in the pixel 100 can be reduced.

Figure 3B:
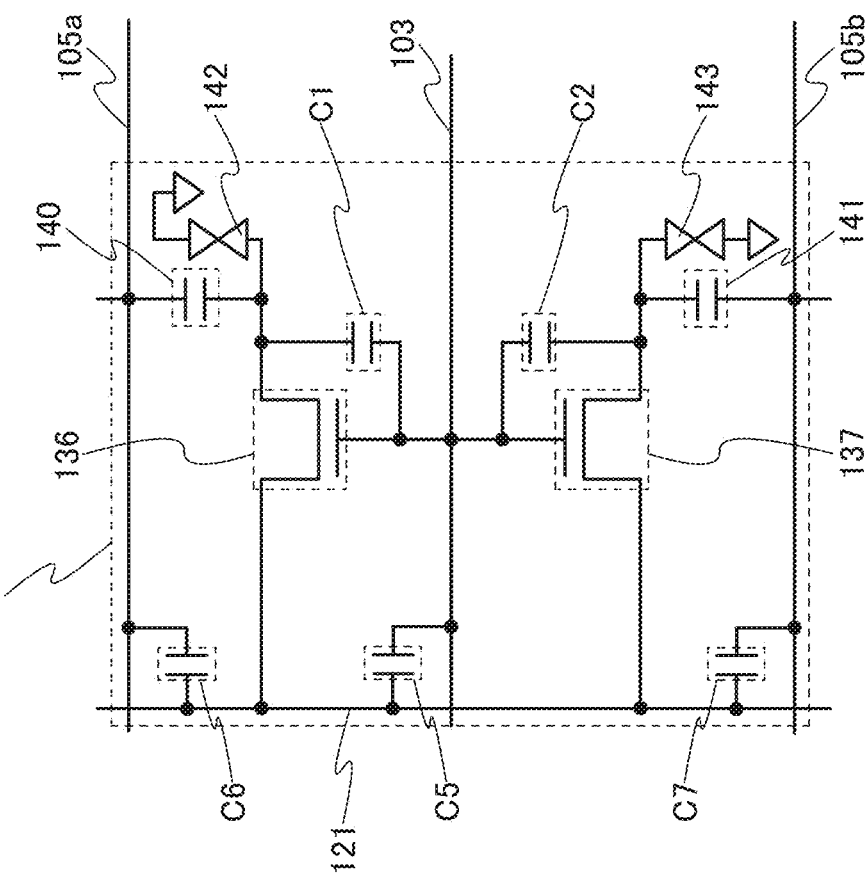
FIGS. 3A-3B A top view and a circuit diagram of one embodiment of a pixel.
Figure 3A:
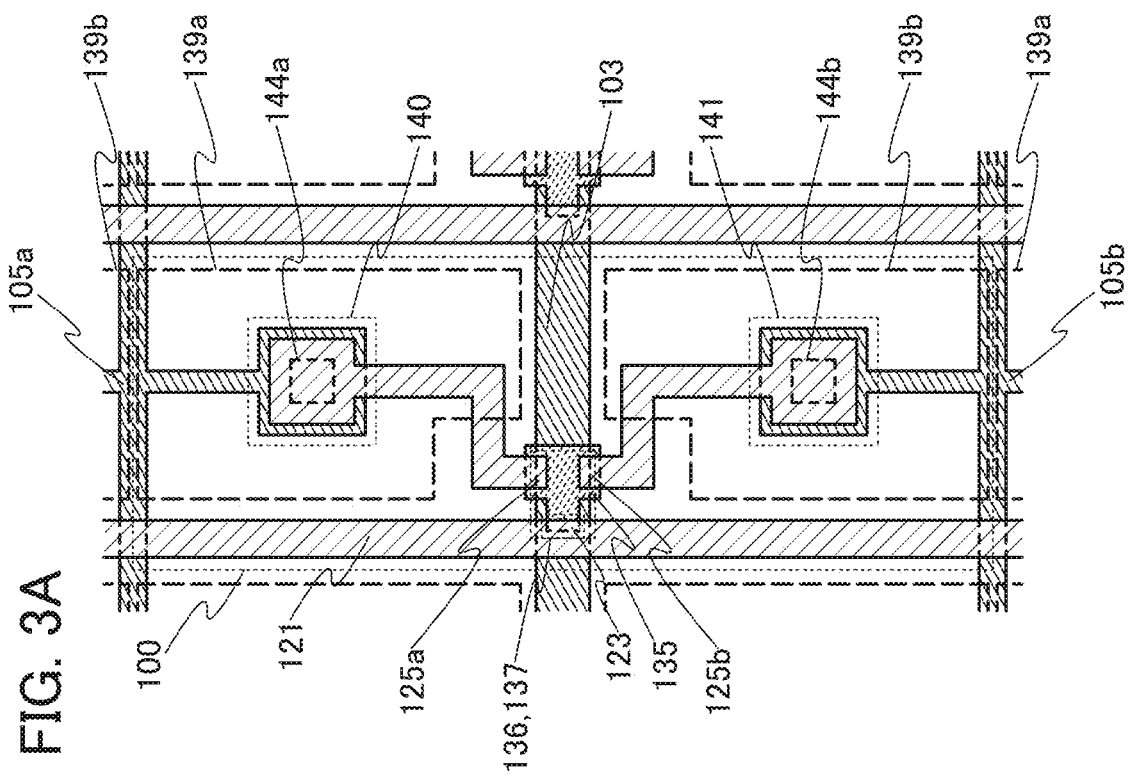

Alternatively, as illustrated in FIG. 3(A) and FIG. 3(B), the pixel 100 may have a structure where the capacitor wiring 105a and the capacitor wiring 105b are each shared with an adjacent pixel. With such a structure, the number of capacitor wirings included in the display device can be reduced. Furthermore, as illustrated in FIG. 3(A), when the area of a portion where the pixel electrode 139a and the capacitor wiring 105a overlap with each other is increased, the capacitance of the capacitor 140 can be increased. Similarly, when the area of a portion where the pixel electrode 139b and the capacitor wiring 105b is increased, the capacitance of the capacitor 141 can be increased.

Next, structures of the transistor and the capacitor included in the pixel 100 will be described with reference to FIG. 4.

Figure 4:
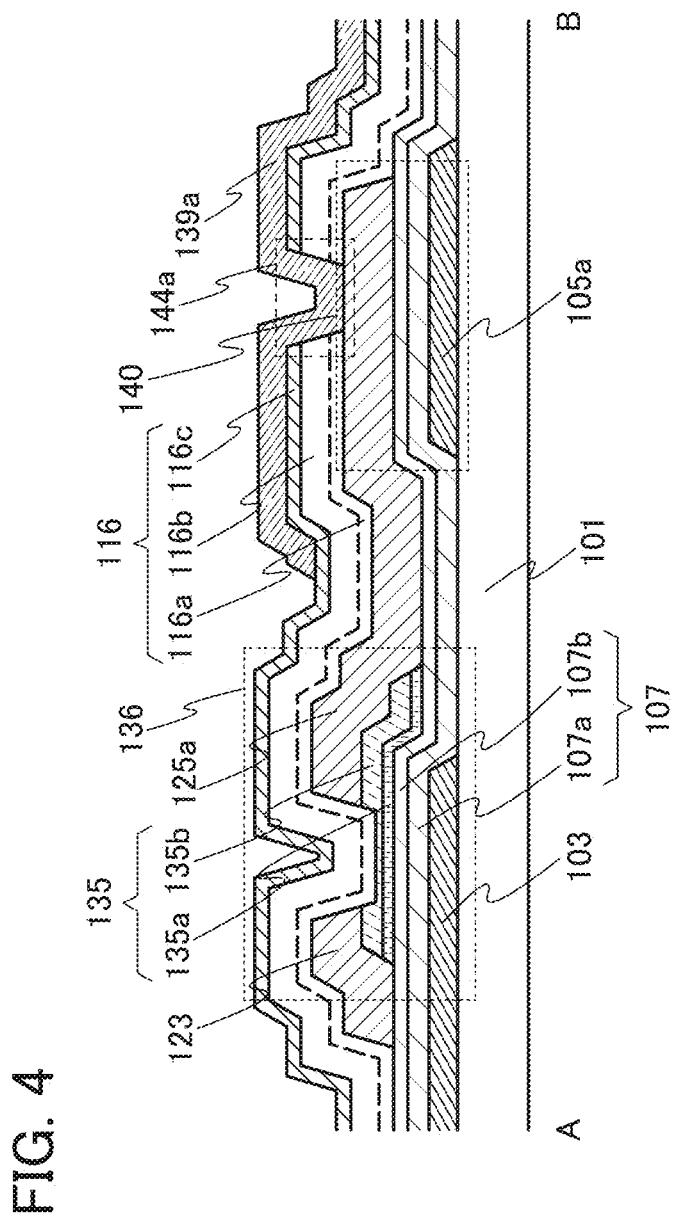
FIG. 4 A cross-sectional view of one embodiment of a pixel.

FIG. 4 illustrates a cross-sectional structure of the transistor 136 and the capacitor 140 taken along dashed-dotted line A-B in FIG. 1(A).

The transistor 136 includes, over a substrate 101, the scan line 103, the semiconductor film 135, a gate insulating film 107 provided between the scan line 103 and the semiconductor film 135, the first electrode 123 in contact with the semiconductor film 135, and the second electrode 125a in contact with the semiconductor film 135.

The capacitor 140 includes, over the substrate 101, the capacitor wiring 105a, the second electrode 125a, and the gate insulating film 107 provided between the capacitor wiring 105a and the second electrode 125a.

The insulating film 116 is provided over the gate insulating film 107, the semiconductor film 135, the first electrode 123, and the second electrode 125a. In addition, the pixel electrode 139a which is electrically connected to the second electrode 125a through the opening 144a formed in the insulating film 116 is provided over the insulating film 116.

Although not illustrated, the transistor 137 has a structure similar to that of the transistor 136. Furthermore, the capacitor 141 has a structure similar to that of the capacitor 140.

As the substrate 101, a glass substrate; a ceramic substrate; a plastic substrate which has heat resistance high enough to withstand the process temperature of this manufacturing process; or the like can be used. In the case where the substrate does not need a light-transmitting property, a substrate of a metal such as stainless steel, provided with an insulating film on its surface may be used. As the glass substrate, for example, an alkali-free glass substrate of barium borosilicate glass, aluminoborosilicate glass, aluminosilicate glass, or the like is preferably used. Note that there is no limitation on the size of the substrate 101, and for example, any of glass substrates of the third generation to the tenth generation which are often used in liquid crystal display devices can be used. Furthermore, for the material used for the substrate 101, a material used for a substrate 502, which will be described in Embodiment 2, can be referred to.

Part of the scan line 103 serves as a gate electrode of the transistor 136. The scan line 103 can be formed as a single layer or a stacked layer using a metal material such as molybdenum, titanium, chromium, tantalum, tungsten, aluminum, copper, neodymium, scandium, or nickel or an alloy material which contains any of these as a main component. A semiconductor typified by polycrystalline silicon doped with an impurity element such as phosphorus, an Ag—Pd—Cu alloy, an Al—Nd alloy, an Al—Ni alloy, or the like may be used.

For example, as a two-layer stacked structure of the scan line 103, a two-layer stacked structure in which a molybdenum film is stacked over an aluminum film, a two-layer structure in which a molybdenum film is stacked over a copper film, a two-layer structure in which a titanium nitride film or a tantalum nitride film is stacked over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like is preferable. As a three-layer stacked structure, a three-layer structure in which a tungsten film or a tungsten nitride film, an alloy film of aluminum and silicon or an alloy film of aluminum and titanium, and a titanium nitride film or a titanium film are stacked is preferable. By stacking a metal film functioning as a barrier film over a film having low electric resistance, electric resistance can be low and diffusion of metal elements from the metal film into the semiconductor film can be prevented. Furthermore, for the material used for the scan line 103, a material used for a conductive film 504, which will be described in Embodiment 2, can be referred to.

Note that the capacitor wiring 105a and the capacitor wiring 105b have a material and a stacked-layer structure similar to those of the scan line 103.

The gate insulating film 107 can be formed as a single layer or a stacked layer using a silicon oxide film, a silicon oxynitride film, a silicon nitride film, a silicon nitride oxide film, an aluminum oxide film, an aluminum nitride film, an aluminum oxynitride film, or an aluminum nitride oxide film. In this embodiment, the gate insulating film 107 has a stacked-layer structure of the gate insulating film 107a and the gate insulating film 107b. Furthermore, for the materials used for the gate insulating film 107a and the gate insulating film 107b, materials used for an insulating film 506 and an insulating film 507, which will be described in Embodiment 2, can be referred to, respectively.

As the semiconductor film 135, a silicon film or an oxide semiconductor film can be used. The semiconductor film 135 can have an amorphous structure, a polycrystalline structure, a single crystal structure, or any other crystal structure, as appropriate.

In particular, as the semiconductor film 135, an oxide semiconductor film can be suitably used. Specifically, an In-M (M is aluminum, gallium, yttrium, or tin) oxide or an In-M-Zn oxide can be used. In particular, as the semiconductor film 135, an oxide semiconductor film 135a and an oxide semiconductor film 135b which have different compositions are preferably used. For the materials used for the oxide semiconductor film 135a and the oxide semiconductor film 135b, materials used for an oxide semiconductor film 508a and an oxide semiconductor film 508b, which will be described in Embodiment 2, can be referred to, respectively.

The first electrode 123 and the second electrode 125a can be formed as a single layer or a stacked layer using any of aluminum, copper, titanium, neodymium, scandium, molybdenum, chromium, tantalum, tungsten, and the like. Alternatively, they may be formed using an aluminum alloy to which an element for preventing a hillock is added (e.g., an Al—Nd alloy which can be used for the scan line 103). Crystalline silicon to which an impurity element which serves as a donor is added may also be used. A stacked structure may be employed in which a film, which is on the side in contact with the crystalline silicon to which an impurity element serving as a donor is added, is formed using titanium, tantalum, molybdenum, tungsten, or a nitride of any of these elements, and then aluminum or an aluminum alloy is formed thereover. Further alternatively, a stacked structure in which an upper surface and a lower surface of aluminum or an aluminum alloy are sandwiched by titanium, tantalum, molybdenum, tungsten, or a nitride of any of these elements. Furthermore, for the materials used for the first electrode 123 and the second electrode 125a, materials of a conductive film 512a and a conductive film 512b, which will be described in Embodiment 2, can be referred to.

Note that the signal line 121 and the third electrode 125b have a material and a stacked-layer structure similar to those of the first electrode 123.

The insulating film 116 has a stacked structure of an insulating film 116a, an insulating film 116b, and an insulating film 116c in this embodiment. For materials and formation methods used for the insulating film 116a, the insulating film 116b, and the insulating film 116c, descriptions of an insulating film 514, an insulating film 516, and an insulating film 518, which will be described in Embodiment 2, can be referred to, respectively. Furthermore, the insulating film 116 may be formed as a single layer or a stacked layer using a material similar to that of the gate insulating film 107.

For the pixel electrode 139a, a single layer or a stacked layer of a metal film of molybdenum, titanium, tantalum, tungsten, aluminum, silver, copper, chromium, neodymium, scandium, or the like, or an alloy film that contains any of these metals. As the alloy containing aluminum, an aluminum-nickel-lanthanum alloy, an aluminum-titanium alloy, an aluminum-neodymium alloy and the like can be given. As the alloy containing silver, a silver-neodymium alloy, a magnesium-silver alloy, and the like can be given. Alternatively, an alloy containing gold and copper can be used. Alternatively, a metal nitride film containing titanium nitride, molybdenum nitride, tungsten nitride, or the like may be used. Furthermore, for the material used for the pixel electrode 139a, a material used for a conductive film 520, which will be described in Embodiment 2, can be referred to. The pixel electrode 139b has a material and a stacked-layer structure similar to those of the pixel electrode 139a.

Figure 5:
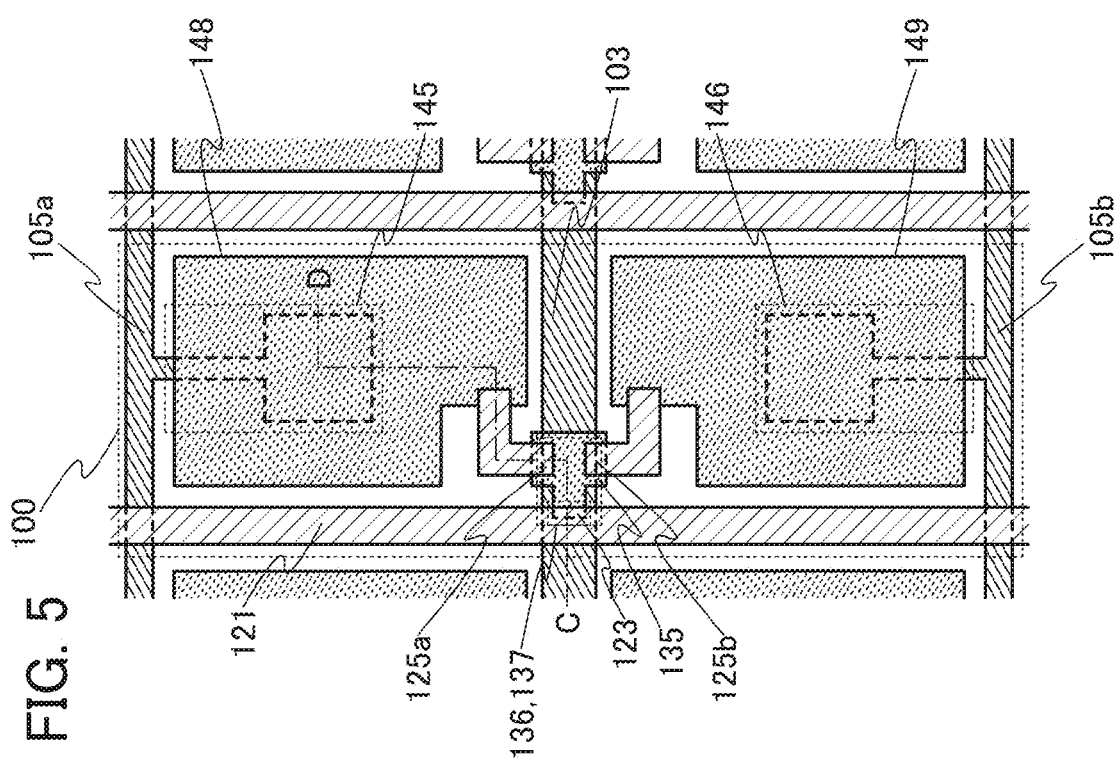
FIG. 5 A top view of one embodiment of a pixel.
Figure 6:
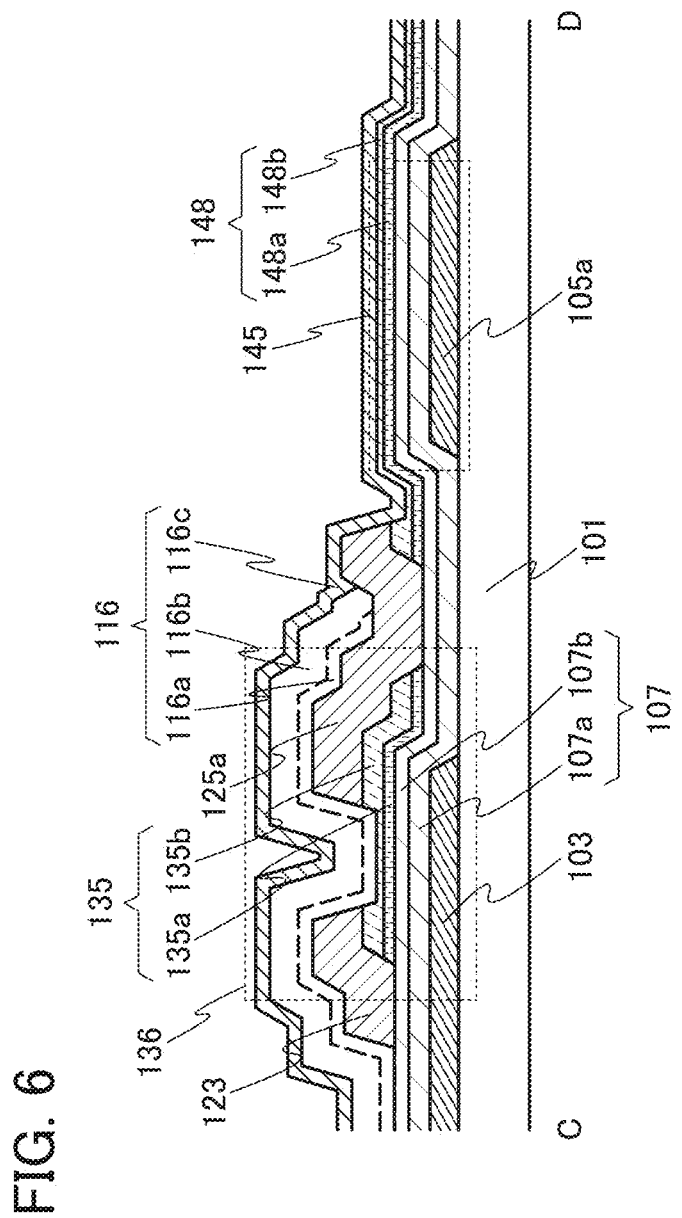
FIG. 6 A top view of one embodiment of a pixel.

Alternatively, for the pixel electrode, an oxide semiconductor film may be used. FIG. 5 is a top view of the pixel 100 including a pixel electrode 148 and a pixel electrode 149 using oxide semiconductor films. FIG. 6 illustrates a cross-sectional structure of the transistor 136 and a capacitor 145 taken along dashed-dotted line C-D in FIG. 5.

Note that in this specification and the like, an oxide conductor film can be referred to as an oxide semiconductor film having a high carrier density and a low resistance, an oxide semiconductor film having conductivity, an oxide semiconductor film having high conductivity, or the like.

An oxide semiconductor film is preferably used for the pixel electrode 148 because when an oxide semiconductor film is used for the semiconductor film 135, the semiconductor film 135 and the pixel electrode 148 can be formed through the same process. The resistance of an oxide semiconductor film can be controlled by oxygen vacancies in the film and/or the concentration of impurities such as hydrogen and water in the film. Therefore, the resistivity of the semiconductor film 135 and the pixel electrode 148 formed through the same process can be controlled by selecting treatment for increasing the oxygen vacancies and/or the impurity concentration or treatment for reducing the oxygen vacancies and/or the impurity concentration performed on the oxide semiconductor films each of which has an island shape by processing.

Specifically, plasma treatment is performed on the island-shaped oxide semiconductor films that are to be an oxide conductor film 148a and an oxide conductor film 148b functioning as the pixel electrode 148 to increase oxygen vacancies in the oxide semiconductor films and/or to increase impurities such as hydrogen and water in the oxide semiconductor films, so that the oxide semiconductor films can have a high carrier density and a low resistance. On the other hand, over the transistor 136, the insulating films 116a and 116b are provided to prevent the oxide semiconductor films 135a and 135b from being exposed to the above plasma treatment. In FIG. 6, the insulating films 116a and 116b are provided so that their regions overlapping with the oxide conductor films 148a and 148b are selectively removed.

As the plasma treatment to be performed on the oxide conductor films 148a and 148b, plasma treatment using a gas containing one or more of a rare gas (He, Ne, Ar, Kr, or Xe), phosphorus, boron, hydrogen, and nitrogen is typically given. More specifically, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, plasma treatment in a nitrogen atmosphere, or the like can be given.

Note that the pixel electrode 149 has a material and a stacked-layer structure similar to those of the pixel electrode 148. In addition, in the pixel 100 illustrated in FIG. 5 and FIG. 6, the capacitor 145 includes the capacitor wiring 105a, the pixel electrode 148, and the gate insulating film 107 provided between the capacitor wiring 105a and the pixel electrode 148. Furthermore, the capacitor 146 includes the capacitor wiring 105b, the pixel electrode 149, and the gate insulating film 107 provided between the capacitor wiring 105b and the pixel electrode 149.

Note that more specific structure and manufacturing method of the transistor 136 will be described in Embodiment 2. When a transistor shown in Embodiment 2 is used for the pixel 100 described in this embodiment, power consumption of the display device of one embodiment of the present invention can be reduced.

[Modification Example of Pixel Structure]

Structures of one pixel of a liquid crystal display device, which are different from that of the above-described pixel 100, will be described below with reference to FIG. 7 to FIG. 9.

Figures 7A, 7B, 7C, 7D:
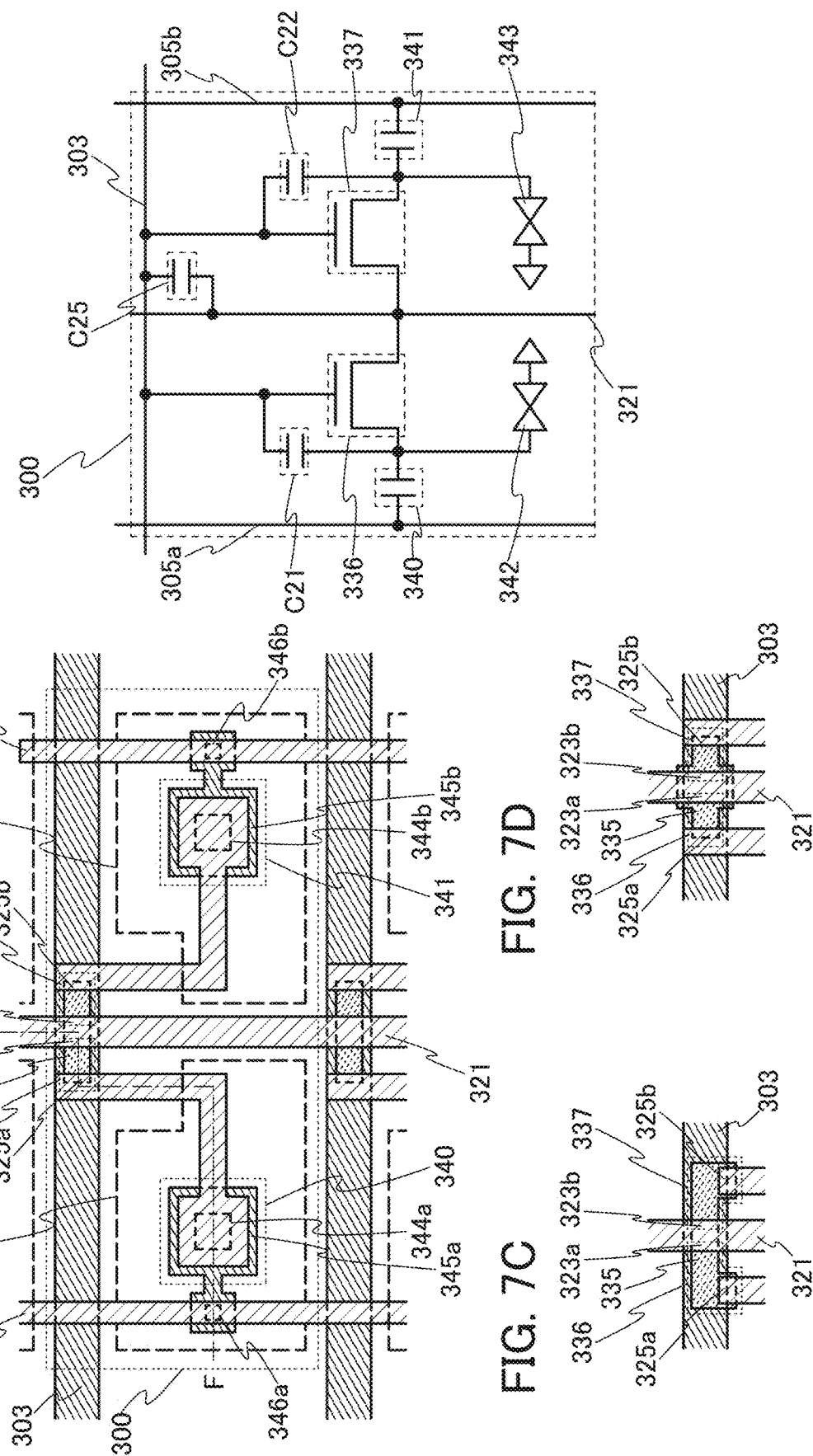
FIGS. 7A-7D Top views and a circuit diagram of one embodiment of a pixel.

FIG. 7(A) is a top view of one pixel 300 of a liquid crystal display device having a multi-domain structure, which is described in this embodiment, and FIG. 7(B) is a circuit diagram of the pixel 300 in FIG. 7(A).

As illustrated in FIG. 7(A) and FIG. 7(B), the pixel 300 includes a scan line 303 and a signal line 321 intersecting with the scan line 303. The signal line 321 has a region overlapping with a region between the pixel electrode 339a and the pixel electrode 339b. In addition, a capacitor wiring 305a and a capacitor wiring 305b which extend in the same direction as the signal line 321 are included. That is, the signal line 321 does not have a region overlapping with the capacitor wiring 305a and the capacitor wiring 305b. Note that the capacitor wiring 305a and the capacitor wiring 305b are electrically connected to the pixel electrode 339a and the pixel electrode 339b, respectively. Furthermore, the scan line 321 is provided between the capacitor wiring 305a and the capacitor wiring 305b.

In addition, a transistor 336 and a transistor 337 are provided in the vicinity of the intersection portion of the scan line 303 and the signal line 321. The transistor 336 includes a semiconductor film 335 overlapping with the scan line 303, and a sixth electrode 323a and a seventh electrode 325a which overlap with the semiconductor film 335. The sixth electrode 323a is electrically connected to the signal line 321. The sixth electrode 323a serves as one of a source electrode and a drain electrode in the transistor 336. The seventh electrode 325a serves as the other of the source electrode and the drain electrode in the transistor 336.

The transistor 337 includes the semiconductor film 335 overlapping with the scan line 303, and an eighth electrode 323b and a ninth electrode 325b which overlap with the semiconductor film 335. The eighth electrode 323b is electrically connected to the signal line 321. The eighth electrode 323b serves as one of a source electrode and a drain electrode in the transistor 337. The ninth electrode 325b serves as the other of the source electrode and the drain electrode in the transistor 337.

The seventh electrode 325a included in the transistor 336 is electrically connected to a pixel electrode 339a through an opening 344a. In other words, the transistor 336 is connected to a liquid crystal element 342 including the pixel electrode 339a through the seventh electrode 325a. Furthermore, one electrode of a capacitor 340 is electrically connected to the pixel electrode 339a and the seventh electrode 325a of the transistor 336, and the other electrode 345a is electrically connected to the capacitor wiring 305a through an opening 346a.

The ninth electrode 325b included in the transistor 337 is electrically connected to a pixel electrode 339b through an opening 344b. In other words, the transistor 337 is connected to a liquid crystal element 343 including the pixel electrode 339b through the ninth electrode 325b. One electrode of a capacitor 341 is electrically connected to the pixel electrode 339b and the ninth electrode 325b of the transistor 337, and the other electrode 345b is electrically connected to the capacitor wiring 305b through an opening 346b.

Note that the opening 344a and the opening 344b are provided in an insulating film 316 described later. The opening 346a and the opening 346b are provided in a gate insulating film 307 described later. In addition, to avoid complexity of the drawing, in FIG. 7(A), only outlines of top surface shapes of the pixel electrode 339a and the pixel electrode 339b are denoted by dashed lines without using hatching.

The transistor 336 and the transistor 337 are located almost at the center of the pixel 300 in the top surface shape and formed between the pixel electrode 339a and the pixel electrode 339b each of which is a subpixel of the pixel 300.

In the transistor 336 and the transistor 337, the sixth electrode 323a and the eighth electrode 323b, each of which is one of the source electrode and the drain electrode, overlap with the scan line 303 in a portion where the signal line 321 and the scan line 303 overlap with each other. With such a structure, in one pixel 300 included in the display element, parasitic capacitance generated between one electrode of each of the transistor 336 and the transistor 337 and the scan line 303 can be reduced. Furthermore, in the transistor 336 and the transistor 337, the seventh electrode 325a and the ninth electrode 325b, each of which is the other of the source electrode and the drain electrode, overlap with the scan line 303.

Note that as illustrated in FIG. 7(B), in the transistor 336, parasitic capacitance C21 is generated in a portion where the scan line 303 and the seventh electrode 325a overlap with each other. Furthermore, in the transistor 337, parasitic capacitance C22 is generated in a portion where the scan line 303 and the ninth electrode 325b overlap with each other. In addition, parasitic capacitance C25 is generated in a portion where the signal line 321 and the scan line 303 overlap with each other. Since the sixth electrode 323a and the eighth electrode 323b overlap with the scan line 303 in a portion where the signal line 321 and the scan line 303 overlap with each other, parasitic capacitance generated in a portion where the sixth electrode 323a and the eighth electrode 323b overlap with the scan line 303 is contained in the above-described parasitic capacitance C25.

Here, the pixel 300 including the transistor 336 and the transistor 337 is compared with the pixel 100 including the transistor 136 and the transistor 137. Since the area of a portion where the seventh electrode 325a and the scan line 303 overlap with each other is larger than the area of the portion where the second electrode 125a and the scan line 103 overlap with each other, the parasitic capacitance C21 is larger than the parasitic capacitance C1. In addition, since the area of a portion where the ninth electrode 325b and the scan line 303 overlap with each other is larger than the area of the portion where the third electrode 125b and the scan line 103 overlap with each other, the parasitic capacitance C22 is larger than the parasitic capacitance C2. Furthermore, when the area of a portion where the scan line 303 and the signal line 321 overlap with each other and the area of the portion where the scan line 103 and the signal line 121 overlap with each other are substantially the same, the parasitic capacitance C25 and the parasitic capacitance C5 are substantially the same.

In the pixel 100, the parasitic capacitance C6 and the parasitic capacitance C7 are respectively generated in the portions where the signal line 121 overlaps with the capacitor wiring 105a and the capacitor wiring 105b. In contrast, in the pixel 300, the signal line 321 does not have a region overlapping with the capacitor wiring 305a and the capacitor wiring 305b; thus, parasitic capacitance is not generated between the signal line 321 and the capacitor wiring 305a and between the signal line 321 and the capacitor wiring 305b.

In the liquid crystal display device including a plurality of pixels, parasitic capacitance which causes delay of signal transmission of a signal line has less influence on delay of signal transmission when the parasitic capacitance is generated closer to the end through a transistor in a signal transmission path. For example, in the pixel 100, the parasitic capacitance C1 generated in the portion where the scan line 103 and the second electrode 125a overlap with each other has less influence on delay of signal transmission of the signal line 121 than the parasitic capacitance C6 generated in the portion where the signal line 121 and the capacitor wiring 105a overlap with each other. This is because, in the liquid crystal display device, while signal transmission is influenced by the addition of the parasitic capacitance C6 times the number of capacitor wirings that overlap with one signal line 121, the parasitic capacitance C1 influences the signal transmission when one transistor 136 connected to one signal line 121 is turned on. Accordingly, the pixel 300 has larger parasitic capacitance than the pixel 100 by differences between the parasitic capacitance C21 and the parasitic capacitance C1 and between the parasitic capacitance C22 and the parasitic capacitance C2; however, the parasitic capacitance C6 and the parasitic capacitance C7, which are generated in the pixel 100, are not generated, so that the parasitic capacitance which causes delay of signal transmission of the signal line included in the liquid crystal display device can be reduced.

Note that as illustrated in FIG. 7(C), the end portion of the semiconductor film 335 may be extended in the direction in which the signal line 321 extends and the seventh electrode 325a and the ninth electrode 325b may be provided such that the areas of the portion where the seventh electrode 325a and the scan line 303 overlap with each other and the portion where the ninth electrode 325b and the scan line 303 overlap with each other are small. With such a structure, the above-described parasitic capacitance C21 and parasitic capacitance C22 can be reduced. Alternatively, as illustrated in FIG. 7(D), the semiconductor film 335 may be provided so that the end portions of the semiconductor film 335 are located outward from the portion where the signal line 321 and the scan line 303 overlap with each other in the top view. The semiconductor film 335 is formed, in addition to the gate insulating film 307, between the signal line 321 and the scan line 303, whereby the parasitic capacitance generated in the portion where the signal line 321 and the scan line 303 overlap with each other can be reduced in some cases.

Figure 8A:
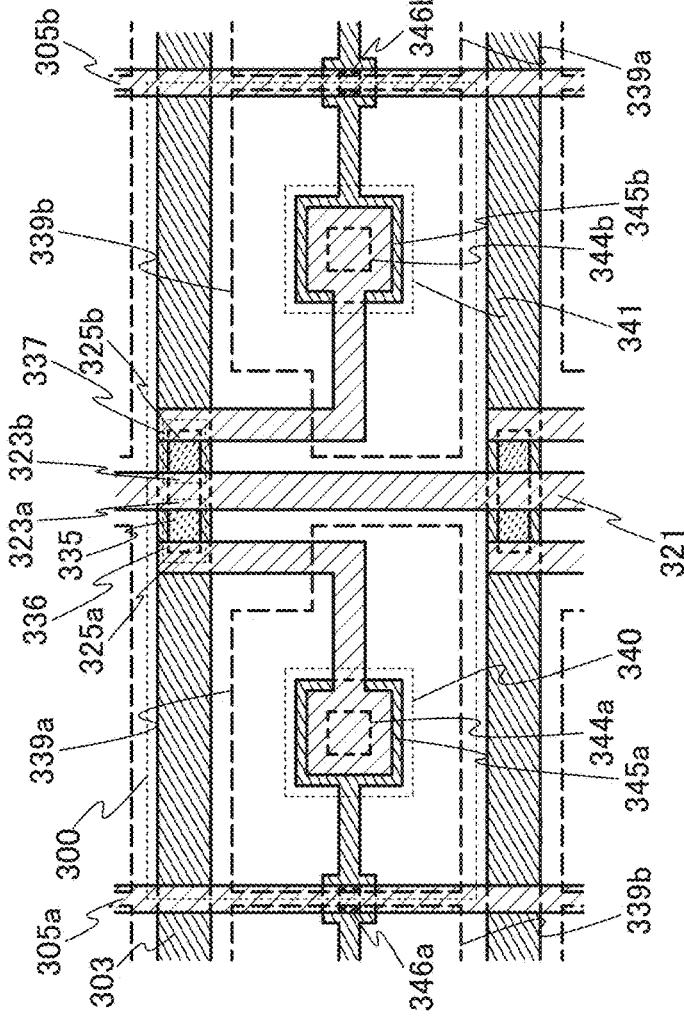
FIGS. 8A-8B A top view and a circuit diagram of one embodiment of a pixel.
Figure 8B:
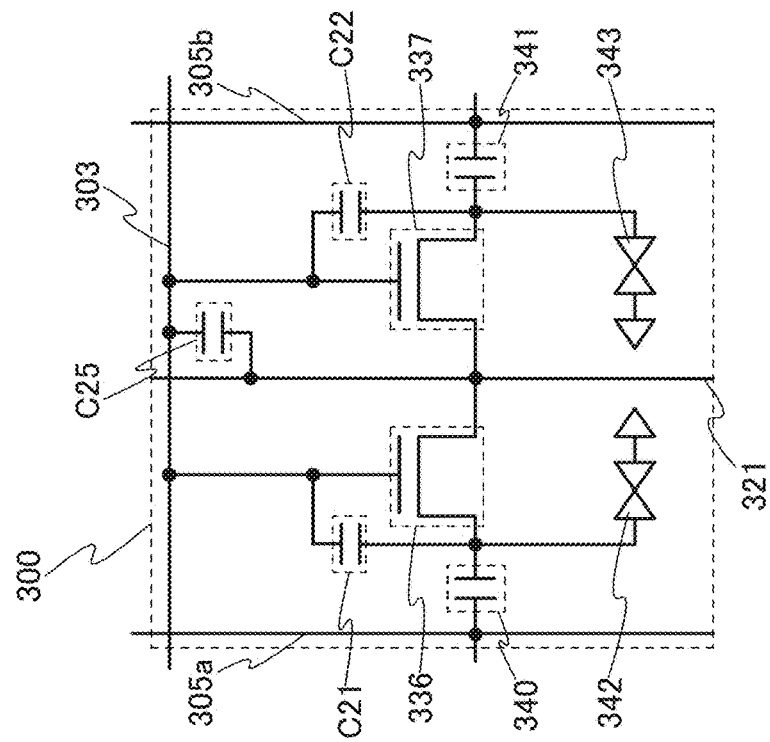

Alternatively, as illustrated in FIG. 8(A) and FIG. 8(B), the pixel 300 may have a structure where the capacitor wiring 305a and the capacitor wiring 305b are each shared with an adjacent pixel. With such a structure, the number of capacitor wirings included in the display device can be reduced. Furthermore, when the area of a portion where the pixel electrode 339a and the capacitor wiring 305a overlap with each other is increased, the capacitance of the capacitor 340 can be increased as illustrated in FIG. 8(A). Similarly, when the area of a portion where the pixel electrode 339b and the capacitor wiring 305b is increased, the capacitance of the capacitor 341 can be increased.

Next, structures of the transistor and the capacitor included in the pixel 300 will be described with reference to FIG. 9.

Figure 9:
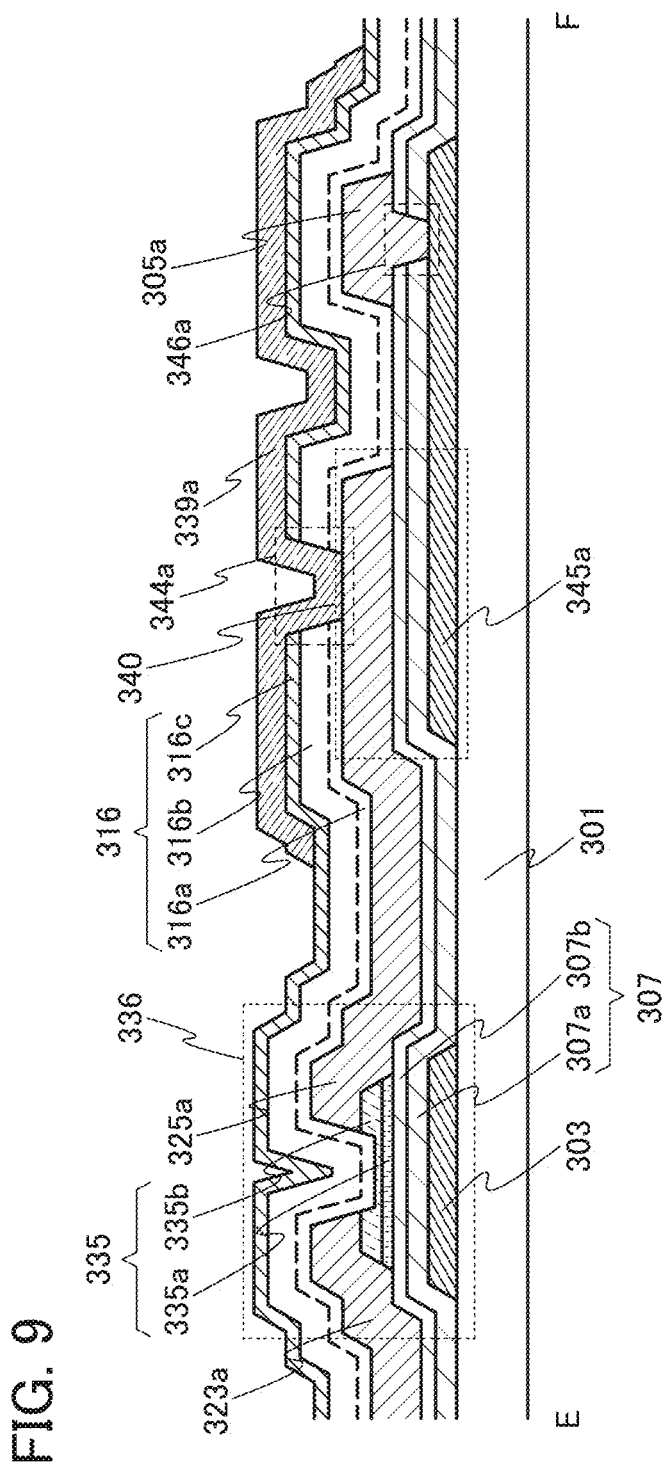
FIG. 9 A cross-sectional view of one embodiment of a pixel.
Figure 10A:
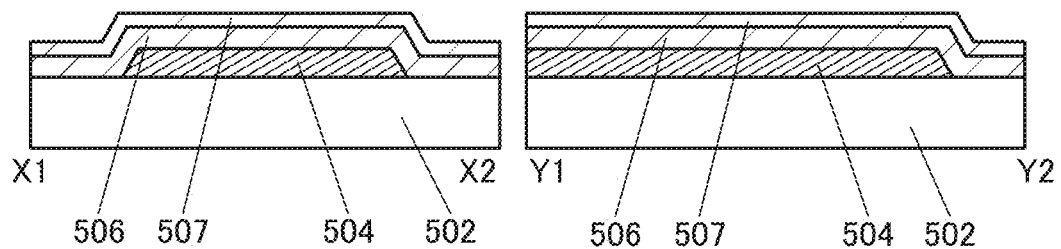
FIGS. 10A-10C Cross-sectional views showing an example of a manufacturing process of a semiconductor device.
Figure 10B:
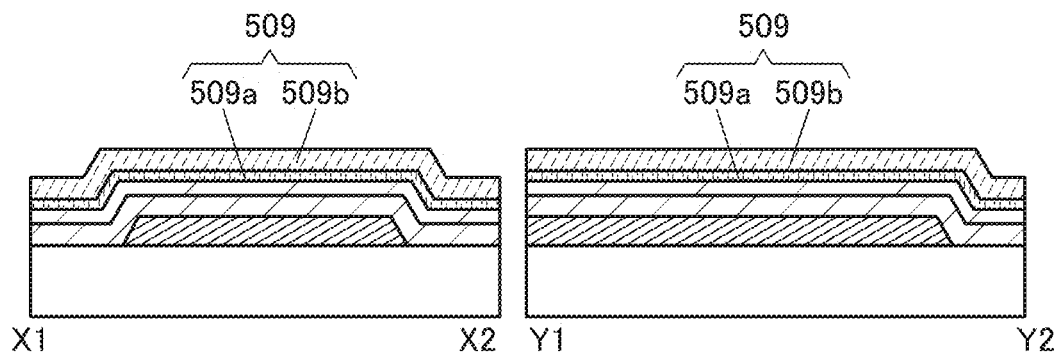
Figure 10C:
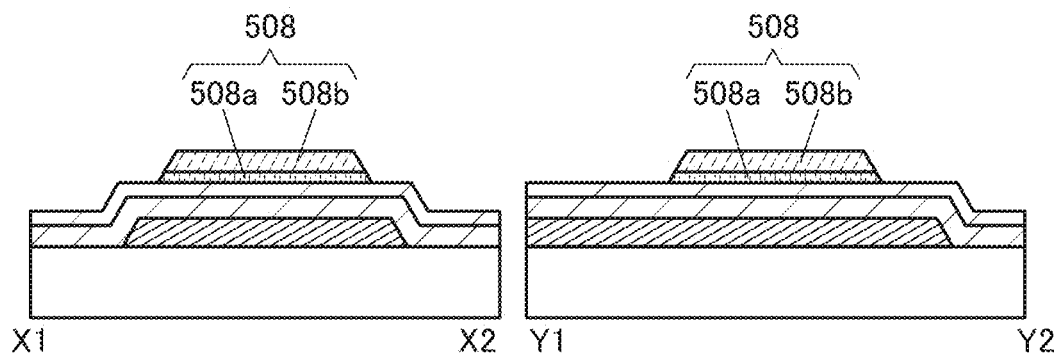

FIG. 9 is a cross-sectional structure of the transistor 336 and the capacitor 340 taken along dashed-dotted line C-D shown in FIG. 7(A).

The transistor 336 includes, over a substrate 301, the scan line 303, the semiconductor film 335, a gate insulating film 307 provided between the scan line 303 and the semiconductor film 335, the sixth electrode 323a in contact with the semiconductor film 335, and the seventh electrode 325a in contact with the semiconductor film 335.

The capacitor 340 includes, over the substrate 301, the electrode 345a, the seventh electrode 325a, and the gate insulating film 307 provided between the electrode 345a and the seventh electrode 325a.

In addition, over the gate insulating film 307, the capacitor wiring 305a that is electrically connected to the electrode 345a through the opening 346a provided in the gate insulating film 307 is provided. An insulating film 316 is provided over the gate insulating film 307, the semiconductor film 335, the sixth electrode 323a, the seventh electrode 325a, and the capacitor wiring 305a. The pixel electrode 339a which is electrically connected to the seventh electrode 325a through the opening 344a provided in the insulating film 316 is provided over the insulating film 316.

Although not illustrated, the transistor 337 has a structure similar to that of the transistor 336. Furthermore, the capacitor 341 has a structure similar to that of the capacitor 340.

Layers forming the transistor 336 and the capacitor 340 have materials and stacked-layer structures similar to those of the layers forming the transistor 136 and the capacitor 140. Furthermore, the insulating film 316 and the pixel electrode 339a can be formed using materials similar to those of the insulating film 116 and the pixel electrode 139a. Furthermore, the electrode 345a and the capacitor wiring 305a can be formed using materials similar to those of the scan line 303 and the sixth electrode 323a.

Note that a more specific structure and manufacturing method of the transistor 336 will be described in Embodiment 2. When a transistor shown in Embodiment 2 is used for the pixel 300 described in this embodiment, power consumption of the display device of one embodiment of the present invention can be reduced.

When the pixel 100 or the pixel 300 described in this embodiment is included in the liquid crystal display device having a multi-domain structure, the parasitic capacitance generated between the scan line and the signal line, that is, between the scan line serving as the gate electrode of the transistor and the signal line serving as one of the source electrode and the drain electrode of the transistor, can be reduced. In addition, when the pixel 300 described in this embodiment is included in the liquid crystal display device having a multi-domain structure, the parasitic capacitance generated between the signal line and the capacitor wiring can be reduced. Thus, display quality can be improved in, in particular, a large-sized liquid crystal display device, a liquid crystal display device capable of high-speed operation, and a liquid crystal display device with high resolution. In addition, power consumption of the liquid crystal display device can be reduced.

Note that the structure where one pixel is provided with two transistors is shown in this embodiment; however, one embodiment of the present invention is not limited thereto. One pixel may be provided with three or more transistors and a plurality of pixel electrodes connected to the transistors.

The structure described in this embodiment can be used in appropriate combination with the structure described in other embodiments.

Embodiment 2

In this embodiment, a semiconductor device that is one embodiment of the present invention and a method for manufacturing the semiconductor device will be described with reference to FIG. 10 to FIG. 18.

<Structure Example 1 of Semiconductor Device>

Figure 13A:
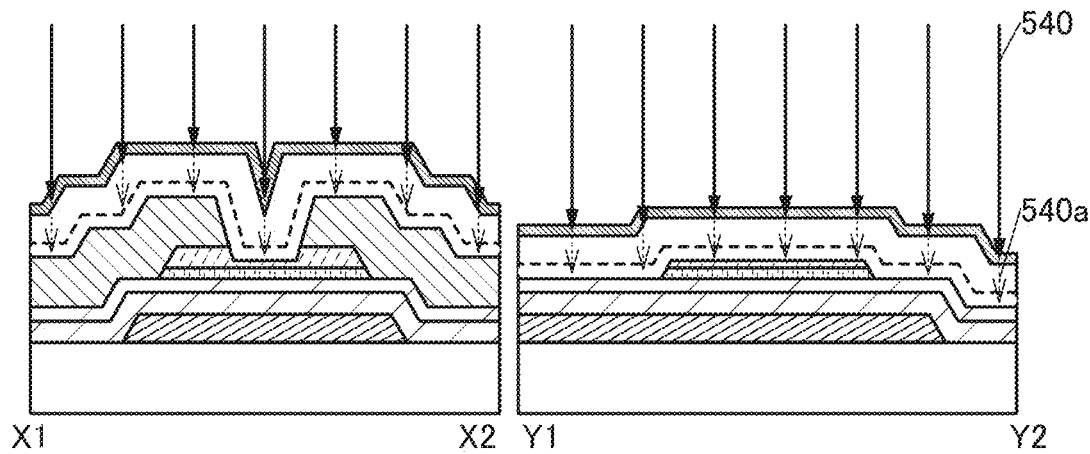
FIGS. 13A-13B Cross-sectional views showing an example of a manufacturing process of a semiconductor device.
Figure 13B:
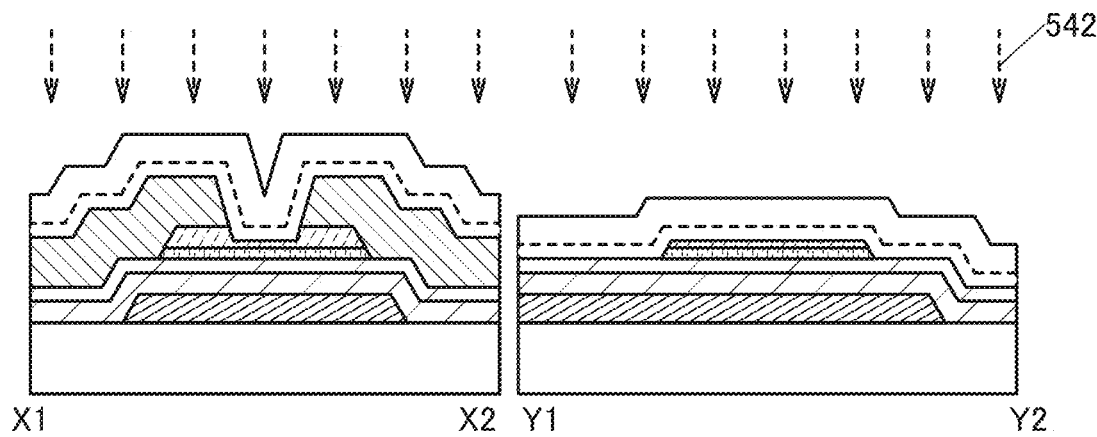
Figure 14A:
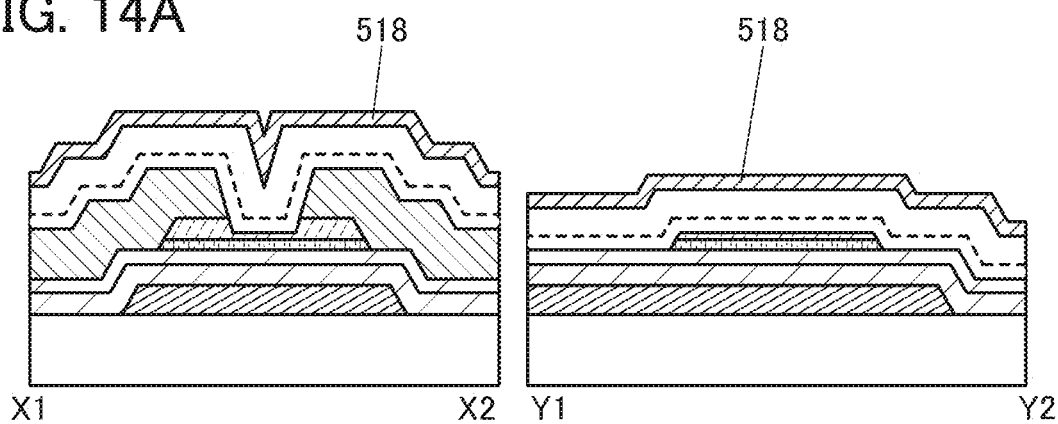
FIGS. 14A-14C Cross-sectional views showing an example of a manufacturing process of a semiconductor device, and a top view and cross-sectional views showing one embodiment of a semiconductor device.
Figure 14B:
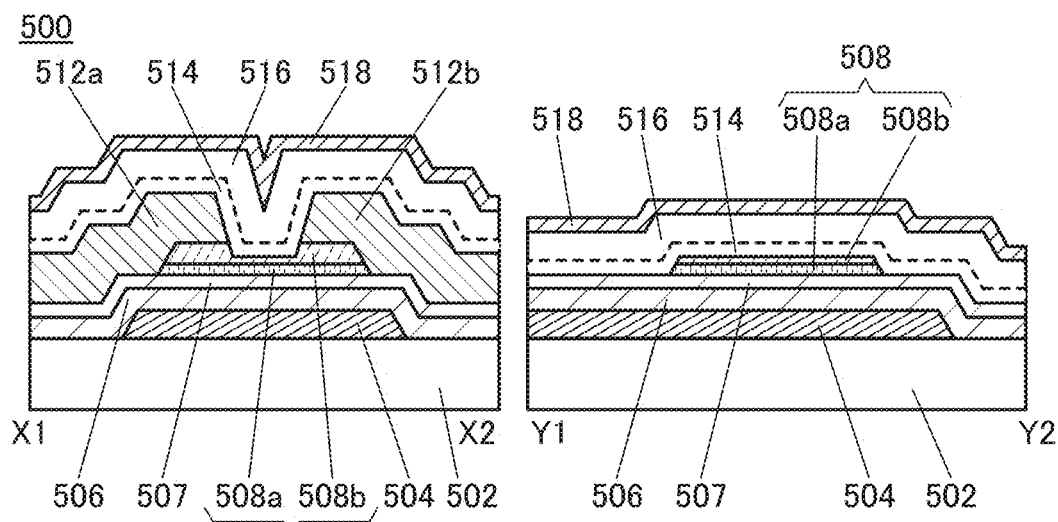
Figure 14C:
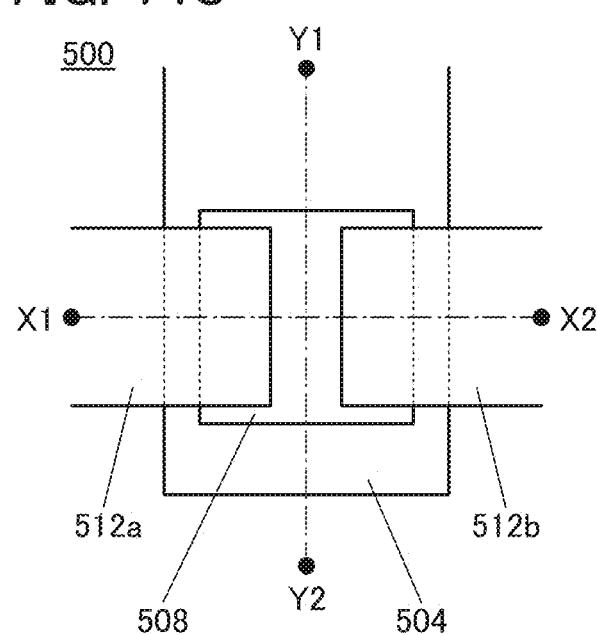

FIG. 14(C) is a top view of a transistor 500 that is a semiconductor device of one embodiment of the present invention. FIG. 14(B) corresponds to a cross-sectional view of a section plane taken along dashed-dotted line X1-X2 and a cross-sectional view of a section plane taken along dashed-dotted line Y1-Y2 in FIG. 14(C). Note that FIG. 10(A) to FIG. 14(A) are cross-sectional views illustrating a manufacturing process of the transistor 500 in FIG. 14(B).

Note that in FIG. 14(C), some components of the transistor 500 (e.g., an insulating film functioning as a gate insulating film) are not illustrated to avoid complexity. The direction of dashed-dotted line X1-X2 may be called a channel length direction, and the direction of dashed-dotted line Y1-Y2 may be called a channel width direction. As in FIG. 14(C), some components are not illustrated in some cases in top views of transistors in drawings described below.

The transistor 500 includes the conductive film 504 functioning as the gate electrode over the substrate 502, the insulating film 506 over the substrate 502 and the conductive film 504, the insulating film 507 over the insulating film 506, an oxide semiconductor film 508 over the insulating film 507, the conductive film 512a functioning as a source electrode electricallyS connected to the oxide semiconductor film 508, and the conductive film 512b functioning as a drain electrode electrically connected to the oxide semiconductor film 508. Over the transistor 500, specifically, over the conductive films 512a and 512b and the oxide semiconductor film 508, the insulating films 514 and 516 and the insulating film 518 are provided. The insulating films 514, 516, and 518 function as protective insulating films for the transistor 500. The insulating film 514 and the insulating film 516 are referred to as a first protective insulating film and a second protective insulating film, respectively, in some cases.

The oxide semiconductor film 508 includes the first oxide semiconductor film 508a on the conductive film 504 side and the second oxide semiconductor film 508b over the first oxide semiconductor film 508a. Furthermore, the insulating film 506 and the insulating film 507 function as gate insulating films of the transistor 500.

For the oxide semiconductor film 508, an In-M (M is aluminum, gallium, yttrium, or tin) oxide or an In-M-Zn oxide can be used. It is particularly preferable to use an In-M-Zn oxide for the oxide semiconductor film 508.

In addition, the first oxide semiconductor film 508a preferably contains an oxide with a composition in which an atomic proportion of In is higher than an atomic proportion of M by a larger difference than in the composition of an oxide contained in the second oxide semiconductor film 508b.

When the first oxide semiconductor film 508a has a composition in which the atomic proportion of In is higher than that of M, the field-effect mobility (also simply referred to as mobility or µFE) of the transistor 500 can be improved. Specifically, the field-effect mobility of the transistor 500 can be higher than 10 cm$^2$/Vs, and preferably, the field-effect mobility of the transistor 500 can be higher than 30 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

Note that when the first oxide semiconductor film 508a has a composition in which the atomic proportion of In is higher than that of M, the electrical characteristics of the transistor 500 are easily changed by light irradiation. However, in the semiconductor device of one embodiment of the present invention, the second oxide semiconductor film 508b is formed over the first oxide semiconductor film 508a. The atomic proportion of In in the second oxide semiconductor film 508b is lower than that in the first oxide semiconductor film 508a, and thus the second oxide semiconductor film 508b has a larger band gap $E_g$ than the first oxide semiconductor film 508a. For this reason, the oxide semiconductor film 508 which is a layered structure of the first oxide semiconductor film 508a and the second oxide semiconductor film 508b has high resistance to a negative bias stress test with light irradiation.

In light irradiation, the amount of light absorbed by the oxide semiconductor film 508 having the above layered structure can be reduced. As a result, a change in the electrical characteristics of the transistor 500 due to light irradiation can be reduced.

When oxygen vacancy is formed in the oxide semiconductor film 508 included in the transistor 500, electrons serving as carriers are generated; as a result, the transistor 500 tends to be normally on. Note that a normally-on transistor refers to a transistor in which current (e.g., current between a drain and a source ($I_{ds}$)) flows at a gate voltage $V_g$=0 V. Therefore, for stable transistor characteristics, it is important to reduce oxygen vacancy in the oxide semiconductor film 508, particularly oxygen vacancy in the first oxide semiconductor film 508a. In the structure of the transistor of one embodiment of the present invention, excess oxygen is introduced into an insulating film over the oxide semiconductor film 508, here, the insulating film 514 and/or the insulating film 516 over the oxide semiconductor film 508, whereby oxygen is moved from the insulating film 514 and/or the insulating film 516 to the oxide semiconductor film 508 to fill oxygen vacancy in the oxide semiconductor film 508, particularly in the first oxide semiconductor film 508a. Alternatively, excess oxygen is introduced into the insulating film 516 in the formation of a first barrier film 531 to be formed over the insulating film 516, and oxygen is moved from the insulating film 516 to the oxide semiconductor film 508 to fill oxygen vacancy in the oxide semiconductor film 508, particularly in the first oxide semiconductor film 508a.

It is preferable that the insulating films 514 and 516 each include a region (oxygen-excess region) including oxygen in excess of that in the stoichiometric composition. In other words, the insulating films 514 and 516 are insulating films capable of releasing oxygen. Note that the oxygen-excess region is formed in the insulating films 514 and 516 in such a manner that oxygen is introduced into the insulating films 514 and 516 after the deposition, for example. As a method for introducing oxygen, an ion implantation method, an ion doping method, a plasma immersion ion implantation method, plasma treatment, or the like may be employed.

In order to fill oxygen vacancy in the first oxide semiconductor film 508a, a channel region in the second oxide semiconductor film 508b and its vicinity preferably have a small thickness. For example, the thickness of the channel region in the second oxide semiconductor film 508b and its vicinity is preferably greater than or equal to 1 nm and less than or equal to 20 nm, further preferably greater than or equal to 3 nm and less than or equal to 10 nm.

Furthermore, in order to fill oxygen vacancy in the first oxide semiconductor film 508a, the second oxide semiconductor film 508b preferably has high oxygen permeability. When the second oxide semiconductor film 508b has high oxygen permeability, excess oxygen in the insulating films 514 and 516 can be favorably transmitted through the first oxide semiconductor film 508a.

As described above, in a semiconductor device of one embodiment of the present invention, an oxide semiconductor film has a layered structure and an insulating film in contact with the oxide semiconductor film contains excess oxygen; thus, the reliability of the semiconductor device can be high. Furthermore, in one embodiment of the present invention, the temperature in the manufacturing process of the semiconductor device can be low (typically, lower than 400° C. or lower than 375° C. (preferably, higher than or equal to 340° C. and lower than or equal to 360° C.)). Note that the manufacturing process of the semiconductor device will be described later.

Other components of the semiconductor device of this embodiment will be described below in detail.

<Substrate>

There is no particular limitation on a material and the like of the substrate 502 as long as the material has heat resistance high enough to withstand at least heat treatment performed later. For example, a glass substrate, a ceramic substrate, a quartz substrate, a sapphire substrate, or the like may be used as the substrate 502. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 502. Still alternatively, any of these substrates provided with a semiconductor element may be used as the substrate 502. In the case where a glass substrate is used as the substrate 502, a glass substrate having any of the following sizes can be used: the 6th generation, the 7th generation, the 8th generation, the 9th generation, and the 10th generation. Thus, a large-sized display device can be manufactured. Such a large-sized substrate is preferably used because manufacturing cost can be reduced.

Alternatively, a flexible substrate may be used as the substrate 502, and the transistor 500 may be provided directly on the flexible substrate. Alternatively, a separation layer may be provided between the substrate 502 and the transistor 500. The separation layer can be used when part or the whole of a semiconductor device formed over the separation layer is separated from the substrate 502 and transferred onto another substrate. In such a case, the transistor 500 can be transferred to a substrate having low heat resistance or a flexible substrate as well.

<Conductive Films Functioning as Gate Electrode and Source and Drain Electrodes>

The conductive film 504 functioning as the gate electrode, the conductive film 512a functioning as the source electrode, and the conductive film 512b functioning as the drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 504, 512a, and 512b may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 504, 512a, and 512b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 504, 512a, and 512b. The use of a Cu—X alloy film enables the manufacturing cost to be reduced because wet etching process can be used in the processing.

<Insulating Films Functioning as Gate Insulating Films>

As each of the insulating film 506 and the insulating film 507 functioning as gate insulating films of the transistor 500, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a layered structure of the insulating film 506 and the insulating film 507, an insulating film of a single layer formed using a material selected from the above or an insulating film of three or more layers may be used.

The insulating film 506 functions as a blocking film which inhibits penetration of oxygen. For example, in the case where excess oxygen is supplied to the insulating film 507, the insulating film 114, the insulating film 516, and/or the oxide semiconductor film 508, the insulating film 506 can inhibit penetration of oxygen.

Note that the insulating film 507 that is in contact with the oxide semiconductor film 508 functioning as a channel region of the transistor 500 is preferably an oxide insulating film and preferably includes a region including oxygen in excess of that in the stoichiometric composition (oxygen-excess region). In other words, the insulating film 507 is an insulating film which is capable of releasing oxygen. In order to provide the oxygen-excess region in the insulating film 507, the insulating film 507 is formed in an oxygen atmosphere, for example. Alternatively, the oxygen-excess region may be formed by introduction of oxygen into the insulating film 507 after the deposition. As a method for introducing oxygen, an ion implantation method, an ion doping method, a plasma immersion ion implantation method, plasma treatment, or the like may be employed.

In the case where hafnium oxide is used for the insulating film 507, the following effect is attained. Hafnium oxide has a higher dielectric constant than silicon oxide and silicon oxynitride. Therefore, the insulating film 507 using hafnium oxide can have a larger thickness than the insulating film 507 using silicon oxide or silicon oxynitride; thus, leakage current due to tunnel current can be low. That is, it is possible to provide a transistor with a low off-state current. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 506, and a silicon oxide film is formed as the insulating film 507. A silicon nitride film has a higher dielectric constant than a silicon oxide film and needs a larger thickness for capacitance equivalent to that of a silicon oxide film. Thus, when a silicon nitride film is used as the gate insulating film of the transistor 500, the physical thickness of the insulating film can be increased. This makes it possible to reduce a decrease in the withstand voltage of the transistor 500 and furthermore to increase the withstand voltage, thereby reducing electrostatic discharge damage to the transistor 500.

<Oxide Semiconductor Film>

The oxide semiconductor film 508 can be formed using any of the materials described above. In the case where the oxide semiconductor film 508 includes an In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, InM:Zn=1:1:1.2, In:M:Zn=2:1:3, In:M:Zn=3:1:2, and In:M:Zn=4:2:4.1 are preferable. In the case where the oxide semiconductor film 508 includes an In-M-Zn oxide, it is preferable to use a target including a polycrystalline In-M-Zn oxide as the sputtering target. With the use of the target including a polycrystalline In-M-Zn oxide, the oxide semiconductor film 508 having crystallinity can be easily formed. Note that the atomic ratio of metal elements of the deposited oxide semiconductor film 508 varies from the above atomic ratio of metal elements of the sputtering target within a range of ±40% as an error. For example, when a sputtering target with an atomic ratio of In:Ga:Zn=4:2:4.1 is used, the atomic ratio of In to Ga and Zn in the oxide semiconductor film 508 may be approximately 4:2:3.

The first oxide semiconductor film 508a can be formed using the sputtering target having an atomic ratio of In:M:Zn=2:1:3, In:M:Zn=3:1:2, In:M:Zn=4:2:4.1, or the like. It is preferable that the first oxide semiconductor film 508a have an atomic ratio of In:M:Zn=4:$\alpha1(1.5 \leq \alpha1 \leq 2.5)$:$\alpha2$ $(2.5 \leq \alpha2 \leq 3.5)$.

The second oxide semiconductor film 508b can be formed using the sputtering target having an atomic ratio of In:M:Zn=1:1:1, InM:Zn=1:1:1.2, or the like. It is preferable that the second oxide semiconductor film 508b have an atomic ratio of InM:Zn=1: β1(0.8≤β1≤1.2): β2(0.8≤β2≤1.2). Note that the atomic ratio of metal elements in the sputtering target used for forming the second oxide semiconductor film 508b does not necessarily satisfy In ≥M and Zn≥M, and may satisfy In<M and/or Zn<M For example, the sputtering target can have an atomic ratio of In:M:Zn=1:3:2, In:M:Zn=1:3:4, or In:M:Zn=1:3:6.

The energy gap of the oxide semiconductor film 508 is 2 eV or more, preferably 2.5 eV or more, further preferably 3 eV or more. With the use of an oxide semiconductor having such a wide energy gap, the off-state current of the transistor 500 can be reduced. In particular, an oxide semiconductor film having an energy gap more than or equal to 2.0 eV, preferably more than or equal to 2.0 eV and less than or equal to 3.0 eV is preferably used as the first oxide semiconductor film 508a, and an oxide semiconductor film having an energy gap more than or equal to 2.5 eV and less than or equal to 3.5 eV is preferably used as the second oxide semiconductor film 508b. Furthermore, the energy gap of the second oxide semiconductor film 508b is preferably larger than that of the first oxide semiconductor film 508a.

The thickness of each of the first oxide semiconductor film 508a and the second oxide semiconductor film 508b is greater than or equal to 3 nm and less than or equal to 200 nm, preferably greater than or equal to 3 nm and less than or equal to 100 nm, further preferably greater than or equal to 3 nm and less than or equal to 50 nm.

An oxide semiconductor film with a low carrier density is used as the first oxide semiconductor film 508a. For example, the carrier density of the first oxide semiconductor film 508a is lower than $8\times10^{11}/cm^3$, preferably lower than $1\times10^{11}/cm^3$, further preferably lower than $1\times10^{10}/cm^3$, and is $1\times10^{-9}/cm^3$ or higher. An oxide semiconductor film with a low carrier density is used as the second oxide semiconductor film 508b. For example, the carrier density of the second oxide semiconductor film 508b is $1\times10^{17}/cm^3$ or lower, preferably $1\times10^{15}/cm^3$ or lower, further preferably $1\times10^{13}/cm^3$ or lower, still further preferably $1\times10^{11}/cm^3$ or lower.

Note that the composition is not limited to the above, and it is possible to use an oxide semiconductor film with an appropriate composition depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of each of the first oxide semiconductor film 508a and the second oxide semiconductor film 508b be set to be appropriate values.

Note that it is preferable to use, as each of the first oxide semiconductor film 508a and the second oxide semiconductor film 508b, an oxide semiconductor film in which the impurity concentration is low and the density of defect states is low, in which case the transistor can have more excellent electrical characteristics. Here, the state in which the impurity concentration is low and the density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, a highly purified intrinsic or substantially highly purified intrinsic oxide semiconductor film has an extremely low off-state current. The off-state current of an element having a channel width of $1\times10^6$ μm and a channel length L of 10 μm can be less than or equal to the measurement limit of a semiconductor parameter analyzer, i.e., less than or equal to $1\times10^{-13}$ A at a voltage between a source electrode and a drain electrode (drain voltage) of 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of impurities are hydrogen, nitrogen, alkali metal, and alkaline earth metal.

Hydrogen contained in the oxide semiconductor film reacts with oxygen bonded to a metal atom to form water, and also causes oxygen vacancies in a lattice from which oxygen is released (or a portion from which oxygen is released). Due to entry of hydrogen into the oxygen vacancies, electrons serving as carriers are generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 508. Specifically, the hydrogen concentration in the oxide semiconductor film 508, which is measured by SIMS, is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$, yet further preferably lower than or equal to $1\times10^{18}$ atoms/$cm^3$, even further preferably lower than or equal to $5\times10^{17}$ atoms/$cm^3$, or further preferably lower than or equal to $1\times10^{16}$ atoms/$cm^3$.

The first oxide semiconductor film 508a preferably includes a region having lower hydrogen concentration than the second oxide semiconductor film 508b. When the first oxide semiconductor film 508a includes the region having lower hydrogen concentration than the second oxide semiconductor film 508b, the semiconductor device can be highly reliable.

When silicon or carbon that is one of elements belonging to Group 14 is contained in the first oxide semiconductor film 508a, oxygen vacancies are increased in the first oxide semiconductor film 508a, and the first oxide semiconductor film 508a becomes an n-type film. Thus, the concentration of silicon or carbon in the first oxide semiconductor film 508a or the concentration of silicon or carbon in the vicinity of an interface with the first oxide semiconductor film 508a (the concentration is measured by SIMS) is set to be lower than or equal to $2\times10^{18}$ atoms/$cm^3$, preferably lower than or equal to $2\times10^{17}$ atoms/$cm^3$.

In addition, the concentration of alkali metal or alkaline earth metal in the first oxide semiconductor film 508a, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the first oxide semiconductor film 508a.

Furthermore, when including nitrogen, the first oxide semiconductor film 508a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible. For example, the concentration of nitrogen which is measured by SIMS is preferably set to be lower than or equal to $5 \times 10^{18}$ atoms/cm$^3$.

Each of the first oxide semiconductor film 508a and the second oxide semiconductor film 508b may have a non-single-crystal structure, for example. The non-single-crystal structure includes a CAAC-OS (C Axis Aligned Crystalline Oxide Semiconductor) which is described later, a polycrystalline structure, a microcrystalline structure, or an amorphous structure, for example. Among the non-single-crystal structures, the amorphous structure has the highest density of defect states, whereas the CAAC-OS has the lowest density of defect states.

Here, a band structure including the oxide semiconductor film 508 and the insulating films in contact with the oxide semiconductor film 508 is described with reference to FIG. 18.

Figure 18:
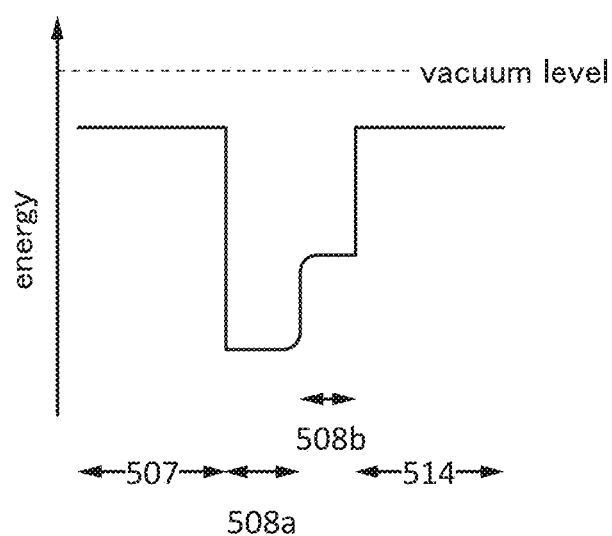
FIG. 18 A view illustrating a band structure.

FIG. 18 shows an example of a band structure in the thickness direction of a stack including the insulating film 507, the first oxide semiconductor film 508a, the second oxide semiconductor film 508b, and the insulating film 514. For easy understanding, energy level of the conduction band minimum ($E_c$) of each of the insulating film 507, the first oxide semiconductor film 508a, the second oxide semiconductor film 508b, and the insulating film 514 is shown in the band structure.

In the band structure of FIG. 18, a silicon oxide film is used as each of the insulating films 507 and 514, an oxide semiconductor film formed using a metal oxide target having an atomic ratio of metal elements of In:Ga:Zn=4:2:4.1 is used as the first oxide semiconductor film 508a, and a metal oxide film formed using a metal oxide target having an atomic ratio of metal elements of In:Ga:Zn=1:1:1.2 is used as the second oxide semiconductor film 508b.

As illustrated in FIG. 18, the energy level of the conduction band minimum gradually varies between the first oxide semiconductor film 508a and the second oxide semiconductor film 508b. In other words, the energy level of the conduction band minimum is continuously varied or continuously connected. To obtain such a band structure, there exists no impurity, which forms a defect state such as a trap center or a recombination center, at the interface between the first oxide semiconductor film 508a and the second oxide semiconductor film 508b.

To form a continuous junction between the first oxide semiconductor film 508a and the second oxide semiconductor film 508b, the films are formed successively without exposure to the air by using a multi-chamber deposition apparatus (sputtering apparatus) provided with a load lock chamber.

With the band structure of FIG. 18, the first oxide semiconductor film 508a serves as a well, and a channel region is formed in the first oxide semiconductor film 508a in the transistor with the layered structure.

In the case where the second oxide semiconductor film 508b is not provided, trap states might be formed in the first oxide semiconductor film 508a. However, in the above layered structure, the trap states can be formed in the second oxide semiconductor film 508b. Thus, the trap states can be distanced away from the first oxide semiconductor film 508a.

In addition, the trap states might be more distant from the vacuum level than the energy level of the conduction band minimum ($E_c$) of the first oxide semiconductor film 508a functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum ($E_c$) of the first oxide semiconductor film 508a. Such a structure inhibits accumulation of electrons in the trap states. As a result, the on-state current and the field-effect mobility of the transistor can be increased.

In FIG. 18, the energy level of the conduction band minimum of the second oxide semiconductor film 508b is closer to the vacuum level than that of the first oxide semiconductor film 508a. Typically, a difference in energy level between the conduction band minimum of the first oxide semiconductor film 508a and the conduction band minimum of the second oxide semiconductor film 508b is 0.15 eV or more or 0.5 eV or more and 2 eV or less or 1 eV or less. That is, the difference between the electron affinity of the second oxide semiconductor film 508b and the electron affinity of the first oxide semiconductor film 508a is 0.15 eV or more or 0.5 eV or more and 2 eV or less or 1 eV or less.

In such a structure, the first oxide semiconductor film 508a serves as a main path of current and functions as a channel region. In addition, since the second oxide semiconductor film 508b includes one or more metal elements included in the first oxide semiconductor film 508a in which a channel region is formed, interface scattering is less likely to occur at the interface between the first oxide semiconductor film 508a and the second oxide semiconductor film 508b. Thus, the transistor can have high field-effect mobility because the movement of carriers is not hindered at the interface.

To prevent the second oxide semiconductor film 508b from functioning as part of a channel region, a material having sufficiently low conductivity is used for the second oxide semiconductor film 508b. Alternatively, a material which has a smaller electron affinity (a difference in energy level between the vacuum level and the conduction band minimum) than the first oxide semiconductor film 508a and has a difference in energy level in the conduction band minimum from the first oxide semiconductor film 508a (band offset) is used for the second oxide semiconductor film 508b. Furthermore, to inhibit generation of a difference between threshold voltages due to the value of the drain voltage, it is preferable to form the second oxide semiconductor film 508b using a material whose energy level of the conduction band minimum is closer to the vacuum level than that of the first oxide semiconductor film 508a by 0.2 eV or more, preferably 0.5 eV or more.

It is preferable that the second oxide semiconductor film 508b not have a spinel crystal structure. This is because if the second oxide semiconductor film 508b has a spinel crystal structure, constituent elements of the conductive films 512a and 512b might be diffused into the first oxide semiconductor film 508a at the interface between the spinel crystal structure and another region. Note that the second oxide semiconductor film 508b is preferably a CAAC-OS, which is described later, in which case a higher blocking property against constituent elements of the conductive films 512a and 512b, for example, a copper element, is obtained.

The thickness of the second oxide semiconductor film 508b is large enough to inhibit diffusion of the constituent elements of the conductive films 512a and 512b into the oxide semiconductor film 508b and small enough not to inhibit supply of oxygen from the insulating film 514 to the oxide semiconductor film 508b. For example, when the thickness of the second oxide semiconductor film 508b is greater than or equal to 10 nm, diffusion of the constituent elements of the conductive films 512a and 512b into the first oxide semiconductor film 508a can be inhibited. When the thickness of the second oxide semiconductor film 508b is less than or equal to 100 nm, oxygen can be effectively supplied from the insulating films 514 and 516 to the first oxide semiconductor film 508a.

<Insulating Films Functioning as Protective Insulating Films for Transistor>

The insulating films 514 and 516 each have a function of supplying oxygen to the oxide semiconductor film 508. The insulating film 518 functions as a protective insulating film for the transistor 500. The insulating films 514 and 516 contain oxygen. Furthermore, the insulating film 514 is an insulating film which is permeable to oxygen. Note that the insulating film 514 also functions as a film which relieves damage to the oxide semiconductor film 508 at the time of forming the insulating film 516 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 514.

In addition, it is preferable that the number of defects in the insulating film 514 be small and typically, the spin density corresponding to a signal that appears at g=2.001 due to a dangling bond of silicon be lower than or equal to $3 \times 10^{17}$ spins/cm$^3$ by ESR measurement. This is because if the density of defects in the insulating film 514 is high, oxygen is bonded to the defects and the amount of oxygen that passes through the insulating film 514 is decreased.

Note that in the insulating film 514, all oxygen entering the insulating film 514 from the outside does not move to the outside of the insulating film 514 and some oxygen remains in the insulating film 514. Furthermore, movement of oxygen occurs in the insulating film 514 in some cases in such a manner that oxygen enters the insulating film 514 and oxygen included in the insulating film 514 is moved to the outside of the insulating film 514. When an oxide insulating film which can transmit oxygen is formed as the insulating film 514, oxygen released from the insulating film 516 provided over the insulating film 514 can be moved to the oxide semiconductor film 508 through the insulating film 514.

The insulating film 514 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film in which the density of states due to nitrogen oxide between $E_{v\_os}$ and $E_{c\_os}$ is low.

Note that a silicon oxynitride film that releases less nitrogen oxide is a film which releases more ammonia than the nitrogen oxide in thermal desorption spectroscopy analysis; the number of ammonia molecules released from the silicon oxynitride film is typically greater than or equal to $1 \times 10^{18}$ molecules/cm$^3$ and less than or equal to $5 \times 10^{19}$ molecules/cm$^3$. Note that the number of ammonia molecules released from a film is the number of ammonia molecules released by heat treatment with which the surface temperature of the film becomes higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 514, for example. The level is positioned in the energy gap of the oxide semiconductor film 508. Therefore, when nitrogen oxide is diffused to the interface between the insulating film 514 and the oxide semiconductor film 508, an electron is in some cases trapped by the level on the insulating film 514 side. As a result, the trapped electron remains in the vicinity of the interface between the insulating film 514 and the oxide semiconductor film 508; thus, the threshold voltage of the transistor is shifted in the positive direction.

Nitrogen oxide reacts with ammonia and oxygen in heat treatment. Since nitrogen oxide included in the insulating film 514 reacts with ammonia included in the insulating film 516 in heat treatment, nitrogen oxide included in the insulating film 514 is reduced. Therefore, an electron is hardly trapped at the interface between the insulating film 514 and the oxide semiconductor film 508.

When the oxide insulating film in which the density of states due to nitrogen oxide between $E_{v\_os}$ and $E_{c\_os}$ is low is used for the insulating film 514, a shift in the threshold voltage of the transistor can be reduced, which leads to reduced fluctuations in the electrical characteristics of the transistor.

Note that in an ESR spectrum at 100 K or lower of the insulating film 514, by heat treatment of a manufacturing process of the transistor, typically heat treatment at a temperature lower than 400° C. or lower than 375° C. (preferably, higher than or equal to 340° C. and lower than or equal to 360° C.), a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The nitrogen concentration in the oxide insulating film in which the density of states due to nitrogen oxide between $E_{v\_os}$ and $E_{c\_os}$ is low, which is measured by SIMS, is lower than or equal to $6 \times 10^{20}$ atoms/cm$^3$.

The oxide insulating film in which the density of states due to nitrogen oxide between $E_{v\_os}$ and $E_{c\_os}$ is low is formed by a PECVD method at a substrate temperature higher than or equal to 220° C. and lower than or equal to 350° C. using silane and dinitrogen monoxide, whereby a dense and hard film can be formed.

The insulating film 516 is formed using an oxide insulating film that contains oxygen in excess of that in the stoichiometric composition. Part of oxygen is released by heating from the oxide insulating film containing oxygen in excess of that in the stoichiometric composition. The oxide insulating film containing oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 516.

It is preferable that the number of defects in the insulating film 516 be small, and typically the spin density corresponding to a signal which appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 516 is provided more apart from the oxide semiconductor film 508 than the insulating film 514 is; thus, the insulating film 516 may have higher density of defects than the insulating film 514.

Furthermore, the insulating films 514 and 516 can be formed using insulating films formed of the same kinds of materials; thus, a boundary between the insulating film 514 and the insulating film 516 cannot be clearly observed in some cases. Thus, in this embodiment, the boundary between the insulating film 514 and the insulating film 516 is shown by a dashed line. Although a two-layer structure of the insulating film 514 and the insulating film 516 is described in this embodiment, the present invention is not limited to this structure. For example, a single-layer structure of the insulating film 514 or the insulating film 516 may be employed.

The insulating film 518 has a function of blocking oxygen, hydrogen, water, alkali metal, alkaline earth metal, and the like. It is possible to prevent outward diffusion of oxygen from the oxide semiconductor film 508, outward diffusion of oxygen included in the insulating films 514 and 516, and entry of hydrogen, water, or the like into the oxide semiconductor film 508 from the outside by providing the insulating film 518. A nitride insulating film, for example, can be used as the insulating film 518. The nitride insulating film is formed using silicon nitride, silicon nitride oxide, aluminum nitride, aluminum nitride oxide, or the like. In particular, a silicon nitride oxide film or a silicon nitride film is preferably used as the insulating film 518, in which case outward diffusion of oxygen can be prevented.

Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided as the insulating film 518. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given. As the oxide insulating film having a blocking effect against oxygen, hydrogen, water, and the like, an aluminum oxide film, a hafnium oxide film, or an yttrium oxide film is particularly preferable.

Although the variety of films such as the conductive films, the insulating films, and the oxide semiconductor films which are described above can be formed by a sputtering method or a PECVD method, such films may be formed by another method, e.g., a thermal chemical vapor deposition (CVD) method or an atomic layer deposition (ALD) method. As an example of a thermal CVD method, a metal organic chemical vapor deposition (MOCVD) method can be given.

A thermal CVD method has an advantage that no defect due to plasma damage is generated since it does not utilize plasma for forming a film.

Deposition over a substrate by a thermal CVD method may be performed in such a manner that a source gas and an oxidizer are supplied to a chamber at a time, the pressure inside the chamber is set to an atmospheric pressure or a reduced pressure, and the source gas and the oxidizer react with each other in the vicinity of the substrate or over the substrate.

Deposition by an ALD method may be performed in such a manner that the pressure inside a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced when or after the first gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated a plurality of times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor film, and the metal oxide film in this embodiment can be formed by a thermal CVD method such as an MOCVD method. For example, in the case where an In—Ga—ZnO film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas which is obtained by vaporizing a liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing a liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed with a deposition apparatus using an ALD method, a $WF_6$ gas and a $B_2H_6$ gas are sequentially introduced a plurality of times to form an initial tungsten film, and then a $WF_6$ gas and an $H_2$ gas are sequentially introduced a plurality of times to form a tungsten film. Note that an $SiH_4$ gas may be used instead of a $B_2H_6$ gas.

For example, in the case where an oxide semiconductor film, e.g., an In—Ga—ZnO film is formed with a deposition apparatus using an ALD method, an $In(CH_3)_3$ gas and an $O_3$ gas) are sequentially introduced a plurality of times to form an In-0 layer, then a $Ga(CH_3)_3$ gas and an $O_3$ gas) are sequentially introduced a plurality of times to form a GaO layer, and then a $Zn(CH_3)_2$ gas and an $O_3$ gas) are sequentially introduced a plurality of times to form a ZnO layer. Note that the order of these layers is not limited to this example. A mixed compound layer such as an In—Ga—O layer, an In—Zn—O layer, or a Ga—Zn—O layer may be formed by mixing these gases. Note that although an $H_2O$ gas which is obtained by bubbling with an inert gas such as Ar may be used instead of an $O_3$ gas), it is preferable to use an $O_3$ gas), which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Structural Example 2 of Semiconductor Device>

A structure example different from that of the transistor 500 in FIGS. 14(B) and 14(C) will be described with reference to FIGS. 16(A) and 16(B). Note that in the case where a portion has a function similar to that described above, the same hatch pattern is applied to the portion, and the portion is not especially denoted by a reference numeral in some cases.

Figure 16A:
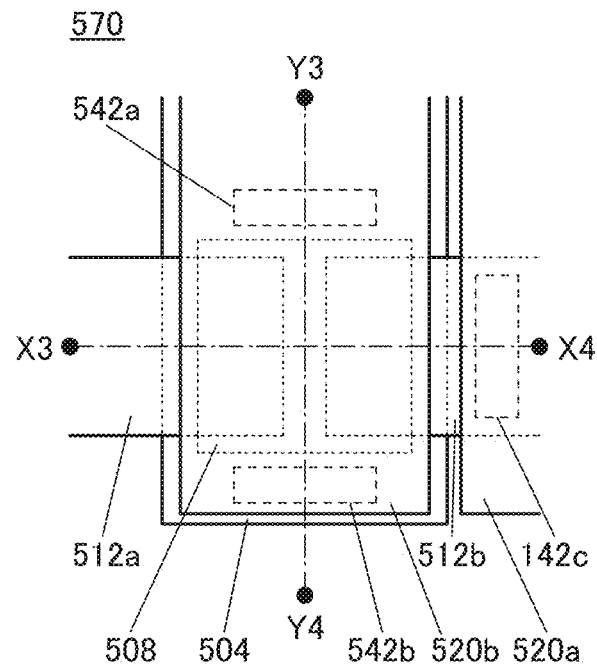
FIGS. 16A-16B A top view and cross-sectional views showing one embodiment of a semiconductor device.

FIG. 16(A) is a top view of a transistor 570 that is a semiconductor device of one embodiment of the present invention. FIG. 16(B) is a cross-sectional view taken along dashed-dotted line X3-X4 in FIG. 16(A), and a cross-sectional view taken along dashed-dotted line Y3-Y4 in FIG. 16(A).

The transistor 570 includes the conductive film 504 functioning as a first gate electrode over the substrate 502, the insulating film 506 over the substrate 502 and the conductive film 504, the insulating film 507 over the insulating film 506, the oxide semiconductor film 508 over the insulating film 507, the insulating film 514 over the oxide semiconductor film 508, the insulating film 516 over the insulating film 514, the conductive film 512*a* functioning as a source electrode electrically connected to the oxide semiconductor film 508, the conductive film 512*b* functioning as a drain electrode electrically connected to the oxide semiconductor film 508, the insulating film 514 over the oxide semiconductor film 508, the insulating film 516 over the insulating film 514, the insulating film 518 over the insulating film 516, a conductive film 520*a* over the insulating film 518, and a conductive film 520*b* over the insulating film 518. The insulating films 514, 516, and 518 function as second gate insulating films of the transistor 570. The conductive film 520*a* is electrically connected to the conductive film 512*b* through an opening 542*c* provided in the insulating films 514, 516, and 518. The conductive film 520*a* in the transistor 570 functions as, for example, a pixel electrode used for a display device. The conductive film 520*b* in the transistor 570 functions as a second gate electrode (also referred to as a back gate electrode).

Figure 16B:
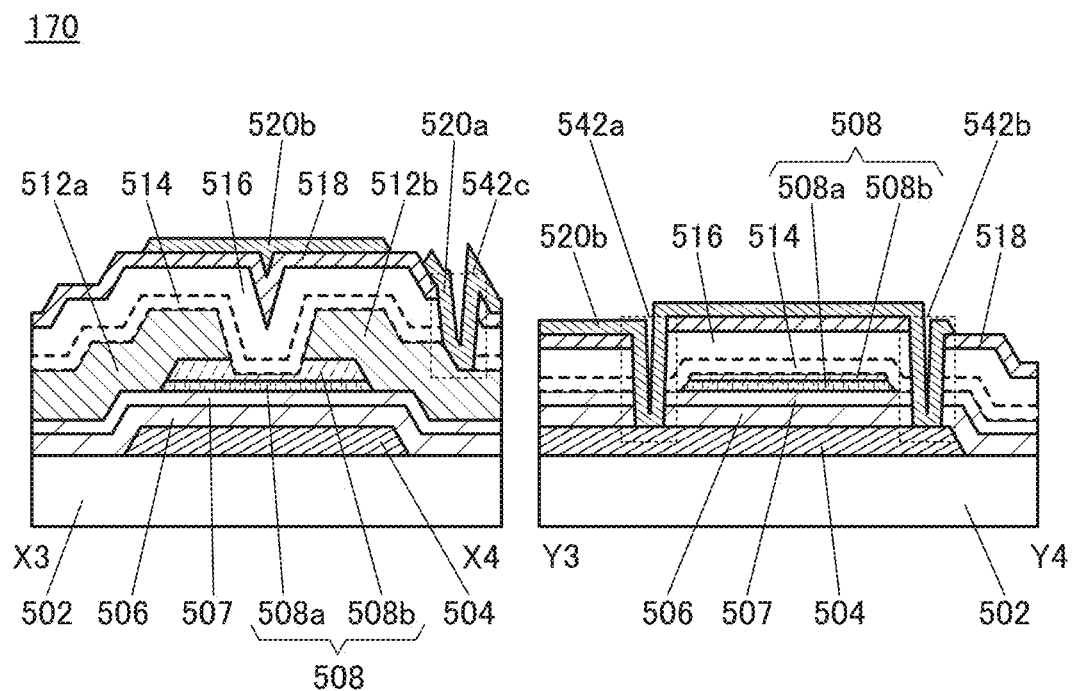

As illustrated in FIG. 16(B), the conductive film 520*b* is connected to the conductive film 504 functioning as a first gate electrode through openings 542*a* and 542*b* provided in the insulating film 506, the insulating film 507, the insulating film 514, the insulating film 516, and the insulating film 518. Accordingly, the conductive film 520*b* and the conductive film 504 are supplied with the same potential.

Note that although the structure in which the openings 542*a* and 542*b* are provided so that the conductive film 520*b* and the conductive film 504 are connected to each other is described in this embodiment, one embodiment of the present invention is not limited thereto. For example, a structure in which only one of the openings 542*a* and 542*b* is provided so that the conductive film 520*b* and the conductive film 504 are connected to each other, or a structure in which the openings 542*a* and 542*b* are not provided and the conductive film 520*b* and the conductive film 504 are not connected to each other may be employed. Note that in the case where the conductive film 520b and the conductive film 504 are not connected to each other, it is possible to apply different potentials to the conductive film 520b and the conductive film 504.

As illustrated in FIG. 16(B), the oxide semiconductor film 508 is positioned to face each of the conductive film 504 functioning as a gate electrode and the conductive film 520b functioning as a second gate electrode, and is sandwiched between the two conductive films functioning as gate electrodes. The lengths in the channel length direction and the channel width direction of the conductive film 520b functioning as a second gate electrode are longer than those in the channel length direction and the channel width direction of the oxide semiconductor film 508. The whole oxide semiconductor film 508 is covered with the conductive film 520b with the insulating films 514, 516, and 518 positioned therebetween. Since the conductive film 520b functioning as a second gate electrode is connected to the conductive film 504 functioning as a gate electrode through the openings 542a and 542b provided in the insulating film 506, the insulating film 507, the insulating film 514, the insulating film 516, and the insulating film 518, a side surface of the oxide semiconductor film 508 in the channel width direction faces the conductive film 520b functioning as a second gate electrode with the insulating film 514, the insulating film 516, and the insulating film 518 positioned therebetween.

In other words, in the channel width direction of the transistor 570, the conductive film 504 functioning as a gate electrode and the conductive film 520b functioning as a second gate electrode are connected to each other through the openings provided in the insulating films 506 and 507 functioning as gate insulating films, and the insulating films 514, 516, and 518 functioning as second gate insulating films; and the conductive film 504 and the conductive film 520b surround the oxide semiconductor film 508 with the insulating films 506 and 507 functioning as gate insulating films, and the insulating films 514, 516, and 518 functioning as second gate insulating films positioned therebetween.

With such a structure, the oxide semiconductor film 508 included in the transistor 570 can be electrically surrounded by electric fields of the conductive film 504 functioning as a gate electrode and the conductive film 520b functioning as a second gate electrode. A device structure of a transistor, like that of the transistor 570, in which electric fields of a gate electrode and a second gate electrode electrically surround an oxide semiconductor film where a channel region is formed can be referred to as a surrounded channel (s-channel) structure.

Since the transistor 570 has the s-channel structure, an electric field for inducing a channel can be effectively applied to the oxide semiconductor film 508 by the conductive film 504 functioning as a gate electrode; therefore, the current drive capability of the transistor 570 can be improved and high on-state current characteristics can be obtained. Since the on-state current can be increased, it is possible to reduce the size of the transistor 570. In addition, since the transistor 570 has a structure in which the oxide semiconductor film 508 is surrounded by the conductive film 504 functioning as a gate electrode and the conductive film 520b functioning as a second gate electrode, the mechanical strength of the transistor 570 can be increased.

Note that the other components of the transistor 570 are the same as those of the transistor 500 described above, and an effect similar to that of the transistor 500 can be obtained.

The structures of the transistors of this embodiment can be freely combined with each other. For example, the transistor 500 illustrated in FIGS. 14(A) and 14(B) can be used as a transistor in a pixel of a display device, and the transistor 570 illustrated in FIGS. 16(A) and 16(B) can be used as a transistor in a gate driver of the display device.

<Method 1 for Manufacturing Semiconductor Device>

Next, a method for manufacturing the transistor 500 that is a semiconductor device of one embodiment of the present invention will be described in detail with reference to FIGS. 10(A), 10(B), and 10(C) to FIG. 14(A). Note that FIGS. 10(A), 10(B), and 10(C) to FIG. 14(A) are cross-sectional views illustrating the method for manufacturing the semiconductor device.

First, a conductive film is formed over the substrate 502 and processed through a lithography process and an etching process, whereby the conductive film 504 functioning as a gate electrode is formed. Then, the insulating films 506 and 507 functioning as gate insulating films are formed over the conductive film 504 (see FIG. 10(A)).

In this embodiment, a glass substrate is used as the substrate 502, and as the conductive film 504 functioning as a gate electrode, a 100-nm-thick tungsten film is formed by a sputtering method. A 400-nm-thick silicon nitride film as the insulating film 506 is formed by a PECVD method and a 50-nm-thick silicon oxynitride film as the insulating film 507 is formed by a PECVD method.

Note that the insulating film 506 can have a layered structure of silicon nitride films. Specifically, the insulating film 506 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of 350° C. or lower.

When the insulating film 506 has the three-layer structure of silicon nitride films, for example, in the case where a conductive film containing copper (Cu) is used as the conductive film 504, the following effect can be obtained.

The first silicon nitride film can inhibit diffusion of a copper (Cu) element from the conductive film 504. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 507 is preferably an insulating film containing oxygen to improve characteristics of an interface with the oxide semiconductor film 508 (specifically, the first oxide semiconductor film 508a) formed later.

Next, over the insulating film 507, an oxide semiconductor film 509 is formed at a first temperature. The oxide semiconductor film 509 is formed in such a manner that a first oxide semiconductor film 509a is formed first and then a second oxide semiconductor film 509b is formed (see FIG. 10(B)).

The first temperature at which the oxide semiconductor film 509 is formed is higher than or equal to room temperature and lower than 340° C., preferably higher than or equal to room temperature and lower than or equal to 300° C., further preferably higher than or equal to 100° C. and lower than or equal to 250° C., and still further preferably higher than or equal to 100° C. and lower than or equal to 200° C. The oxide semiconductor film 509 is formed while heat treatment is performed, so that the crystallinity of the oxide semiconductor film 509 can be improved. In the case where a large-sized glass substrate (for example, any of glass substrates of the 6th generation to the 10th generation) is used as the substrate 502, the substrate 502 is sometimes distorted when the first temperature is higher than or equal to 150° C. and lower than 340° C. However, even in the case where a large-sized glass substrate is used, distortion of the glass substrate can be prevented when the first temperature is higher than or equal to 100° C. and lower than 150° C.

The first oxide semiconductor film 509a and the second oxide semiconductor film 509b are formed at either the same substrate temperature or different substrate temperatures. Preferably, the first oxide semiconductor film 509a and the second oxide semiconductor film 509b are formed at the same substrate temperature because manufacturing cost can be reduced.

In this embodiment, the first oxide semiconductor film 509a is formed by a sputtering method using an In—Ga—Zn metal oxide target (having an atomic ratio of In:Ga:Zn=4:2:4.1), and then the second oxide semiconductor film 509b is successively formed in a vacuum by a sputtering method using an In—Ga—Zn metal oxide target (having an atomic ratio of In:Ga:Zn=1:1:1.2). The first oxide semiconductor film 509a and the second oxide semiconductor film 509b are formed at a substrate temperature of 170° C.

In the case where the oxide semiconductor film 509 is formed by a sputtering method, a rare gas (typically argon), oxygen, or a mixed gas of a rare gas and oxygen is used as a sputtering gas, as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, and still further preferably −120° C. or lower is used, whereby entry of moisture and the like into the oxide semiconductor film 509 can be minimized.

In the case where the oxide semiconductor film 509 is formed by a sputtering method, a chamber in a sputtering apparatus is preferably evacuated to be a high vacuum state (to the degree of approximately $5 \times 10^{-7}$ Pa or higher and $1 \times 10^{-4}$ Pa or lower) with an adsorption vacuum evacuation pump such as a cryopump in order to remove water or the like, which serves as an impurity for the oxide semiconductor film 509, as much as possible. Alternatively, a turbo molecular pump and a cold trap are preferably combined so as to prevent a backflow of a gas, especially a gas containing carbon or hydrogen, from an exhaust system to the inside of the chamber.

Then, the oxide semiconductor film 509 is processed, so that the island-shaped oxide semiconductor film 508 is formed. Note that the first oxide semiconductor film 509a is processed into the island-shaped first oxide semiconductor film 508a, and the second oxide semiconductor film 509b is processed into the island-shaped second oxide semiconductor film 508b (see FIG. 10(C)).

Figure 11A:
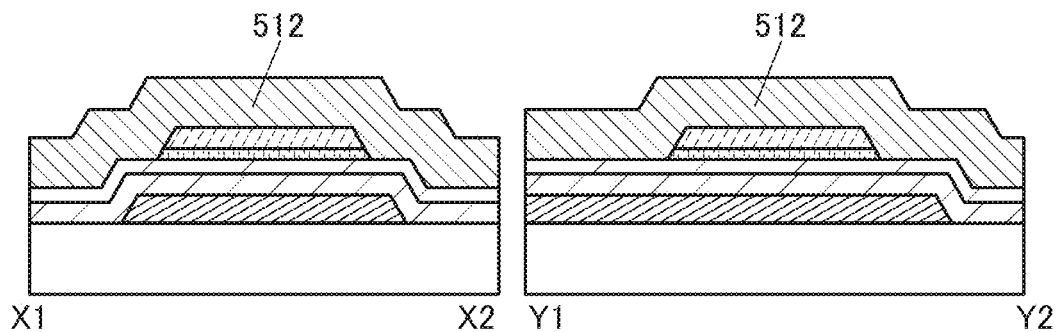
FIGS. 11A-11C Cross-sectional views showing an example of a manufacturing process of a semiconductor device.

After that, heat treatment at a temperature higher than the first temperature is not performed, and a conductive film 512 to be the source electrode and the drain electrode is formed over the insulating film 507 and the oxide semiconductor film 508 by a sputtering method (see FIG. 11(A)).

In this embodiment, as the conductive film 512, a layered film in which a 50-nm-thick tungsten film and a 400-nm-thick aluminum film are sequentially stacked is formed by a sputtering method. Although the conductive film 512 has a two-layer structure in this embodiment, one embodiment of the present invention is not limited thereto. For example, the conductive film 512 may have a three-layer structure in which a 50-nm-thick tungsten film, a 400-nm-thick aluminum film, and a 100-nm-thick titanium film are sequentially stacked.

Figure 11B:
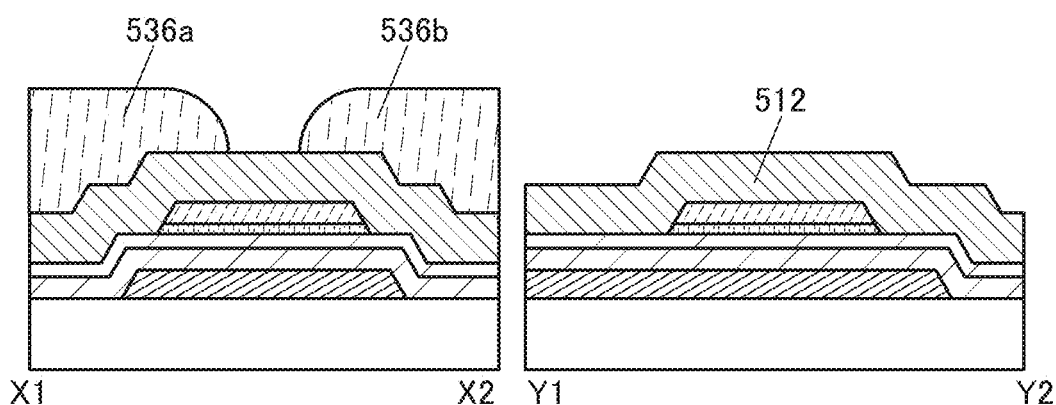

Next, masks 536a and 536b are formed in desired regions over the conductive film 512 (see FIG. 11(B)).

In this embodiment, the masks 536a and 536b are formed in such a manner that a photosensitive resin film is formed over the conductive film 512 and is patterned through a lithography process.

Figure 11C:
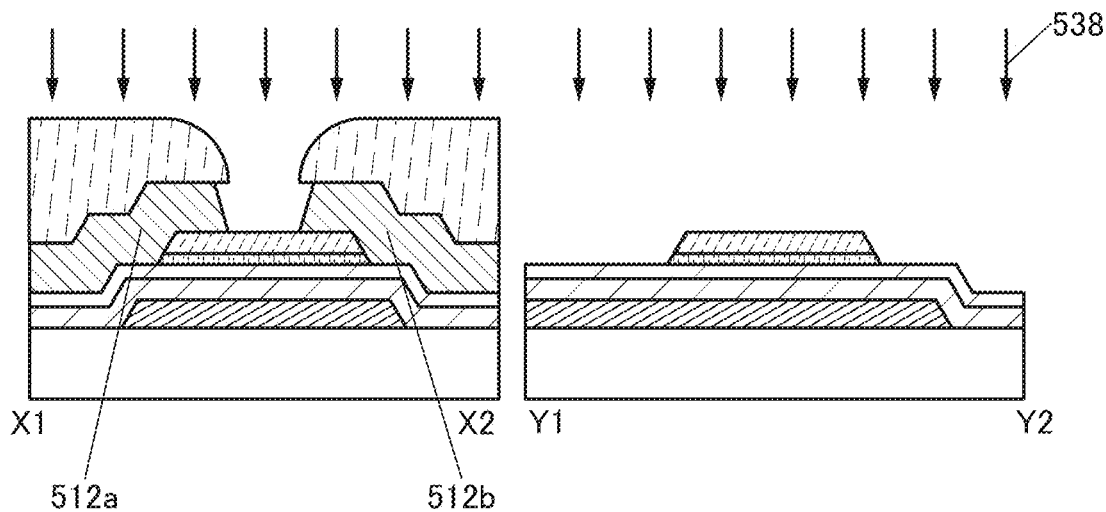

Then, an etchant 538 is applied from above the conductive film 512 and the masks 536a and 536b so that the conductive film 512 is processed, whereby the conductive films 512a and 512b separated from each other are formed (see FIG. 11(C)).

In this embodiment, the conductive film 512 is processed with a dry etching apparatus. Note that a method for forming the conductive film 512 is not limited thereto. For example, the conductive film 512 and the second oxide semiconductor film 508b may be processed using a chemical solution as the etchant 538 with a wet etching apparatus. Note that a finer pattern can be formed when a dry etching apparatus is used for processing the conductive film 512 than when a wet etching apparatus is used. However, when a wet etching apparatus is used for processing the conductive film 512, manufacturing cost can be more reduced than when a dry etching apparatus is used.

Figure 12A:
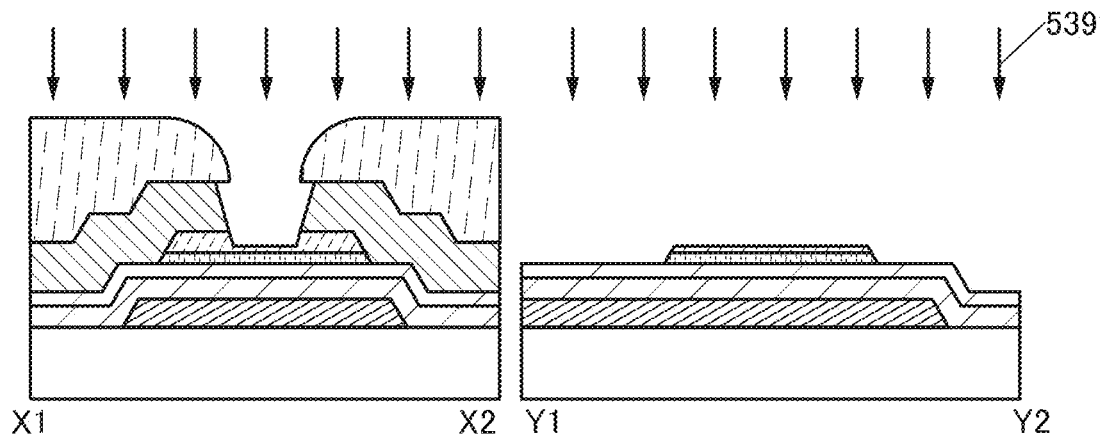
FIGS. 12A-12C Cross-sectional views showing an example of a manufacturing process of a semiconductor device.
Figure 12B:
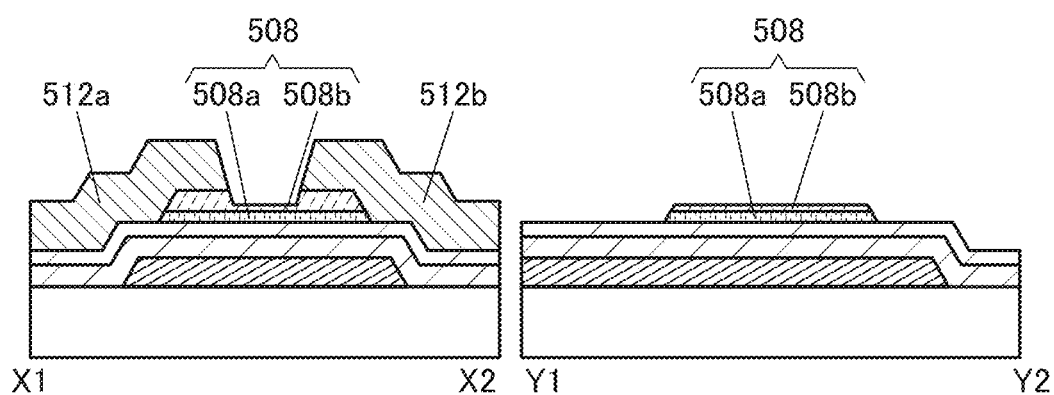

Then, an etchant 539 is applied from above the second oxide semiconductor film 508b, the conductive films 512a and 512b, and the masks 536a and 536b to clean a surface of the second oxide semiconductor film 508b (see FIG. 12(A)).

The cleaning may be performed, for example, using a chemical solution such as phosphoric acid. The cleaning using a chemical solution such as phosphoric acid can remove impurities (e.g., an element included in the conductive films 512a and 512b) attached to the surface of the second oxide semiconductor film 508b. Note that the cleaning is not necessarily performed; in some cases, the cleaning does not need to be performed.

Through the formation and/or the above cleaning step of the conductive films 512a and 512b, a region of the second oxide semiconductor film 508b which is exposed from the conductive film 512*a* or 512*b* sometimes becomes thinner than the first oxide semiconductor film 508*a*.

Figure 15A:
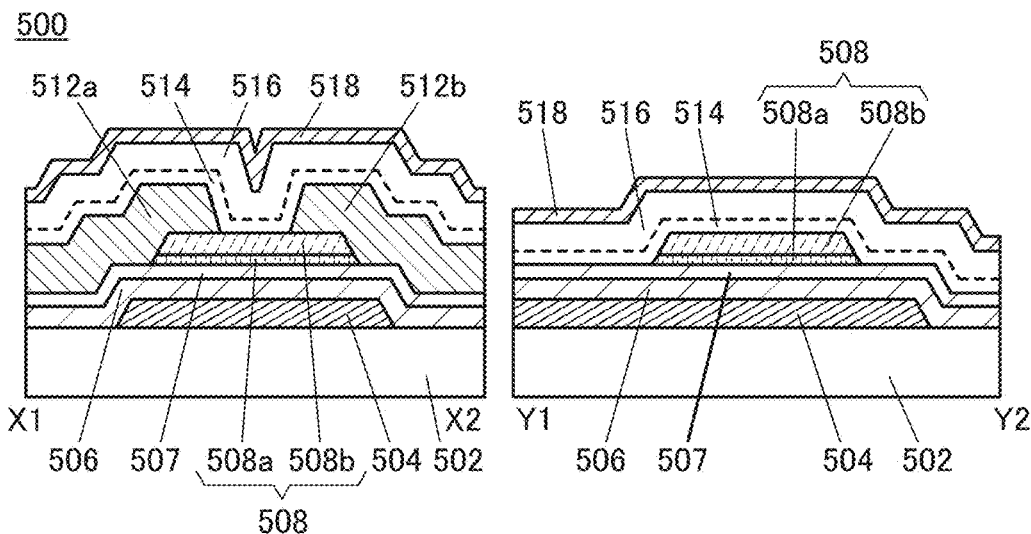
FIGS. 15A-15C Cross-sectional views each showing one embodiment of a semiconductor device.
Figure 15B:
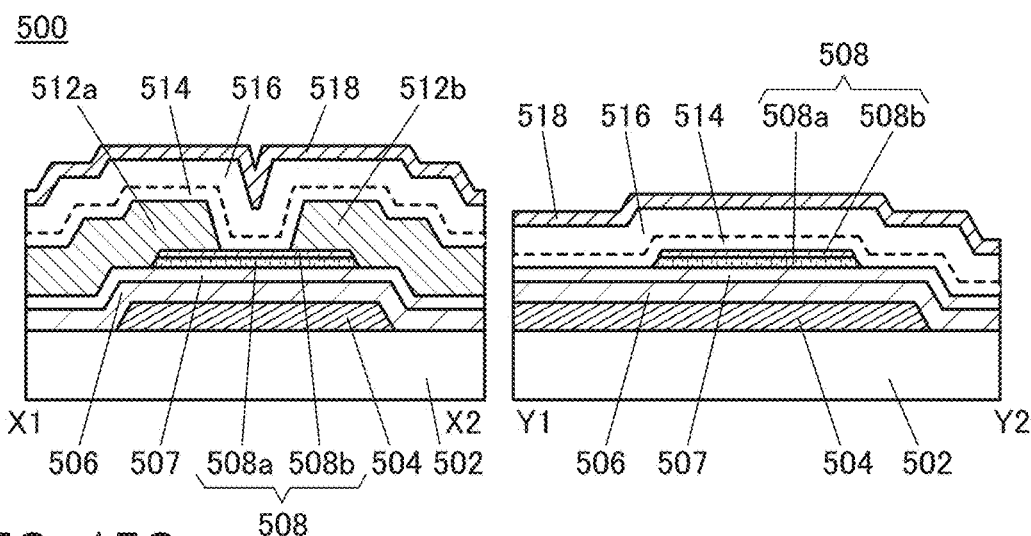
Figure 15C:
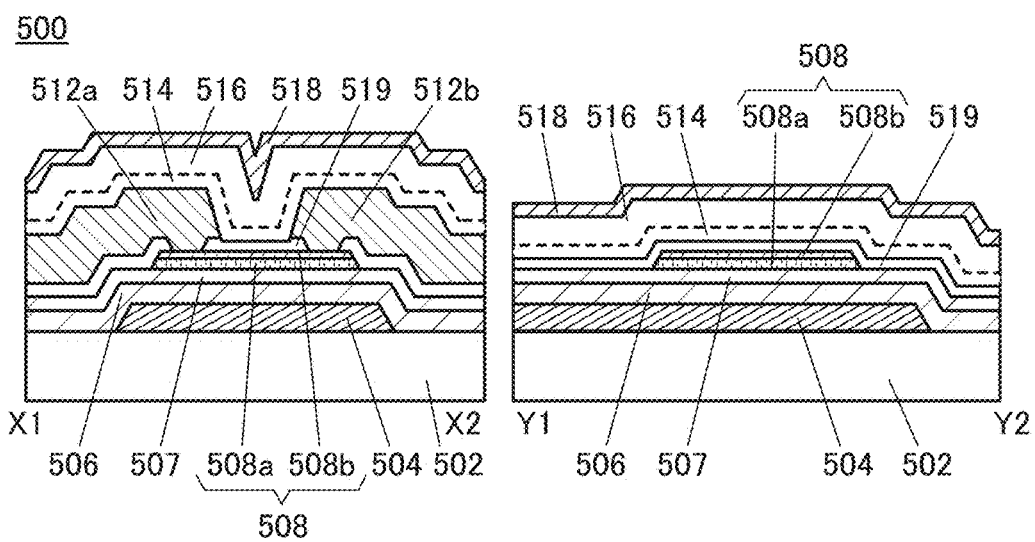

Note that, through the formation of the conductive films 512*a* and 512*b* and/or the above cleaning step, the region of the second oxide semiconductor film 508*b* which is exposed from the conductive films 512*a* and 512*b* sometimes is not thinned in some cases. FIGS. 15(A) and 15(B) illustrate examples of such a case. FIGS. 15(A) and 15(B) are cross-sectional views illustrating examples of a semiconductor device. FIG. 15(A) illustrates an example in which the second oxide semiconductor film 508*b* of the transistor 500 illustrated in FIG. 14(B) does not become thin. Alternatively, as illustrated in FIG. 15(B), the thickness of the second oxide semiconductor film 508*b* may be made smaller than that of the first oxide semiconductor film 508*a* in advance and the thickness of the region which is exposed from the conductive films 512*a* and 512*b* may be substantially the same as that in the transistor 500 illustrated in FIG. 14(B). Alternatively, as illustrated in FIG. 15(C), the thickness of the second oxide semiconductor film 508*b* may be made smaller than that of the first oxide semiconductor film 508*a* in advance and an insulating film 519 may be formed over the second oxide semiconductor film 508*b* and the insulating film 507. In this case, openings in which the second oxide semiconductor film 508*b* is to be contact with the conductive film 512*a* and the conductive film 512*b* are formed in the insulating film 519. The insulating film 519 can be formed using a material and a formation method similar to those of the insulating film 514.

Then, the masks 536*a* and 536*b* are removed, whereby the conductive film 512*a* functioning as the source electrode over the second oxide semiconductor film 508*b* and the conductive film 512*b* functioning as the drain electrode over the second oxide semiconductor film 508 are formed. The oxide semiconductor film 508 has a layered structure of the first oxide semiconductor film 508*a* and the second oxide semiconductor film 508*b* (see FIG. 12(B)).

Figure 12C:
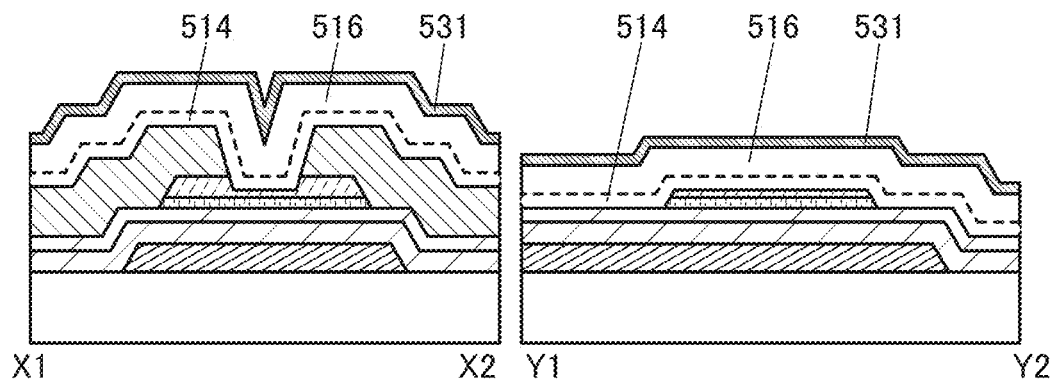

Next, the insulating film 514 functioning as the first protective insulating film and the insulating film 516 functioning as the second protective insulating film are formed over the oxide semiconductor film 508 and the conductive films 512*a* and 512*b*, and then a first barrier film 531 is formed (see FIG. 12(C)).

Note that after the insulating film 514 is formed, the insulating film 516 is preferably formed in succession without exposure to the air. After the insulating film 514 is formed, the insulating film 516 is formed in succession by adjusting at least one of the flow rate of a source gas, pressure, a high-frequency power, and a substrate temperature without exposure to the air, whereby the concentration of impurities attributed to the atmospheric component at the interface between the insulating film 514 and the insulating film 516 can be reduced, and oxygen in the insulating films 514 and 516 can be moved to the oxide semiconductor film 508; accordingly, the number of oxygen vacancies in the oxide semiconductor film 508 can be reduced.

For example, as the insulating film 514, a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 514 by a PECVD method under the conditions where the flow rate of the oxidizing gas is higher than 20 times and lower than 100 times, preferably higher than or equal to 40 times and lower than or equal to 80 times, that of the deposition gas; and the pressure in a process chamber is lower than 100 Pa, preferably lower than or equal to 50 Pa.

In this embodiment, a silicon oxynitride film is formed as the insulating film 514 by a PECVD method under the conditions where the substrate 502 is held at a temperature of 220° C., silane at a flow rate of 50 sccm and dinitrogen monoxide at a flow rate of 2000 sccm are used as a source gas, the pressure in the process chamber is 20 Pa, and a high-frequency power of 100 W at 13.56 MHz ($1.6 \times 10^{-2}$ W/cm$^2$ as the power density) is supplied to parallel-plate electrodes.

As the insulating film 516, a silicon oxide film or a silicon oxynitride film is formed under the conditions where the substrate placed in a process chamber of the PECVD apparatus, which is vacuum-evacuated, is held at a temperature higher than or equal to 180° C. and lower than or equal to 350° C., the pressure is greater than or equal to 100 Pa and less than or equal to 250 Pa, preferably greater than or equal to 100 Pa and less than or equal to 200 Pa, with introduction of a source gas into the process chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the process chamber.

As the deposition conditions of the insulating film 516, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 516 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film which contains oxygen in excess of that in the stoichiometric composition and from which part of oxygen is released by heating can be formed.

Note that the insulating film 514 functions as a protective film for the oxide semiconductor film 508 in the step of forming the insulating film 516. Therefore, the insulating film 516 can be formed using the high-frequency power having a high power density while damage to the oxide semiconductor film 508 is reduced.

Note that in the deposition conditions of the insulating film 516, when the flow rate of the deposition gas containing silicon with respect to the oxidizing gas is increased, the number of defects in the insulating film 516 can be reduced. Typically, it is possible to form an oxide insulating film in which the number of defects is small, that is, the spin density of a signal which appears at g=2.001 owing to a dangling bond of silicon is lower than $6 \times 10^{17}$ spins/cm$^3$, preferably lower than or equal to $3 \times 10^{17}$ spins/cm$^3$, and further preferably lower than or equal to $1.5 \times 10^{17}$ spins/cm$^3$, by ESR measurement. As a result, the reliability of the transistor can be improved.

After the insulating films 514 and 516 are formed (i.e., after the insulating film 516 is formed and before the first barrier film 531 is formed), heat treatment may be performed. The heat treatment can reduce nitrogen oxide contained in the insulating films 514 and 516. By the heat treatment, part of oxygen contained in the insulating films 514 and 516 can be moved to the oxide semiconductor film 508, so that the number of oxygen vacancies in the oxide semiconductor film 508 can be reduced.

The temperature of the heat treatment performed on the insulating films 514 and 516 is typically lower than 400° C., preferably lower than 375° C., further preferably higher than or equal to 340° C. and lower than 360° C., and still further preferably higher than or equal to 150° C. and lower than or equal to 350° C. The heat treatment may be performed under an atmosphere of nitrogen, oxygen, ultra-dry air (air in which the water content is 20 ppm or less, preferably 1 ppm or less, further preferably 10 ppb or less), or a rare gas (argon, helium, or the like). Note that it is preferable that hydrogen, water, and the like not be contained in the nitrogen, oxygen, ultra-dry air, or a rare gas. An electric furnace, an RTA apparatus, or the like can be used for the heat treatment.

The first barrier film 531 contains oxygen and metal (at least one of indium, zin, titanium, aluminum, tungsten, tantalum, molybdenum, hafnium, and yttrium). Indium tin oxide (also referred to as ITO: Indium Tin Oxide), indium tin silicon oxide (hereinafter also referred to as ITSO), or indium oxide is preferably used for the first barrier film 531 because unevenness can be favorably covered.

The first barrier film 531 can be formed by a sputtering method. When the first barrier film 531 is thin, it is sometimes difficult to inhibit release of oxygen from the insulating film 516 to the outside. In contrast, when the first barrier film 531 is thick, oxygen cannot be favorably added to the insulating film 516 in some cases. Therefore, the thickness of the first barrier film 531 is preferably greater than or equal to 1 nm and less than or equal to 20 nm, further preferably greater than or equal to 2 nm and less than or equal to 10 nm. In this embodiment, a 5-nm-thick ITSO film is formed as the first barrier film 531.

After that, oxygen 540 is added to the insulating film 516 functioning as a second protective insulating film through the first barrier film 531. In the drawing, oxygen added into the insulating film 516 is schematically shown as oxygen 540a (see FIG. 13(A)). Furthermore, the oxygen 540 is added to the insulating film 514 in some cases.

As a method for adding the oxygen 540 to the insulating film 516 through the first barrier film 531, an ion doping method, an ion implantation method, a plasma treatment method, or the like can be used. The oxygen 540 may be excess oxygen, oxygen radicals, or the like. By the bias application to the substrate side when the oxygen 540 is added, the oxygen 540 can be effectively added to the insulating film 516. As the bias, for example, power density can be greater than or equal to 1 W/cm$^2$ and less than or equal to 5 W/cm$^2$. When the first barrier film 531 is provided over the insulating film 516 and then oxygen is added, the first barrier film 531 functions as a protective film for inhibiting release of oxygen from the insulating film 516. Thus, a larger amount of oxygen can be added to the insulating film 516.

Next, the first barrier film 531 or part of the first barrier film 531, and part of the insulating film 516 functioning as the second protective insulating film are removed using an etchant 542 (see FIG. 13(B)).

As a method for removing the first barrier film 531 and part of the insulating film 516 functioning as the second protective insulating film, a dry etching method, a wet etching method, a combination of a dry etching method and a wet etching method, and the like can be given. Note that the etchant 542 is an etching gas in the case of a dry etching method and the etchant 542 is a chemical solution in the case of a wet etching method. In this embodiment, the first barrier film 531 is removed by a wet etching method. The wet etching method is preferably employed for removing the first barrier film 531 because manufacturing cost can be saved.

After that, the insulating film 518 functioning as a second barrier film is formed over the insulating film 516 (see FIG. 14(A)).

When the insulating film 518 is formed by a PECVD method, the substrate temperature is lower than 400° C., preferably lower than 375° C., further preferably higher than or equal to 340° C. and lower than or equal to 360° C. When the substrate temperature during the formation of the insulating film 518 is in the above range, the above excess oxygen or the above oxygen radicals can be diffused to the oxide semiconductor film 508. In addition, the substrate temperature during the formation of the insulating film 518 is preferably in the above range because a dense film can be formed.

For example, in the case where a silicon nitride film is formed by a PECVD method as the insulating film 518, a deposition gas containing silicon, nitrogen, and ammonia are preferably used as a source gas. The amount of ammonia is made smaller than that of nitrogen, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, the flow rate ratio of nitrogen to ammonia in the source gas is set to be greater than or equal to 5:1 and less than or equal to 50:1, preferably greater than or equal to 10:1 and less than or equal to 50:1.

In this embodiment, with the use of a PECVD apparatus, a 50-nm-thick silicon nitride film is formed as the insulating film 518 using silane, nitrogen, and ammonia as a source gas. The flow rate of silane is 50 sccm, the flow rate of nitrogen is 5000 sccm, and the flow rate of ammonia is 100 sccm. The pressure in the process chamber is 100 Pa, the substrate temperature is 350° C., and a high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is 1.7×10$^{-1}$ W/cm$^2$.

Note that heat treatment may be performed after the insulating film 518 functioning as the second barrier film is formed. Through the heat treatment after the insulating film 518 is formed, excess oxygen or oxygen radicals in the insulating film 516 can be diffused into the oxide semiconductor film 508 to fill oxygen vacancies in the oxide semiconductor film 508. Alternatively, the insulating film 518 may be formed while heat treatment is performed, whereby excess oxygen or oxygen radicals in the insulating film 516 can be diffused into the oxide semiconductor film 508 to fill oxygen vacancies in the oxide semiconductor film 508.

Through the above process, the transistor 500 illustrated in FIG. 14(B) can be manufactured.

<Method 2 for Manufacturing Semiconductor Device>

Next, a method for manufacturing the transistor 500, which is different from the manufacturing method described with reference to FIGS. 10(A), 10(B), and 10(C) to FIG. 14(A), will be described below.

First, like in <Method 1 for manufacturing semiconductor device>, the steps illustrated in FIGS. 10(A), 10(B), and 10(C), FIGS. 11(A), 11(B), and 11(C), and FIGS. 12(A), 12(B), and 12(C) are performed. After that, the steps illustrated in FIGS. 13(A) and 13(B) and FIG. 14(A) are not performed. In other words, the structure illustrated in FIG. 12(C) has a function similar to that of the transistor 500 illustrated in FIGS. 14(B) and 14(C).

In this case, a metal oxide film is used as the first barrier film 531, and as the metal oxide film, aluminum oxide, hafnium oxide, or yttrium oxide is preferably deposited.

When aluminum oxide, hafnium oxide, or yttrium oxide is deposited as the first barrier film 531 by a sputtering method, a sputtering gas preferably contains at least oxygen. In some cases, oxygen for the sputtering gas for forming the first barrier film 531 becomes oxygen radicals in plasma, and the oxygen and/or the oxygen radicals can be added to the insulating film 516. In that case, the step of adding the oxygen 540 illustrated in FIG. 13(A) can be skipped. That is, the step of forming the first barrier film 531 can double as oxygen adding treatment. The first barrier film 531 has a function of adding oxygen during the formation of the first barrier film (in particular, at the initial stage of deposition), whereas it has a function of blocking oxygen after the formation of the first barrier film 531.

In the case where aluminum oxide is deposited as the first barrier film 531 by a sputtering method, a mixed layer is sometimes formed in the vicinity of the interface between the insulating film 516 and the first barrier film 531. When the insulating film 516 is a silicon oxynitride film, $Al_xSi_yO_z$ is formed as the mixed layer in some cases.

In the case where aluminum oxide, hafnium oxide, or yttrium oxide is used for the first barrier film 531, aluminum oxide, hafnium oxide, and yttrium oxide have a high insulating property and a high barrier property against oxygen. Thus, the step of removing the first barrier film 531 illustrated in FIG. 13(B) and the step of forming the insulating film 518 illustrated in FIG. 14(A) do not need to be performed. Therefore, the first barrier film 531 has the same function as the insulating film 518.

Note that the first barrier film 531 is formed while heat treatment is performed at a substrate temperature lower than 400° C., preferably lower than 375° C., further preferably higher than or equal to 340° C. and lower than or equal to 360° C., whereby excess oxygen or oxygen radicals added to the insulating film 516 can be diffused into the oxide semiconductor film 508. Alternatively, heat treatment is performed at a temperature lower than 400° C., preferably lower than 375° C., further preferably higher than or equal to 340° C. and lower than or equal to 360° C. after the first barrier film 531 is formed, whereby excess oxygen or oxygen radicals added to the insulating film 516 can be diffused into the oxide semiconductor film 508.

The use of aluminum oxide, hafnium oxide, or yttrium oxide for the first barrier film 531 can shorten the manufacturing process of the semiconductor device and thus manufacturing cost can be saved.

<Method 3 for Manufacturing Semiconductor Device>

Figure 17A:
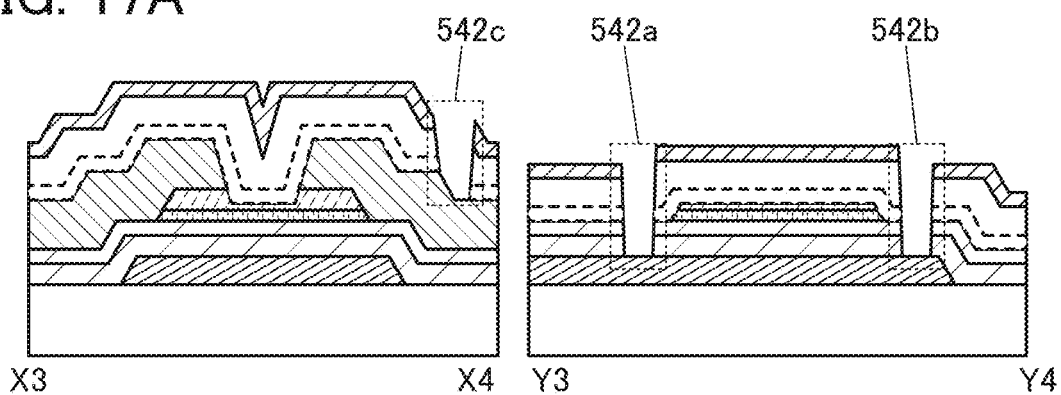
FIGS. 17A-17C Cross-sectional views showing one embodiment of a semiconductor device.
Figure 17B:
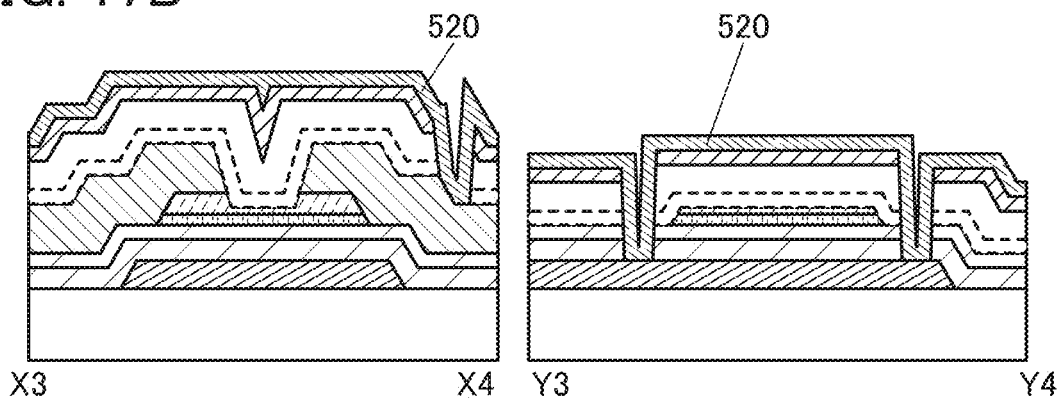
Figure 17C:
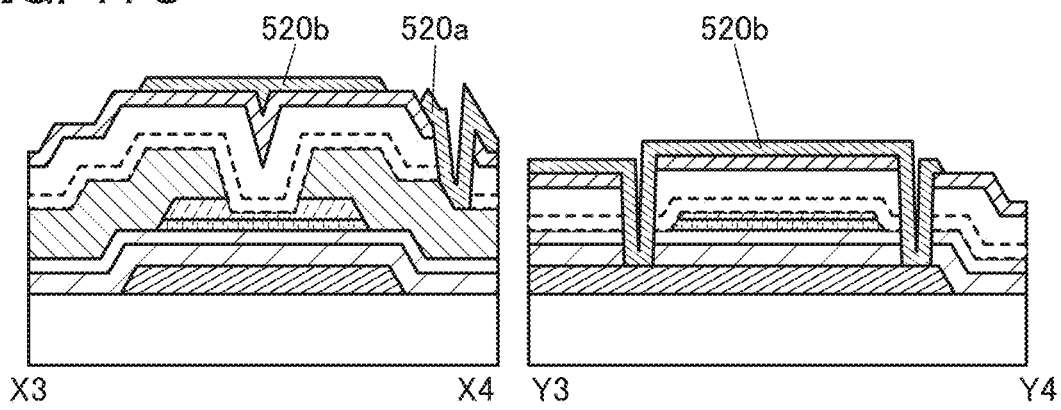

Next, a method for manufacturing the transistor 570 that is one embodiment of the present invention will be described with reference to FIGS. 17(A), 17(B), and 17(C). Note that FIGS. 17(A), 17(B), and 17(C) are cross-sectional views illustrating the method for manufacturing the semiconductor device.

First, steps similar to those in the manufacturing method of the transistor 500 described above are performed (the steps illustrated in FIG. 10(A) to FIG. 14(A)).

Next, a mask is formed over the insulating film 518 through a lithography process, and the opening 542c is formed in a desired region in the insulating films 514, 516, and 518. In addition, a mask is formed over the insulating film 518 through a lithography process, and the openings 542a and 542b are formed in desired regions in the insulating films 506, 507, 514, 516, and 518. Note that the opening 542c reaches the conductive film 512b. The openings 542a and 542b reach the conductive film 504 (see FIG. 17(A)).

Note that the openings 542a and 542b and the opening 542c may be formed in the same step or may be formed by different steps. In the case where the openings 542a and 542b and the opening 542c are formed in the same step, for example, a gray-tone mask or a half-tone mask can be used. Moreover, the openings 542a and 542b may be formed in some steps. For example, the insulating films 506 and 507 are processed and then the insulating films 514, 516, and 518 are processed.

Next, a conductive film 520 is formed over the insulating film 518 to cover the openings 542a, 542b, and 542c (see FIG. 17(B)).

For the conductive film 520, for example, a material containing one of indium (In), zinc (Zn), and tin (Sn) can be used. In particular, the conductive film 520 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin silicon oxide (ITSO). The conductive film 520 can be formed by a sputtering method, for example. In this embodiment, a 110-nm-thick ITSO film is formed by a sputtering method.

Next, a mask is formed over the conductive film 520 through a lithography process, and the conductive film 520 is processed into desired shapes to form the conductive films 520a and 520b (see FIG. 17(C)).

To form the conductive films 520a and 520b, for example, a dry etching method, a wet etching method, or a combination of a dry etching method and a wet etching method is used. In this embodiment, a wet etching method is employed for processing the conductive film 520 into the conductive films 520a and 520b.

Through the above process, the transistor 570 illustrated in FIGS. 16(A) and 16(B) can be manufactured.

The structures and methods described in this embodiment can be implemented by being combined as appropriate with any of the other structures and methods described in the other embodiments.

Embodiment 3

In this embodiment, the structure of an oxide semiconductor film included in a semiconductor device of one embodiment of the present invention will be described in detail.

<Structure of Oxide Semiconductor>

An oxide semiconductor is classified into a single crystal oxide semiconductor and a non-single-crystal oxide semiconductor. Examples of a non-single-crystal oxide semiconductor include a CAAC-OS (C Axis Aligned Crystalline Oxide Semiconductor), a polycrystalline oxide semiconductor, an nc-OS (nanocrystalline Oxide Semiconductor), an amorphous-like oxide semiconductor (a-like OS: amorphous like Oxide Semiconductor), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 19A:
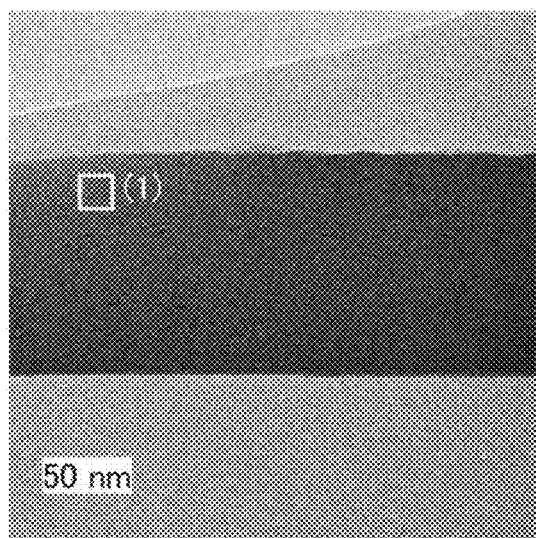
FIGS. 19A-19D Cs-corrected high-resolution TEM images of a cross section of a CAAC-OS and a cross-sectional schematic view of a CAAC-OS.

A CAAC-OS observed with TEM is described below. FIG. 19(A) shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 19B:
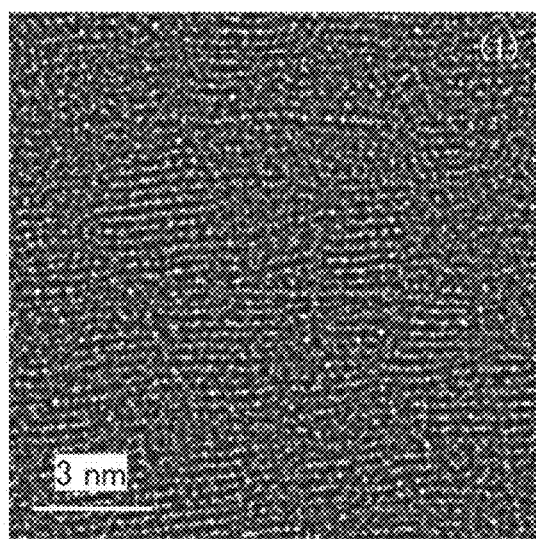

FIG. 19(B) is an enlarged Cs-corrected high-resolution TEM image of a region (1) in FIG. 19(A). FIG. 19(B) shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 19C:
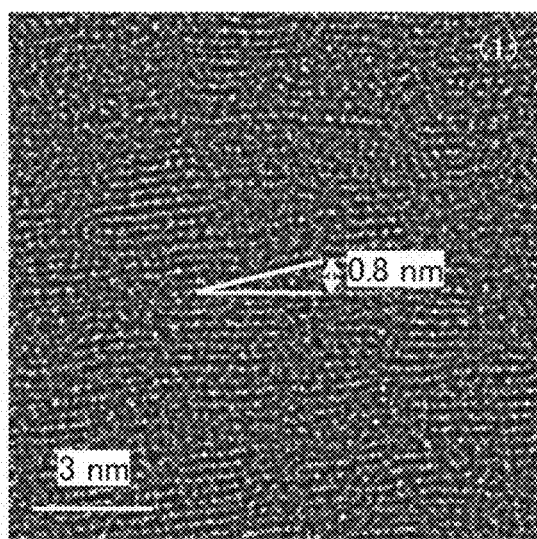

As shown in FIG. 19(B), the CAAC-OS has a characteristic atomic arrangement. The characteristic atomic arrangement is denoted by an auxiliary line in FIG. 19(C). FIG. 19(B) and FIG. 19(C) prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Note that a CAAC-OS can be referred to as an oxide semiconductor including CANC (C-Axis Aligned nanocrystals).

Figure 19D:
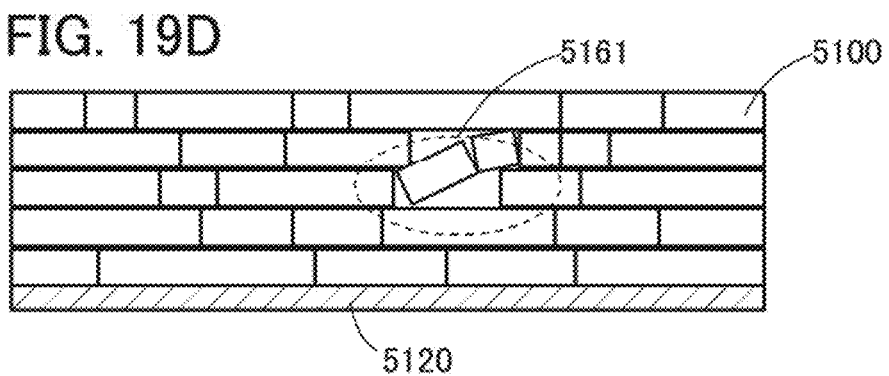

Here, according to the Cs-corrected high-resolution TEM images, the schematic arrangement of pellets 5100 of a CAAC-OS over a substrate 5120 is illustrated by such a structure in which bricks or blocks are stacked (see FIG. 19(D)). The part in which the pellets are tilted as observed in FIG. 19(C) corresponds to a region 5161 shown in FIG. 19(D).

Figure 20A:
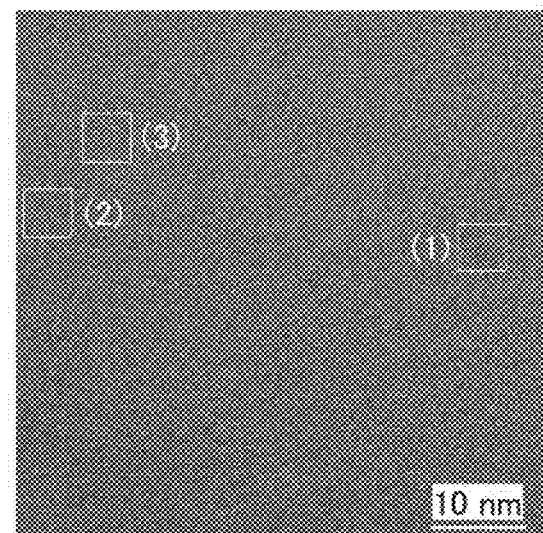
FIGS. 20A-20D Cs-corrected high-resolution TEM images of a plane of a CAAC-OS.
Figure 20B:
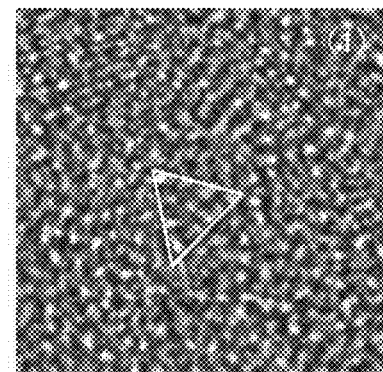
Figure 20C:
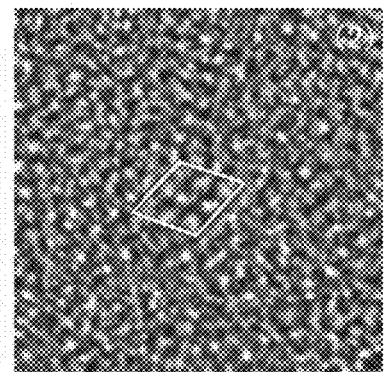
Figure 20D:
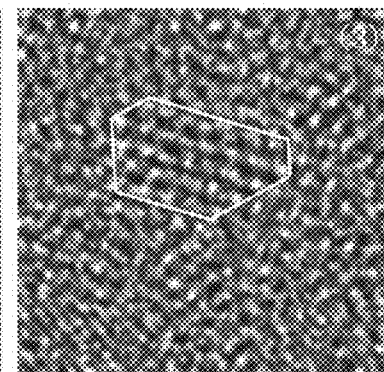

FIG. 20(A) shows a Cs-corrected high-resolution TEM image of a plane of the CAAC-OS observed from a direction substantially perpendicular to the sample surface. FIG. 20(B), FIG. 20(C), and FIG. 20(D) are enlarged Cs-corrected high-resolution TEM images of regions (1), (2), and (3) in FIG. 20(A), respectively. FIG. 20(B), FIG. 20(C), and FIG. 20(D) indicate that metal atoms are arranged in a triangular, quadrangular, or hexagonal configuration in a pellet. However, there is no regularity of arrangement of metal atoms between different pellets.

Figure 21A:
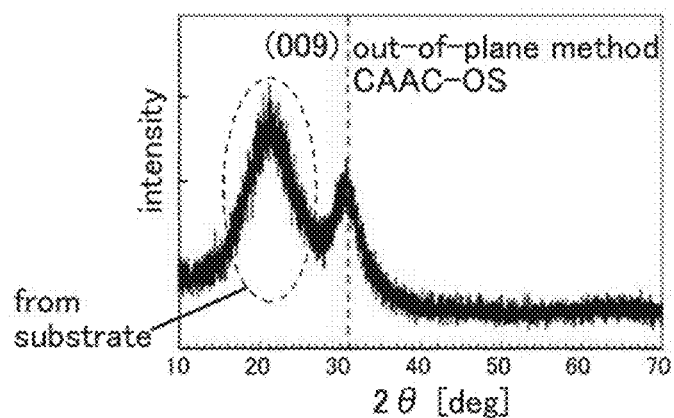
FIGS. 21A-21C Views showing structural analysis of a CAAC-OS and a single crystal oxide semiconductor by XRD.

Next, a CAAC-OS analyzed by X-ray diffraction (XRD: X-Ray Diffraction) is described. For example, when the structure of a CAAC-OS including an $InGaZnO_4$ crystal is analyzed by an out-of-plane method, a peak appears at a diffraction angle (2θ) of around 31° as shown in FIG. 21(A). This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 28 of around 31°. The peak at 28 of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 21B:
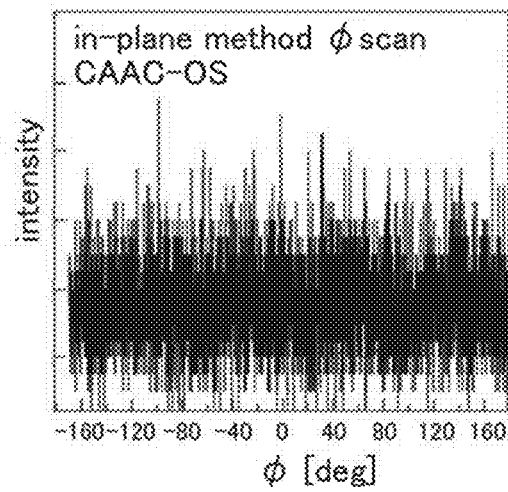
Figure 21C:
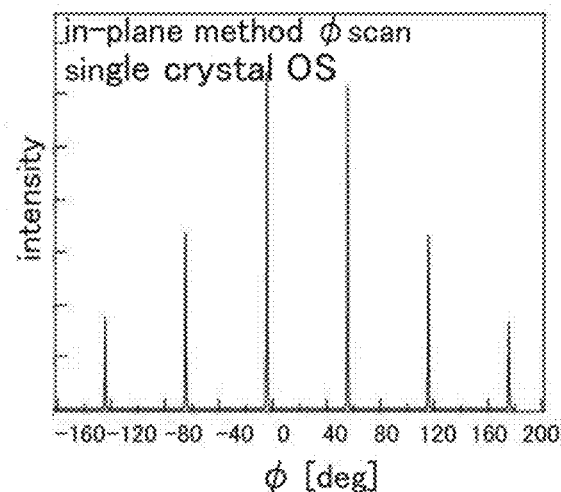

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φscan) is performed with 2θ fixed at around 56° and with the sample rotated using a normal vector of the sample surface as an axis (φ axis), as shown in FIG. 21(B), a peak is not clearly observed. In contrast, in the case of a single crystal oxide semiconductor of $InGaZnO_4$, when φ scan is performed with 2θ fixed at around 56°, as shown in FIG. 21(C), six peaks which are derived from crystal planes equivalent to the (110) plane are observed. Accordingly, the structural analysis using XRD shows that the directions of a-axes and b-axes are irregularly oriented in the CAAC-OS.

Figure 22A:
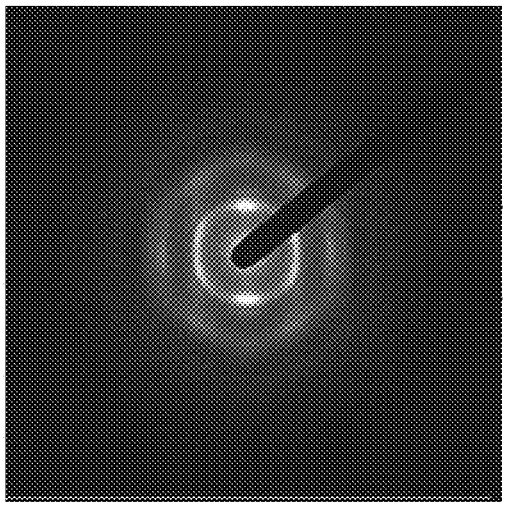
FIGS. 22A-22B Views showing electron diffraction patterns of a CAAC-OS.
Figure 22B:
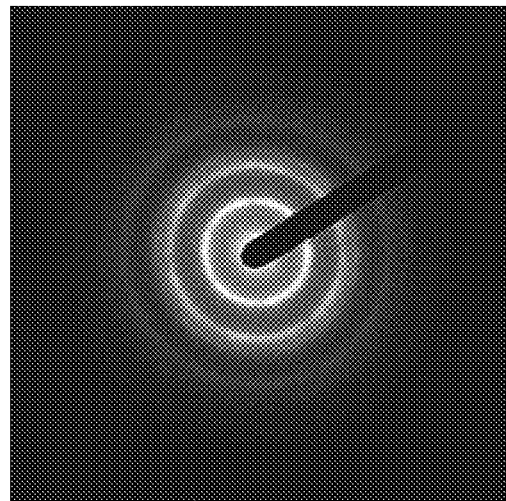

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 22(A) can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 22(B) shows a diffraction pattern obtained in such a manner that an electron beam with a probe diameter of 300 nm is incident on the same sample in a direction perpendicular to the sample surface. As shown in FIG. 22(B), a ring-like diffraction pattern is observed. Thus, the electron diffraction also indicates that the a-axes and b-axes of the pellets included in the CAAC-OS do not have regular alignment. The first ring in FIG. 22(B) is considered to be derived from the (010) plane, the (100) plane, and the like of the InGaZnO$_4$ crystal. The second ring in FIG. 22(B) is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 23:
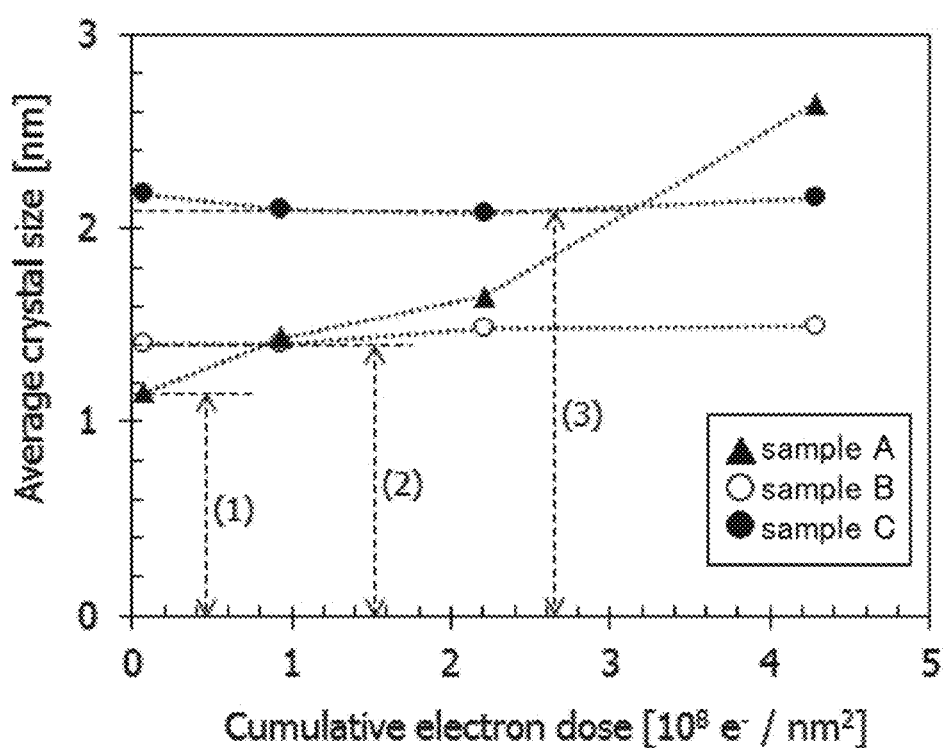
FIG. 23 A view showing a change of crystal parts of an In—Ga—Zn oxide owing to electron irradiation.

FIG. 23 shows change in the average size of crystal parts (Average crystal size) (at 22 points to 45 points) in each sample. Note that the crystal part size corresponds to the length of a lattice fringe. FIG. 23 indicates that the crystal part size in the a-like OS increases with an increase in the cumulative electron dose (Cumulative electron dose). Specifically, as shown by (1) in FIG. 23, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 23, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a desired composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Embodiment 4

In this embodiment, an example of a display device that includes any of the transistors described in the above embodiment will be described below with reference to FIG. 24 to FIG. 26.

Figure 24:
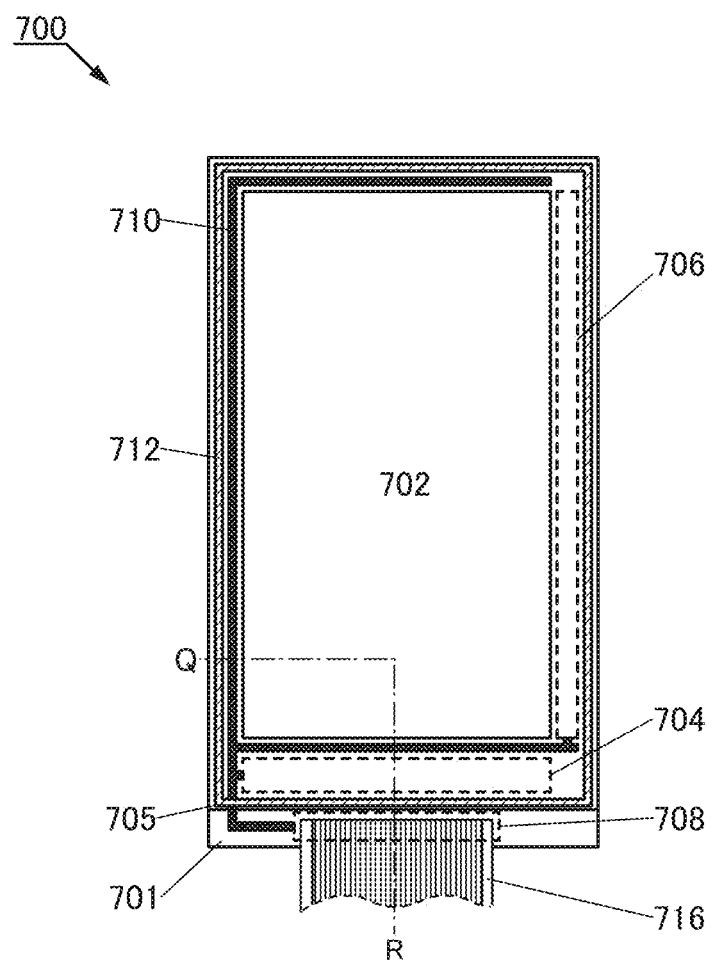
FIG. 24 A top view showing one embodiment of a display device.

FIG. 24 is a top view of an example of a display device. A display device 700 illustrated in FIG. 24 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 24, a display element is provided between the first substrate 701 and the second substrate 705.

In the display device 700, an FPC terminal portion 708 (FPC: Flexible Printed Circuit) electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a wiring 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the wiring 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver circuit substrate formed using a single crystal semiconductor film or a polycrystalline semiconductor film) may be mounted on the first substrate 701. There is no particular limitation on the connection method of a separately formed driver circuit substrate; a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors described in Embodiment 2 can be used.

The display device 700 can employ various modes and include various display elements. Examples of the display element include a liquid crystal element, an EL (electroluminescence) element (an EL element including organic and inorganic materials, an organic EL element, or an inorganic EL element) including an LED (e.g., a white LED, a red LED, a green LED, or a blue LED), a transistor (a transistor that emits light depending on current), an electron emitter, an electrophoretic element, a display element using MEMS (micro electro mechanical systems), such as a grating light valve (GLV), a digital micromirror device (DMD), a DMS (digital micro shutter) element, a MIRASOL (registered trademark) display, an IMOD (interferometric modulator display) element, or a piezoelectric ceramic display, and an electrowetting element. Besides, a display medium whose contrast, luminance, reflectivity, transmittance, or the like is changed by electrical or magnetic effect may be included. Alternatively, quantum dots may be used as the display element. An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an EL element is an EL display. Examples of a display device including an electron emitter include a field emission display (FED) and an SED-type flat panel display (SED: Surface-conduction Electron-emitter Display). An example of a display device including quantum dots is a quantum dot display. An example of a display device including electronic ink or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: RGB (R, G, and B correspond to red, green, and blue, respectively). For example, four pixels of the R pixel, the G pixel, the B pixel, and a W (white) pixel may be included. Alternatively, a color element may be composed of two colors among RGB as in PenTile layout. The two colors may differ among color elements. Alternatively, one or more colors of yellow, cyan, magenta, and the like may be added to RGB. Note that the sizes of display regions may be different between respective dots of color elements. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, structures of a display device including a VA (vertical alignment) mode liquid crystal element as display elements are described with reference to FIG. 25 and FIG. 26. The VA mode is a kind of method for controlling alignment of liquid crystal molecules of a display device. A VA-mode liquid crystal display device is a normally black display device in which liquid crystal molecules are aligned in a vertical direction with respect to a panel surface when no voltage is applied. The display device in this embodiment is devised so that one pixel (pixel) is divided into several regions (sub-pixels) and liquid crystal molecules are made slanted in the respective directions in the regions. This is referred to as domain multiplication or multi-domain design.

Figure 25:
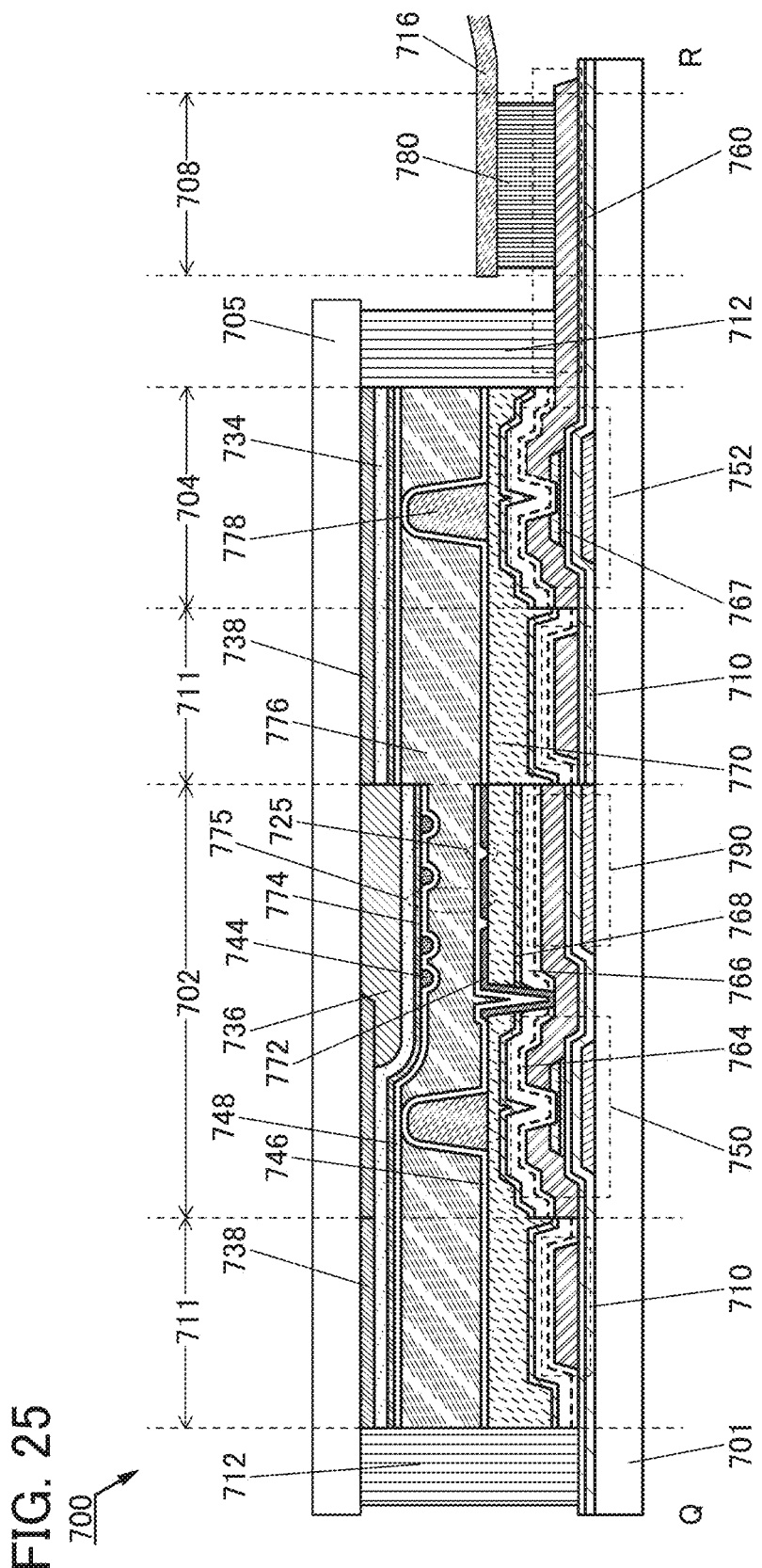
FIG. 25 A cross-sectional view showing one embodiment of a display device.

FIG. 25 is a cross-sectional view taken along dashed-dotted line Q-R shown in FIG. 24. The display device 700 illustrated in FIG. 25 includes a lead wiring portion 711, the pixel portion 702, the source driver circuit portion 704, and the FPC terminal portion 708. Note that the lead wiring portion 711 includes the wiring 710. The pixel portion 702 includes a transistor 750 and a capacitor 790. The source driver circuit portion 704 includes a transistor 752.

Any of the transistors described in Embodiment 2 can be used as the transistor 750 and the transistor 752.

The transistors used in this embodiment each include an oxide semiconductor film which is highly purified and in which formation of oxygen vacancy is suppressed. In the transistors, the current in an off state (off-state current) can be made small. Accordingly, an electrical signal such as an image signal can be held for a longer period, and a writing interval can be set longer in an on state. Accordingly, the frequency of refresh operation can be reduced, which leads to an effect of reducing power consumption.

In addition, the transistors used in this embodiment can have relatively high field-effect mobility and thus are capable of high-speed operation. For example, with such a transistor that can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor that can operate at high speed can be used also in the pixel portion, whereby a high-quality image can be provided.

The capacitor 790 has a structure in which a dielectric is provided between a pair of electrodes. Specifically, a conductive film which is formed through the same process as a conductive film functioning as the gate electrode of the transistor 750 is used as one electrode of the capacitor 790, and the conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 25, insulating films 764, 766, and 768, and a planarization insulating film 770 are formed over the transistor 750, the transistor 752, and the capacitor 790.

The insulating films 764, 766, and 768 can be formed using materials and methods similar to those of the insulating films 514, 516, and 518 described in Embodiment 2, respectively. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using these materials. Alternatively, a structure without the planarization insulating film 770 may be employed.

The wiring 710 is formed through the same process as conductive films functioning as the source electrode and the drain electrode of the transistor 750 or 752. Note that the wiring 710 may be formed using a conductive film which is formed through a different process from the source electrode and the drain electrode of the transistor 750 or 752, e.g., a conductive film functioning as a gate electrode. In the case where the wiring 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as the source electrode and the drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. The first substrate 701 and the second substrate 705 can be formed using a material and a method similar to those of the substrate 502 described in Embodiment 2.

A light-blocking film 738 functioning as a black matrix, a coloring layer 736 functioning as a color filter, and an insulating film 734 in contact with the light-blocking film 738 and the coloring layer 736 are provided on the second substrate 705 side.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Note that a spherical spacer may be used as the structure 778.

Figure 26:
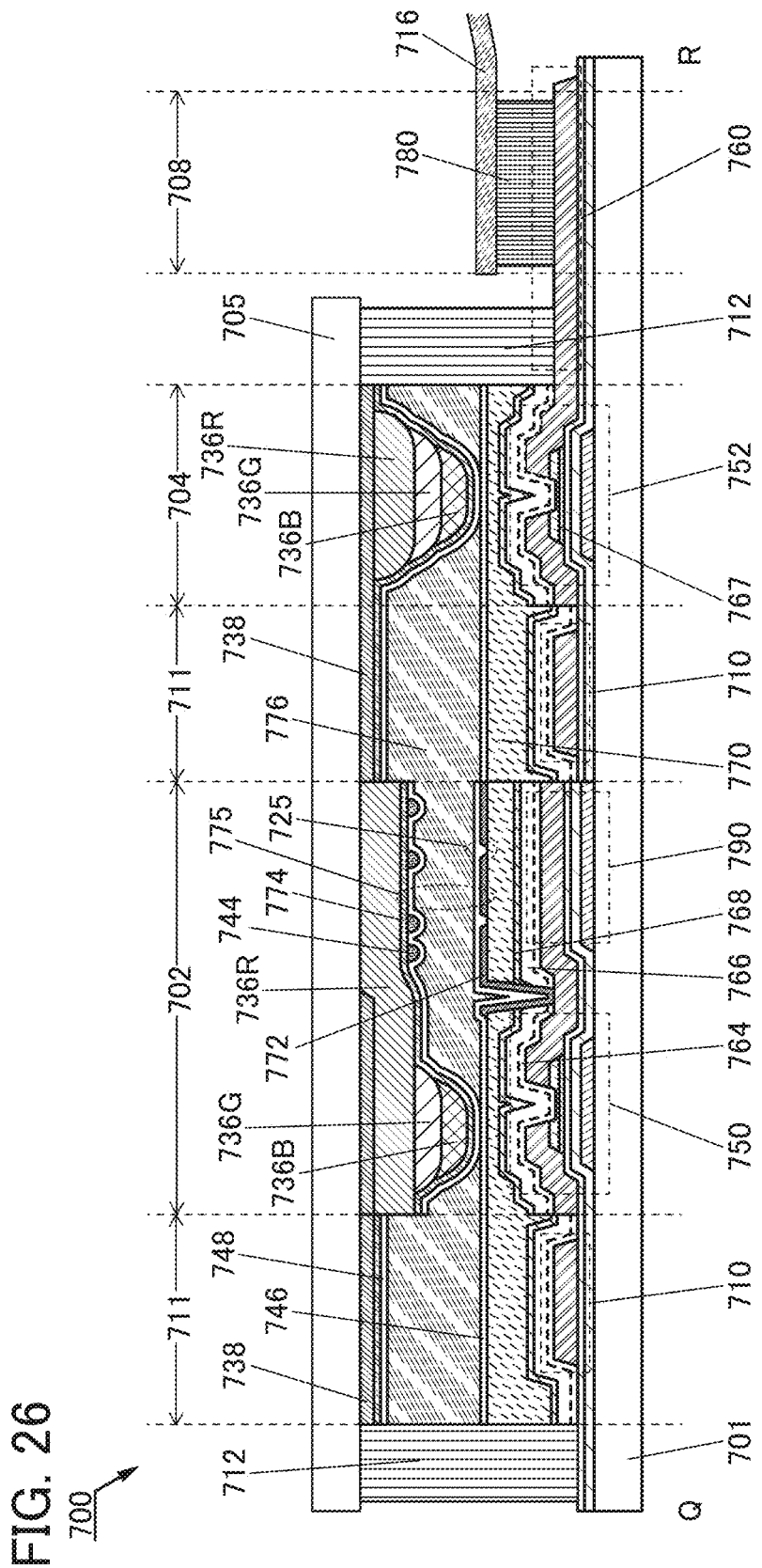
FIG. 26 A cross-sectional view showing one embodiment of a display device.

Alternatively, as illustrated in FIG. 26, instead of the structure 778, a stacked layer of a plurality of coloring layers 736 may be used as a spacer. In the display device 700 in FIG. 26, as an example, a red coloring layer 736R, a green coloring layer 736G, and a blue coloring layer 736B are included, and the coloring layer 736G and the coloring layer 736B are provided over the coloring layer 736R in a position overlapping with the light-blocking film 738. With such a structure, a step of forming the structure 778 can be omitted. In addition, the display device 700 in FIG. 26 has a structure where the insulating film 734 is not provided. Note that as the above-described spacer, a stacked layer of any two of the coloring layer 736R, the coloring layer 736G, and the coloring layer 736B may be used.

Although the example in which the structure 778 is provided on the first substrate 701 side is described in this embodiment, one embodiment of the present invention is not limited thereto. For example, the structure 778 may be provided on the second substrate 705 side, or both the first substrate 701 and the second substrate 705 may be provided with the structure 778.

The display device 700 includes a liquid crystal element 775. The liquid crystal element 775 includes the conductive film 772, a conductive film 774, and a liquid crystal layer 776. The conductive film 774 is provided on the second substrate 705 side and functions as a counter electrode. The display device 700 is capable of displaying an image in such a manner that light transmission or non-transmission of light is controlled by change in the alignment state of the liquid crystal layer 776 depending on a voltage applied between the conductive film 772 and the conductive film 774. A projection 744 is provided on the conductive film 774.

The conductive film 772 is connected to the conductive film functioning as the source electrode or the drain electrode included in the transistor 750. The conductive film 772 is formed over the planarization insulating film 770 to function as a pixel electrode, i.e., one electrode of the display element. The conductive film 772 functions as a reflective electrode. The display device 700 is what is called a reflective color liquid crystal display device in which external light is reflected by the conductive film 772 to display an image through the coloring layer 736.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, a conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved. (2) The aluminum film and the silver alloy film can be collectively etched depending on a chemical solution. (3) The conductive film 772 can have a favorable cross-sectional shape (e.g., a tapered shape). The reason for (3) is as follows: the etching rate of the aluminum film with the chemical solution is lower than that of the silver alloy film, or etching of the aluminum film that is the bottom layer is developed faster than that of the silver alloy film because when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Figure 27:
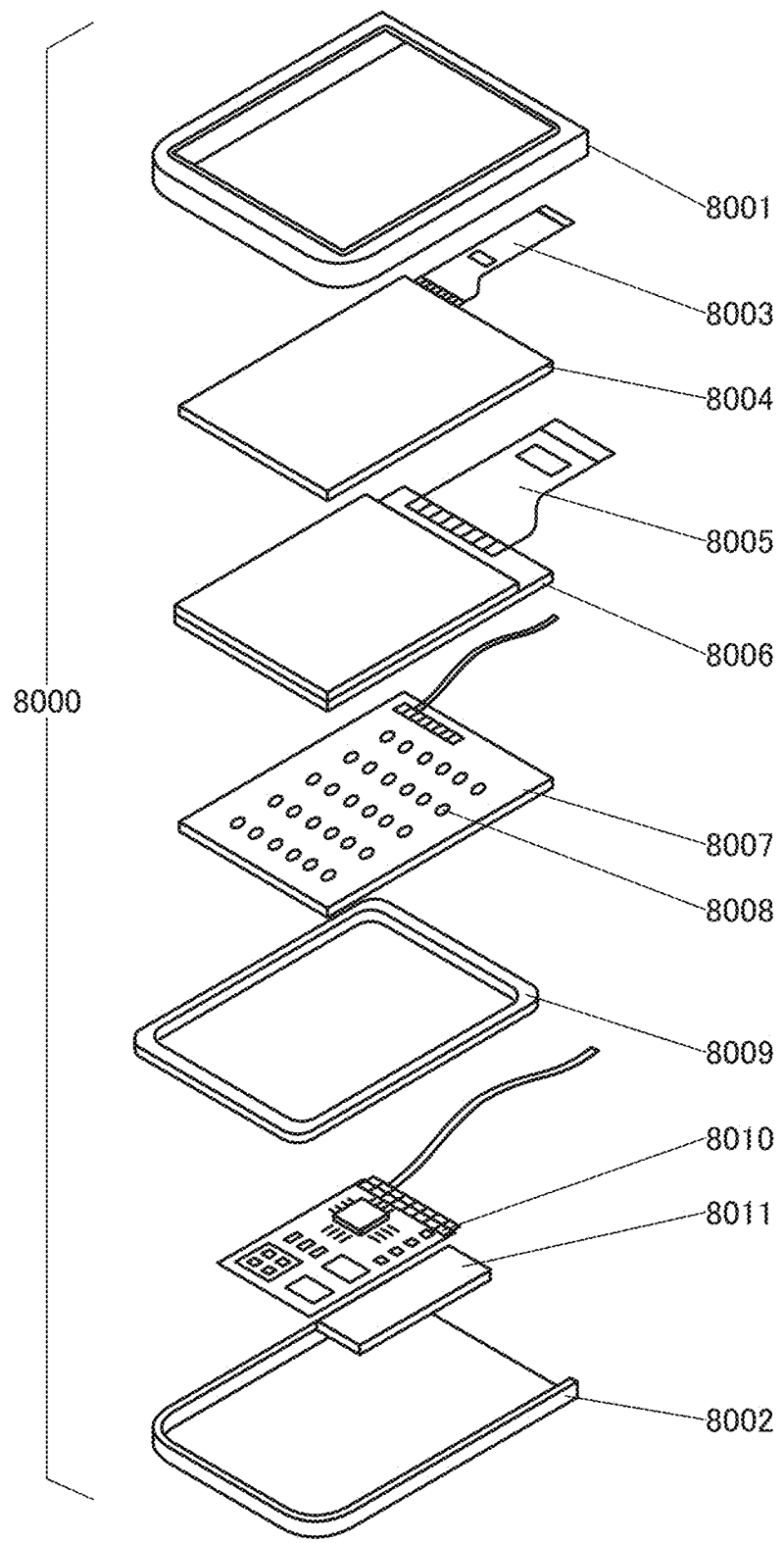
FIG. 27 A view illustrating a display module.

Note that the display device 700 illustrated in FIG. 25 to FIG. 27 is a reflective color liquid crystal display device given as an example, but a display type is not limited thereto. For example, a transmissive color liquid crystal display device in which the conductive film 772 is a conductive film that transmits visible light may be provided. In the case where the display device 700 is a transmissive liquid crystal display device, a pair of electrodes included in the capacitor 790 is provided in a position not overlapping with the conductive film 772. In addition, each layer provided in a path of light entering from the substrate 701 and emitted through the liquid crystal element 775 and the coloring layer 736 is preferably a layer that transmits visible light.

The conductive film 772 includes a slit 725. The slit 725 is provided for controlling alignment of the liquid crystal molecules. In addition, an alignment film 746 is provided over the conductive film 772, the planarization insulating film 770, and the structure 778, and similarly, an alignment film 748 is provided over the conductive film 774.

When voltage is applied to the conductive film 772 provided with the slit 725, electric field distortion (an oblique electric field) is generated near the slit 725. The slit 725 and the projection 744 on the substrate 705 side are alternately arranged in a dovetailing manner and thus, an oblique electric field is effectively generated to control alignment of the liquid crystals, so that a direction of alignment of the liquid crystals varies from place to place. In other words, the liquid crystal molecules are made slanted in the respective directions in the plurality of subpixels included in one pixel, so that domain multiplication is achieved and the viewing angle of the liquid crystal display panel is expanded.

Although not illustrated in FIG. 25, an optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a side light, or the like may be used as a light source.

The structures described in this embodiment can be used in appropriate combination with any of the structures described in the other embodiments.

Embodiment 5

In this embodiment, a display module and electronic devices that include a semiconductor device of one embodiment of the present invention will be described with reference to FIG. 27 and FIG. 28.

In a display module 8000 illustrated in FIG. 27, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The display device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed so as to overlap with the display panel 8006. A counter substrate (sealing substrate) of the display panel 8006 can have a touch panel function. A photosensor may be provided in each pixel of the display panel 8006 so that an optical touch panel is obtained.

The backlight 8007 includes light sources 8008. Note that although a structure in which the light sources 8008 are provided over the backlight 8007 is illustrated in FIG. 27, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIG. 28(A) to FIG. 28(G) illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring or sensing force, displacement, position, speed, acceleration, angular velocity, optical rotation al frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 28A:
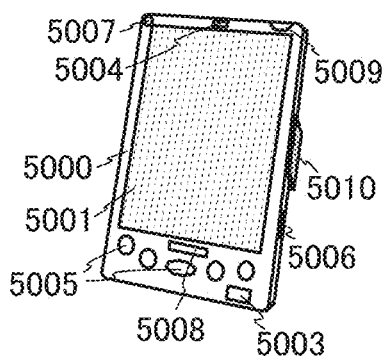
FIGS. 28A-28G Views illustrating electronic devices.
Figure 28B:
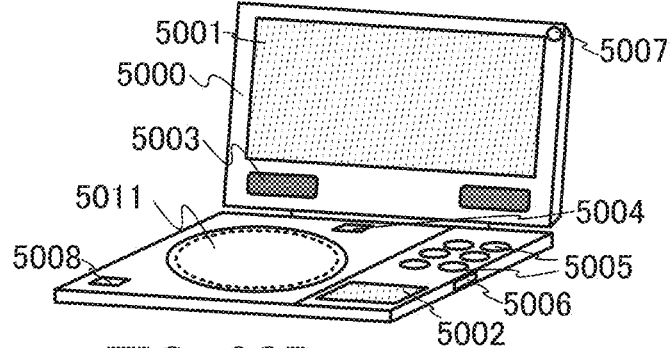
Figure 28C:
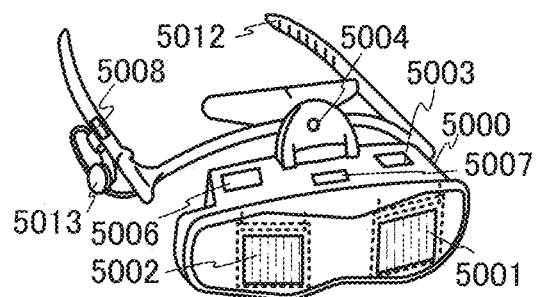
Figure 28D:
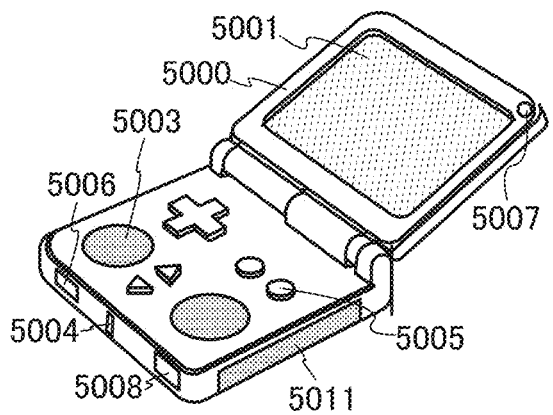
Figure 28E:
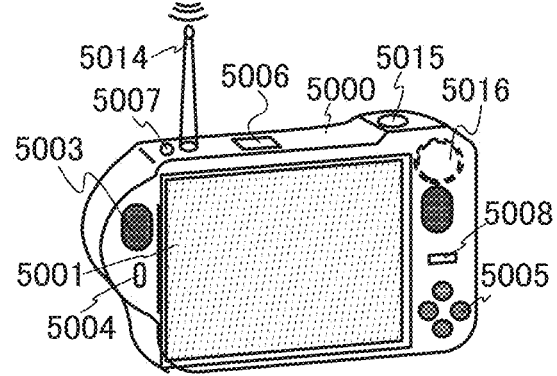
Figure 28F:
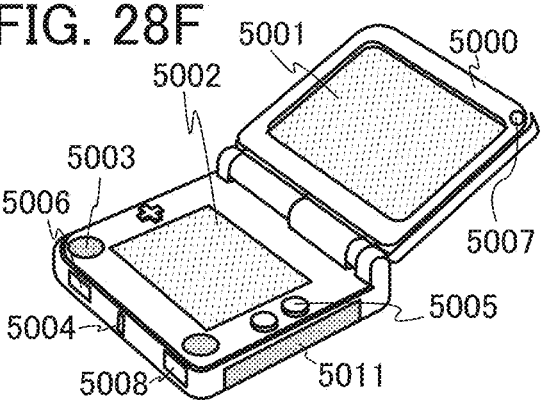
Figure 28G:
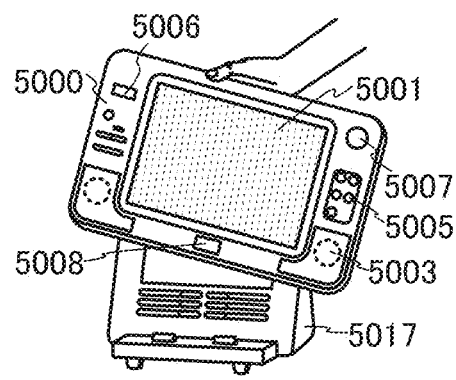

FIG. 28(A) illustrates a mobile computer that can include a switch 5009, an infrared port 5010, and the like in addition to the above components. FIG. 28(B) illustrates a portable image reproducing device (e.g., a DVD player) that is provided with a memory medium and can include a second display portion 5002, a memory medium reading portion 5011, and the like in addition to the above components. FIG. 28(C) illustrates a goggle-type display that can include the second display portion 5002, a support 5012, an earphone 5013, and the like in addition to the above components. FIG. 28(D) illustrates a portable game machine that can include the memory medium reading portion 5011 and the like in addition to the above components. FIG. 28(E) illustrates a digital camera that has a television reception function and can include an antenna 5014, a shutter button 5015, an image receiving portion 5016, and the like in addition to the above components. FIG. 28(F) illustrates a portable game machine that can include the second display portion 5002, the memory medium reading portion 5011, and the like in addition to the above components. FIG. 28(G) illustrates a portable television receiver that can include a charger 5017 capable of transmitting and receiving signals, and the like in addition to the above components.

The electronic devices illustrated in FIG. 28(A) to FIG. 28(G) can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic device including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIG. 28(A) to FIG. 28(G) are not limited to those described above, and the electronic devices can have a variety of functions.

The electronic devices described in this embodiment each include the display portion for displaying some sort of data. The display device described in Embodiment 4 can be used in the display portion.

The structure described in this embodiment can be used as appropriate in combination with any of the structures described in the other embodiments.

REFERENCE NUMERALS

100: pixel
101: substrate
103: scan line
105a: capacitor wiring
105b: capacitor wiring
107: gate insulating film
107a: gate insulating film
107b: gate insulating film
114: insulating film
116: insulating film
116a: insulating film
116b: insulating film
116c: insulating film
121: signal line
123: electrode
125a: electrode
125b: electrode
135: semiconductor film
135a: oxide semiconductor film
135b: oxide semiconductor film
136: transistor
137: transistor
139a: pixel electrode
139b: pixel electrode
140: capacitor
141: capacitor
142: liquid crystal element
143: liquid crystal element
144a: opening
144b: opening
145: capacitor
146: capacitor
148: pixel electrode
148a: oxide conductor film
148b: oxide conductor film
149: pixel electrode
200: pixel
203: scan line
221: signal line
223a: electrode
223b: electrode
236: transistor
237: transistor
300: pixel
301: substrate
303: scan line
305a: capacitor wiring
305b: capacitor wiring
307: gate insulating film
316: insulating film
321: signal line
323a: electrode
323b: electrode
325a: electrode
325b: electrode
335: semiconductor film
336: transistor
337: transistor
339a: pixel electrode
339b: pixel electrode
340: capacitor
341: capacitor
342: liquid crystal element
343: liquid crystal element
344a: opening
344b: opening
345a: electrode
345b: electrode
346a: opening
346b: opening
500: transistor
502: substrate
504: conductive film
506: insulating film
507: insulating film
508: oxide semiconductor film
508a: oxide semiconductor film
508b: oxide semiconductor film
509: oxide semiconductor film
509a: oxide semiconductor film
509b: oxide semiconductor film
512: conductive film
512a: conductive film
512b: conductive film
514: insulating film
516: insulating film
518: insulating film
519: insulating film
520: conductive film
520a: conductive film
520b: conductive film
531: barrier film
536a: mask
536b: mask
538: etchant
539: etchant
540: oxygen
540a: oxygen
542: etchant
542a: opening
542b: opening
542c: opening
570: transistor
700: display device
701: substrate
702: pixel portion
704: source driver circuit portion
705: substrate
706: gate driver circuit portion
708: FPC terminal portion
710: wiring
711: wiring portion
712: sealant
716: FPC
725: slit
734: insulating film
736: coloring layer
736B: coloring layer
736G: coloring layer
736R: coloring layer
738: light-blocking film
744: projection
746: alignment film
748: alignment film 750: transistor
752: transistor
760: connection electrode
764: insulating film
766: insulating film
768: insulating film
770: planarization insulating film
772: conductive film
774: conductive film
775: liquid crystal element
776: liquid crystal layer
778: structure
780: anisotropic conductive film
790: capacitor
5000: housing
5001: display portion
5002: display portion
5003: speaker
5004: LED lamp
5005: operation key
5006: connection terminal
5007: sensor
5008: microphone
5009: switch
5010: infrared port
5011: memory medium reading portion
5012: support
5013: earphone
5014: antenna
5015: shutter button
5016: image receiving portion
5017: charger
5100: pellet
5120: substrate
5161: region
8000: display module
8001: upper cover
8002: lower cover
8003: FPC
8004: touch panel
8005: FPC
8006: display panel
8007: backlight
8008: light source
8009: frame
8010: printed board
8011: battery

The invention claimed is:

1. A display device comprising:
a pixel, the pixel comprising:
  a first transistor;
  a second transistor;
  a first pixel electrode electrically connected to the first transistor; and
  a second pixel electrode electrically connected to the second transistor;
a scan line provided over and in contact with a substrate, the scan line having a region that functions as a gate electrode of the first transistor and a region that functions as a gate electrode of the second transistor;
a first conductive layer provided over and in contact with the substrate;
a first insulating film having a region in contact with a top surface of the scan line and a region in contact with a top surface of the first conductive layer;
a semiconductor film provided over the scan line with the first insulating film provided therebetween, the semiconductor film comprising a channel formation region of the first transistor and a channel formation region of the second transistor;
a signal line having a region functioning as one of a source electrode and a drain electrode of the first transistor and a region functioning as one of a source electrode and a drain electrode of the second transistor;
a second conductive layer having a region functioning as the other of the source electrode and the drain electrode of the first transistor; and
a third conductive layer having a region overlapping with the scan line and electrically connected to the first conductive layer,
wherein the second conductive layer is electrically connected to the first pixel electrode in a region overlapping the first conductive layer,
wherein the signal line has a region extending in a first direction,
wherein the third conductive layer has a region extending in the first direction, and
wherein the second conductive layer and the signal line each have no region of overlap with the third conductive layer.

2. A display device comprising:
a pixel, the pixel comprising:
  a first transistor;
  a second transistor;
  a first pixel electrode electrically connected to the first transistor; and
  a second pixel electrode electrically connected to the second transistor;
a scan line provided over and in contact with a substrate, the scan line having a region that functions as a gate electrode of the first transistor and a region that functions as a gate electrode of the second transistor;
a first conductive layer provided over and in contact with the substrate;
a first insulating film having a region in contact with a top surface of the scan line and a region in contact with a top surface of the first conductive layer;
a semiconductor film provided over the scan line with the first insulating film provided therebetween, the semiconductor film comprising a channel formation region of the first transistor and a channel formation region of the second transistor;
a signal line having a region functioning as one of a source electrode and a drain electrode of the first transistor and a region functioning as one of a source electrode and a drain electrode of the second transistor;
a second conductive layer having a region functioning as the other of the source electrode and the drain electrode of the first transistor; and
a third conductive layer having a region overlapping with the scan line and electrically connected to the first conductive layer,
wherein the second conductive layer is electrically connected to the first pixel electrode in a region overlapping the first conductive layer,
wherein the signal line has a region extending in a first direction,
wherein the third conductive layer has a region extending in the first direction, and
wherein the second conductive layer and the signal line each have no region of overlap with the third conductive layer, wherein the first conductive layer has a region functioning as one electrode of a capacitor, and wherein the second conductive layer has a region functioning as the other electrode of the capacitor.

3. A display device comprising:
a pixel, the pixel comprising:
- a first transistor;
- a second transistor;
- a first pixel electrode electrically connected to the first transistor; and
- a second pixel electrode electrically connected to the second transistor;

a scan line provided over and in contact with a substrate, the scan line having a region that functions as a gate electrode of the first transistor and a region that functions as a gate electrode of the second transistor;

a first conductive layer provided over and in contact with the substrate;

a first insulating film having a region in contact with a top surface of the scan line and a region in contact with a top surface of the first conductive layer;

a semiconductor film provided over the scan line with the first insulating film provided therebetween, the semiconductor film comprising a channel formation region of the first transistor and a channel formation region of the second transistor;

a signal line having a region functioning as one of a source electrode and a drain electrode of the first transistor and a region functioning as one of a source electrode and a drain electrode of the second transistor;

a second conductive layer having a region functioning as the other of the source electrode and the drain electrode of the first transistor; and a third conductive layer having a region intersecting with the scan line and electrically connected to the first conductive layer, wherein the second conductive layer is electrically connected to the first pixel electrode in a region overlapping the first conductive layer, wherein the signal line has a region extending in a first direction, wherein the third conductive layer has a region extending in the first direction, and wherein the second conductive layer and the signal line each have no region of overlap with the third conductive layer.

4. A display device comprising:
a pixel, the pixel comprising:
- a first transistor;
- a second transistor;
- a first pixel electrode electrically connected to the first transistor; and
- a second pixel electrode electrically connected to the second transistor;

a scan line provided over and in contact with a substrate, the scan line having a region that functions as a gate electrode of the first transistor and a region that functions as a gate electrode of the second transistor;

a first conductive layer provided over and in contact with the substrate;

a first insulating film having a region in contact with a top surface of the scan line and a region in contact with a top surface of the first conductive layer;

a semiconductor film provided over the scan line with the first insulating film provided therebetween, the semiconductor film comprising a channel formation region of the first transistor and a channel formation region of the second transistor;

a signal line having a region functioning as one of a source electrode and a drain electrode of the first transistor and a region functioning as one of a source electrode and a drain electrode of the second transistor;

a second conductive layer having a region functioning as the other of the source electrode and the drain electrode of the first transistor; and a third conductive layer having a region intersecting with the scan line and electrically connected to the first conductive layer, wherein the second conductive layer is electrically connected to the first pixel electrode in a region overlapping the first conductive layer, wherein the signal line has a region extending in a first direction, wherein the third conductive layer has a region extending in the first direction, wherein the second conductive layer and the signal line each have no region of overlap with the third conductive layer, wherein the first conductive layer has a region functioning as one electrode of a capacitor, and wherein the second conductive layer has a region functioning as the other electrode of the capacitor.

* * * * *